(12) United States Patent
Danesh et al.

(10) Patent No.: US 10,707,374 B2
(45) Date of Patent: Jul. 7, 2020

(54) ETENDUE ENHANCEMENT FOR LIGHT EMITTING DIODE SUBPIXELS

(71) Applicant: GLO AB, Lund (SE)

(72) Inventors: Fariba Danesh, Los Altos Hills, CA (US); Benjamin Leung, Sunnyvale, CA (US); Tsun Lau, Sunnyvale, CA (US); Zulal Tezcan, Sunnyvale, CA (US); Miao-Chan Tsai, Sunnyvale, CA (US); Max Batres, Fremont, CA (US); Michael Joseph Cich, Fremont, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 16/123,182

(22) Filed: Sep. 6, 2018

(65) Prior Publication Data

US 2019/0088820 A1 Mar. 21, 2019

Related U.S. Application Data

(60) Provisional application No. 62/621,865, filed on Jan. 25, 2018, provisional application No. 62/598,224, (Continued)

(51) Int. Cl.
*H01L 33/20* (2010.01)
*H01L 33/08* (2010.01)
(Continued)

(52) U.S. Cl.
CPC .......... *H01L 33/20* (2013.01); *H01L 25/0753* (2013.01); *H01L 25/13* (2013.01);
(Continued)

(58) Field of Classification Search
CPC ..... H01L 33/20; H01L 33/62; H01L 33/0075; H01L 25/13; H01L 33/10; H01L 33/32;
(Continued)

(56) References Cited

U.S. PATENT DOCUMENTS 5,239,188 A 8/1993 Takeuchi et al.
5,389,571 A 2/1995 Takeuchi et al.
(Continued)

FOREIGN PATENT DOCUMENTS

WO WO2016-100662 A1 6/2016

OTHER PUBLICATIONS

Jung, B. O. et al., "Emission Characteristics of InGaN/GaN Core-Shell Nanorods Embedded in a 3D Light-Emitting Diode," Nanoscale Research Letters, vol. 11, No. 215, pp. 1-10, (2016).
(Continued)

*Primary Examiner* — David Vu
(74) *Attorney, Agent, or Firm* — The Marbury Law Group PLLC

(57) ABSTRACT

A method of forming a light emitting device includes forming a growth mask layer including openings on a doped compound semiconductor layer, forming first light emitting diode (LED) subpixels by forming a plurality of active regions and second conductivity type semiconductor material layers employing selective epitaxy processes, and transferring each first LED subpixel to a backplane. An anode contact electrode may be formed on the second conductivity type semiconductor material layers for redundancy. The doped compound semiconductor layer may be patterned with tapered sidewalls to enhance etendue. An optically clear encapsulation matrix may be formed on the doped compound semiconductor material layer to enhance etendue. Lift-off processes may be employed for the active regions. Cracking of the LEDs may be suppressed employing a thick reflector layer.

19 Claims, 52 Drawing Sheets

Related U.S. Application Data filed on Dec. 13, 2017, provisional application No. 62/559,375, filed on Sep. 15, 2017.

(51) Int. Cl.
| | |
|---|---|
| *H01L 33/32* | (2010.01) |
| *H01L 33/10* | (2010.01) |
| *H01L 25/13* | (2006.01) |
| *H01L 33/00* | (2010.01) |
| *H01L 33/62* | (2010.01) |
| *H01L 33/24* | (2010.01) |
| *H01L 27/15* | (2006.01) |
| *H01L 25/075* | (2006.01) |

(52) U.S. Cl.
CPC ........ *H01L 27/156* (2013.01); *H01L 33/0075* (2013.01); *H01L 33/08* (2013.01); *H01L 33/10* (2013.01); *H01L 33/24* (2013.01); *H01L 33/32* (2013.01); *H01L 33/62* (2013.01); *H01L 2933/0025* (2013.01); *H01L 2933/0058* (2013.01)

(58) Field of Classification Search
CPC ............. H01L 33/08; H01L 2933/0058; H01L 2933/0025
See application file for complete search history.

(56) References Cited

U.S. PATENT DOCUMENTS

| | | | |
|---|---|---|---|
| 6,229,160 B1 | 5/2001 | Krames | |
| 6,323,063 B2 | 11/2001 | Krames et al. | |
| 6,570,190 B2 | 5/2003 | Krames et al. | |
| 6,831,937 B2* | 12/2004 | Doi | H01S 5/0202 372/43.01 |
| 7,858,962 B2 | 12/2010 | Smith et al. | |
| 8,309,439 B2 | 11/2012 | Seifert et al. | |
| 8,311,072 B2* | 11/2012 | Hoshino | H01S 5/187 372/44.01 |
| 8,350,249 B1 | 1/2013 | Svensson | |
| 8,350,251 B1 | 1/2013 | Lowgren et al. | |
| 8,664,636 B2 | 3/2014 | Konsek et al. | |
| 8,669,125 B2 | 3/2014 | Lowgren | |
| 8,669,574 B2 | 3/2014 | Konsek et al. | |
| 8,901,534 B2 | 12/2014 | Svensson | |
| 8,921,141 B2 | 12/2014 | Kryliouk et al. | |
| 8,937,295 B2 | 1/2015 | Lowgren et al. | |
| 8,999,737 B2 | 4/2015 | Harvey et al. | |
| 9,035,278 B2 | 5/2015 | Svensson et al. | |
| 9,054,233 B2 | 6/2015 | Ohlsson et al. | |
| 9,281,442 B2 | 3/2016 | Romano et al. | |
| 9,287,443 B2 | 3/2016 | Konsek et al. | |
| 9,583,533 B2 | 2/2017 | Hu et al. | |
| 2001/0000410 A1 | 4/2001 | Krames et al. | |
| 2004/0159843 A1 | 8/2004 | Edmond et al. | |
| 2004/0164312 A1 | 8/2004 | Biwa et al. | |
| 2009/0103583 A1 | 4/2009 | Tanaka et al. | |
| 2009/0169828 A1 | 7/2009 | Hersee et al. | |
| 2009/0179191 A1 | 7/2009 | Smith et al. | |
| 2009/0283787 A1* | 11/2009 | Donofrio | H01L 33/405 257/98 |
| 2010/0283064 A1 | 11/2010 | Samuelson et al. | |
| 2011/0309382 A1 | 12/2011 | Lowgren | |
| 2012/0264246 A1 | 10/2012 | Peng et al. | |
| 2013/0075693 A1 | 3/2013 | Svensson et al. | |
| 2013/0112944 A1 | 5/2013 | Cha et al. | |
| 2013/0221322 A1 | 8/2013 | Ohlsson | |
| 2014/0077220 A1 | 3/2014 | Kryliouk et al. | |
| 2014/0117307 A1 | 5/2014 | Herner et al. | |
| 2014/0117401 A1 | 5/2014 | Herner | |
| 2014/0139862 A1 | 5/2014 | Gha | |
| 2015/0270441 A1 | 9/2015 | Kim et al. | |
| 2015/0333216 A1 | 11/2015 | Pourquier et al. | |
| 2016/0343911 A1 | 11/2016 | Chae et al. | |
| 2017/0250219 A1* | 8/2017 | Bower | H01L 33/46 |

OTHER PUBLICATIONS

International Search Report and Written Opinion of the International Searching Authority for International Patent Application No. PCT/US2018/030692, dated Aug. 22, 2018, 18 pages.

Krames, M.R. et al., "High-Power Truncated-Inverted-Pyramid (AlxGa1—x)0.5In0.5P/GaPlight-Emitting Diodes Exhibiting >50% External Quantum Efficiency," Applied Physical Letters, vol. 75, No. 16, pp. 2365-2367, (1999).

U.S. Appl. No. 15/464,641, filed Mar. 21, 2017, GLO AB.

U.S. Appl. No. 15/610,968, filed Jun. 1, 2017, GLO AB.

International Search Report and Written Opinion of the International Searching Authority for International Patent Application No. PCT/US2018/049667, dated Dec. 27, 2018, 18 pages.

Notification Concerning Transmittal of International Preliminary Report on Patentability and Written Opinion of the International Searching Authority for International Patent Application No. PCT/US2018/049667, dated Mar. 26, 2020, 18 pages.

* cited by examiner

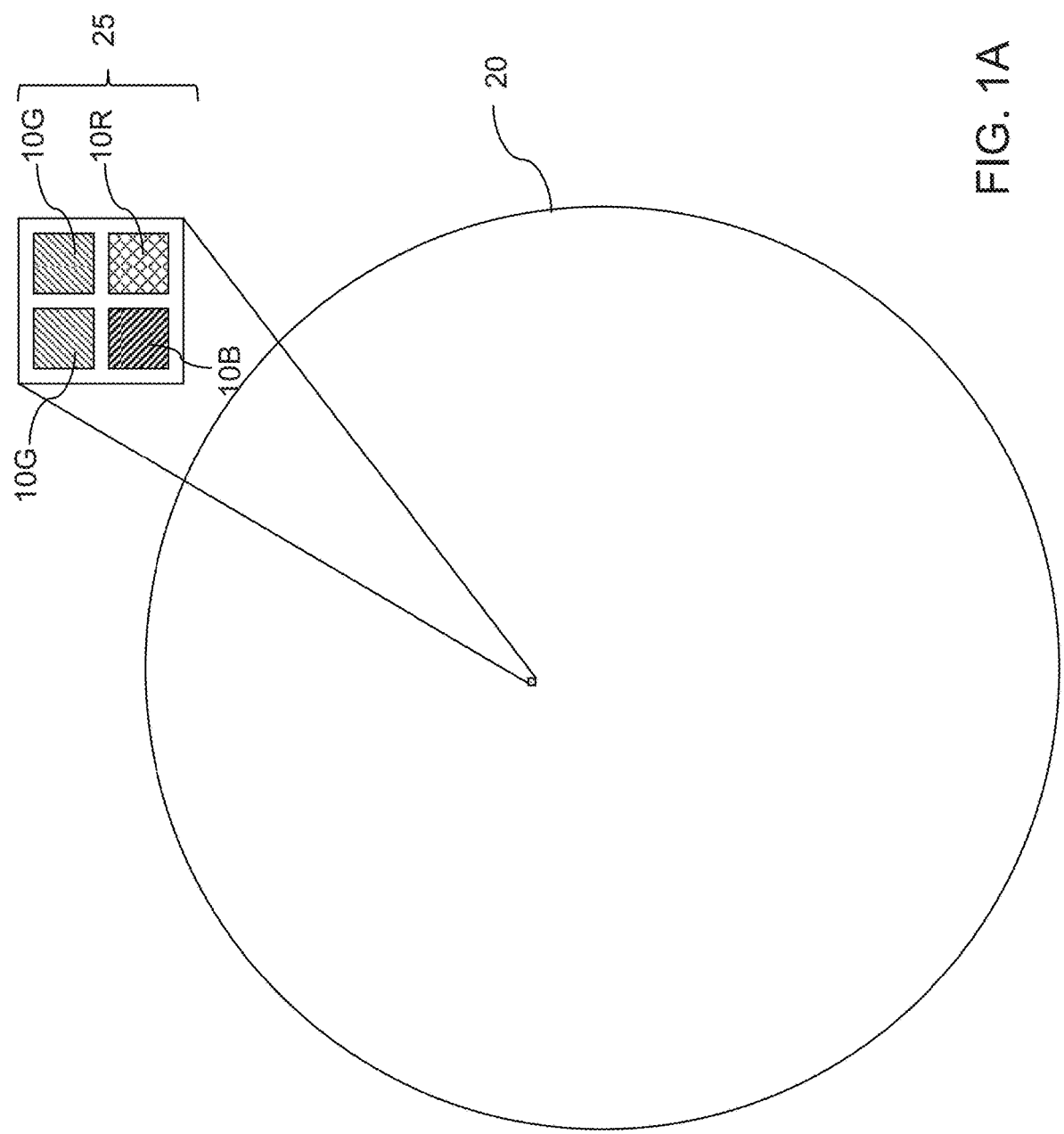

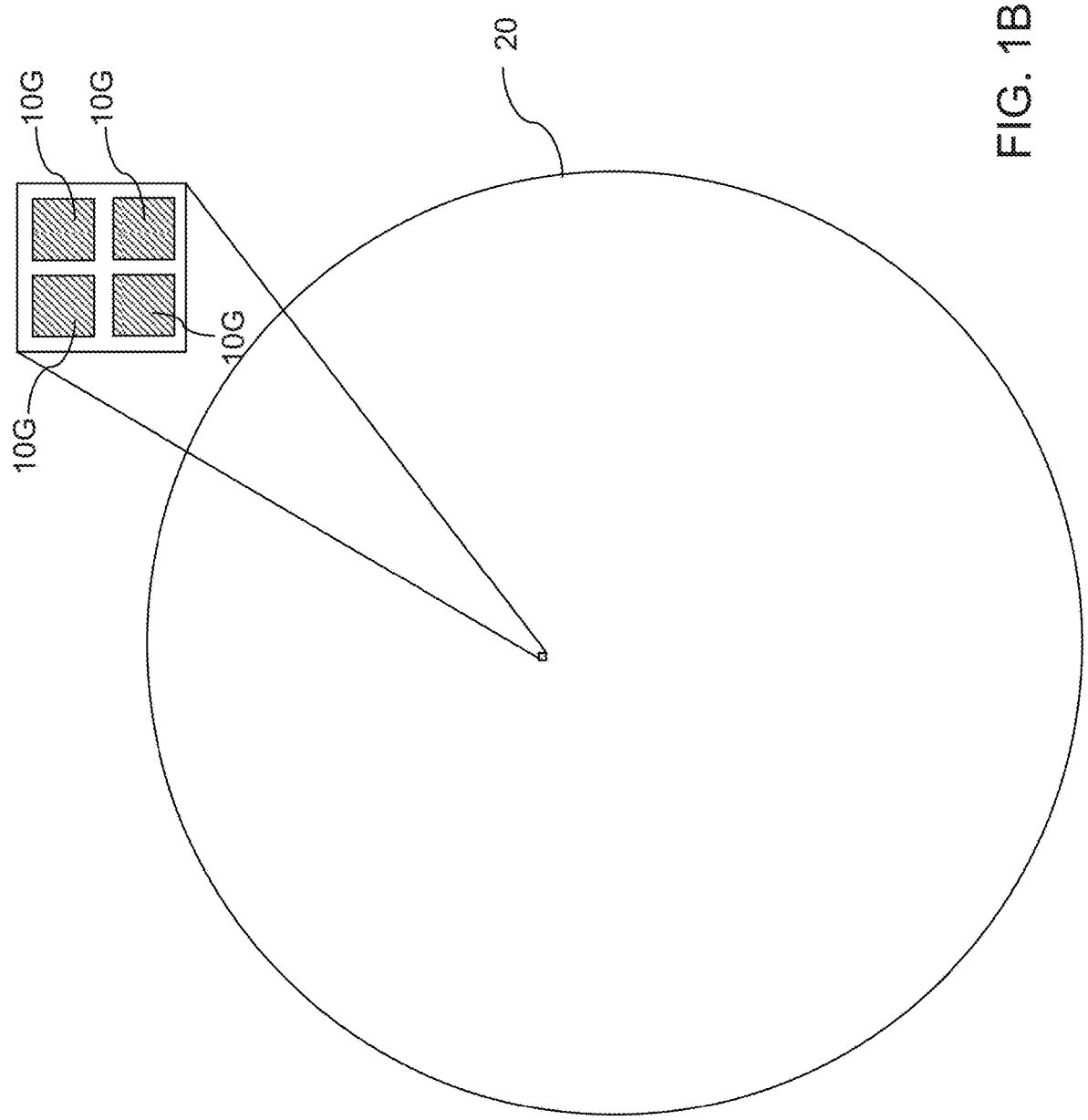

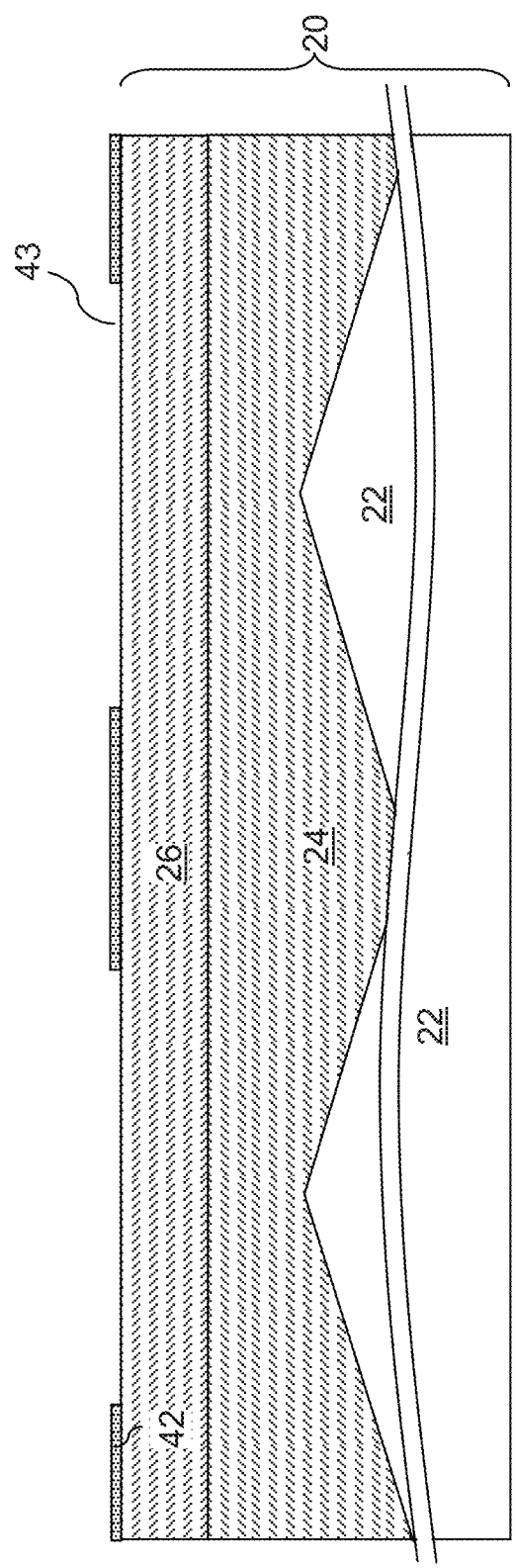

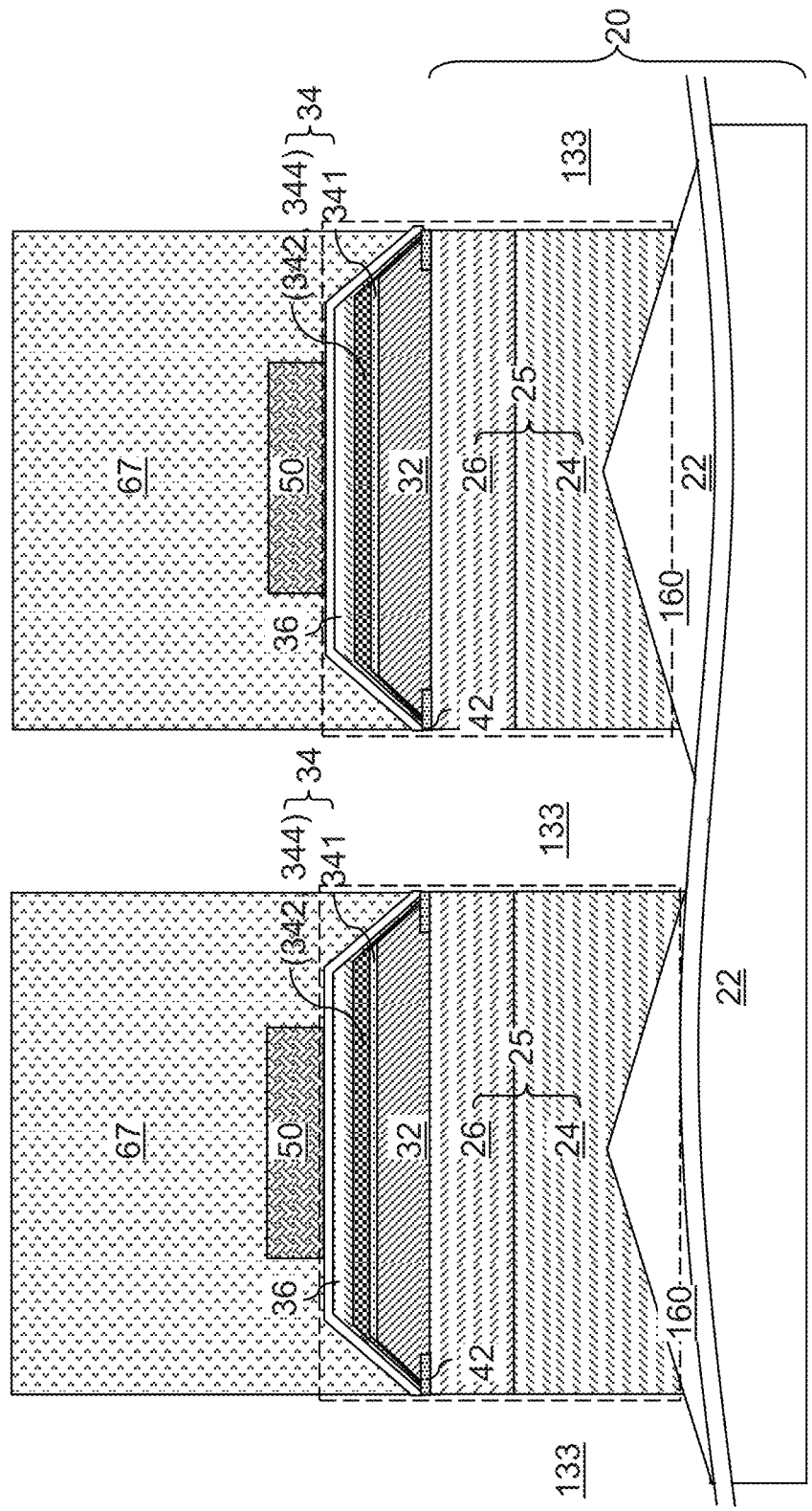

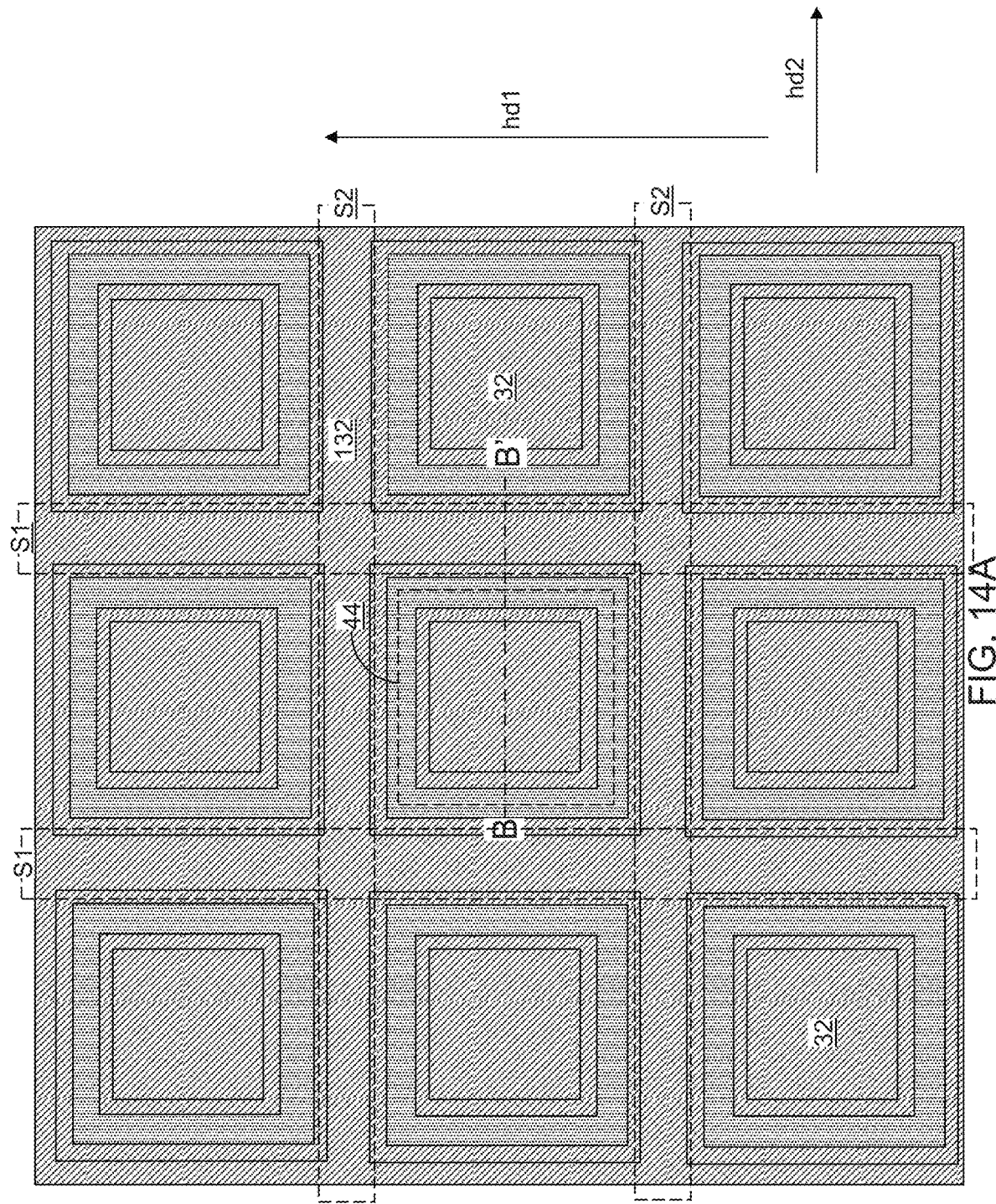

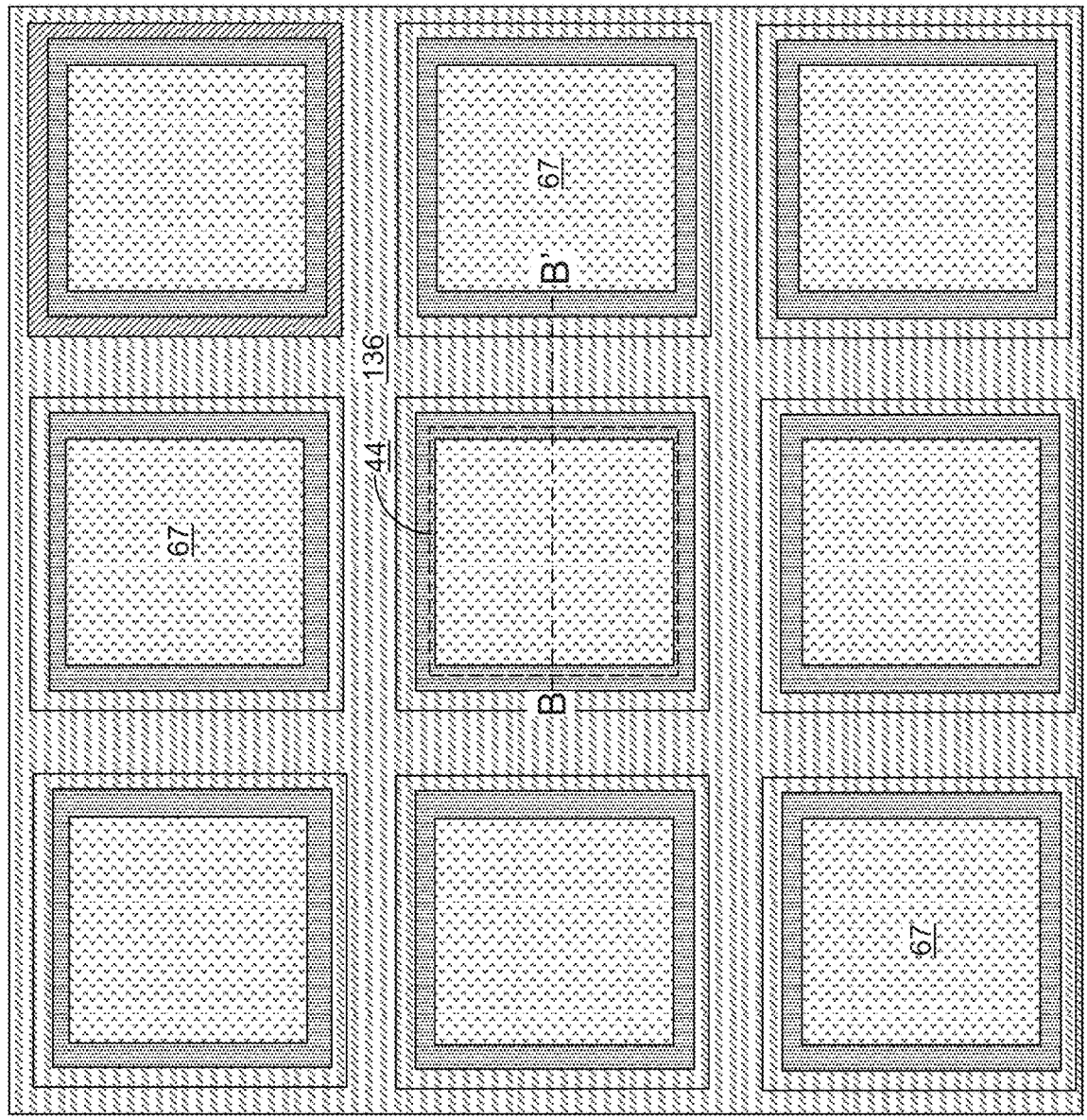

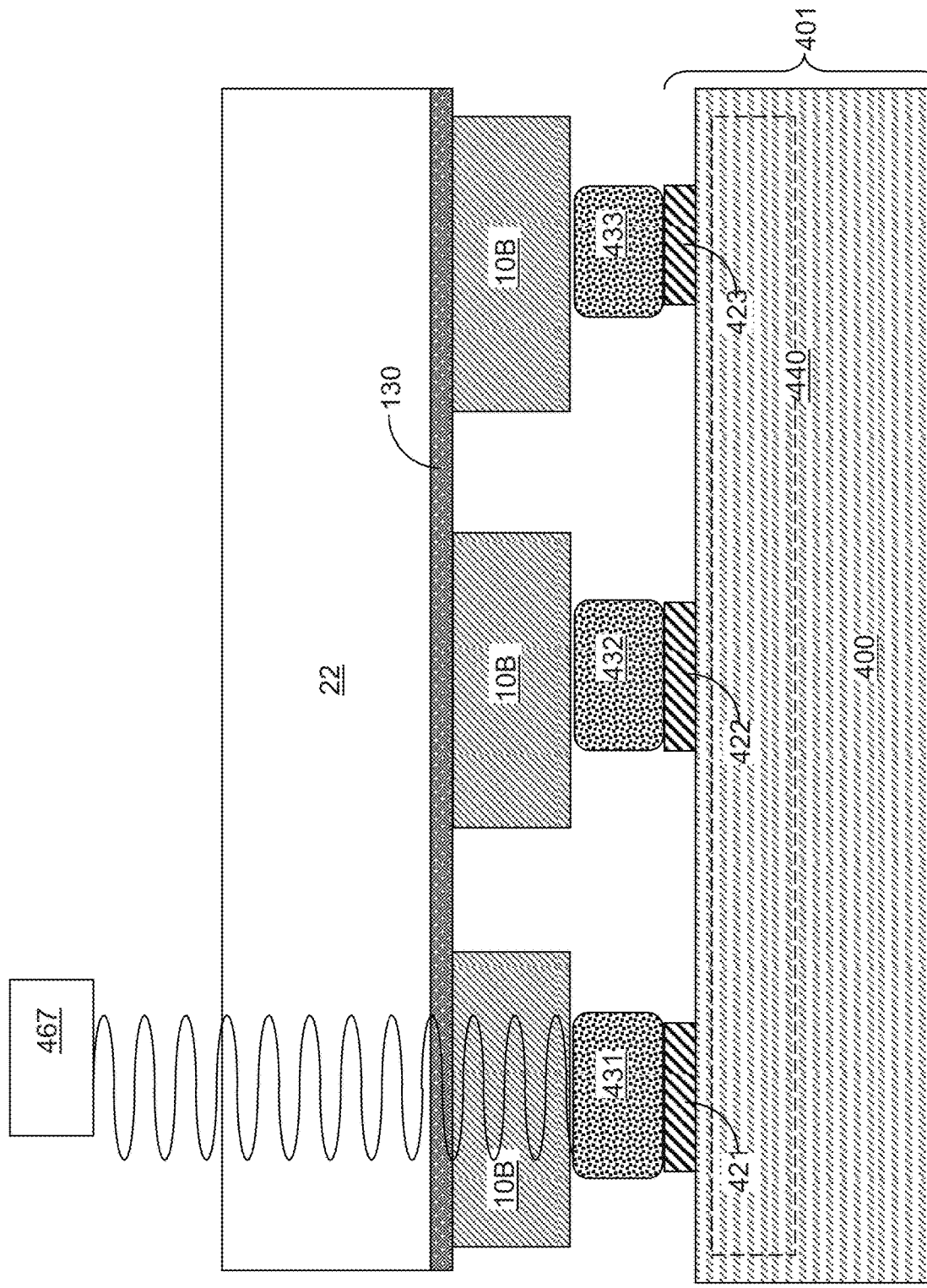

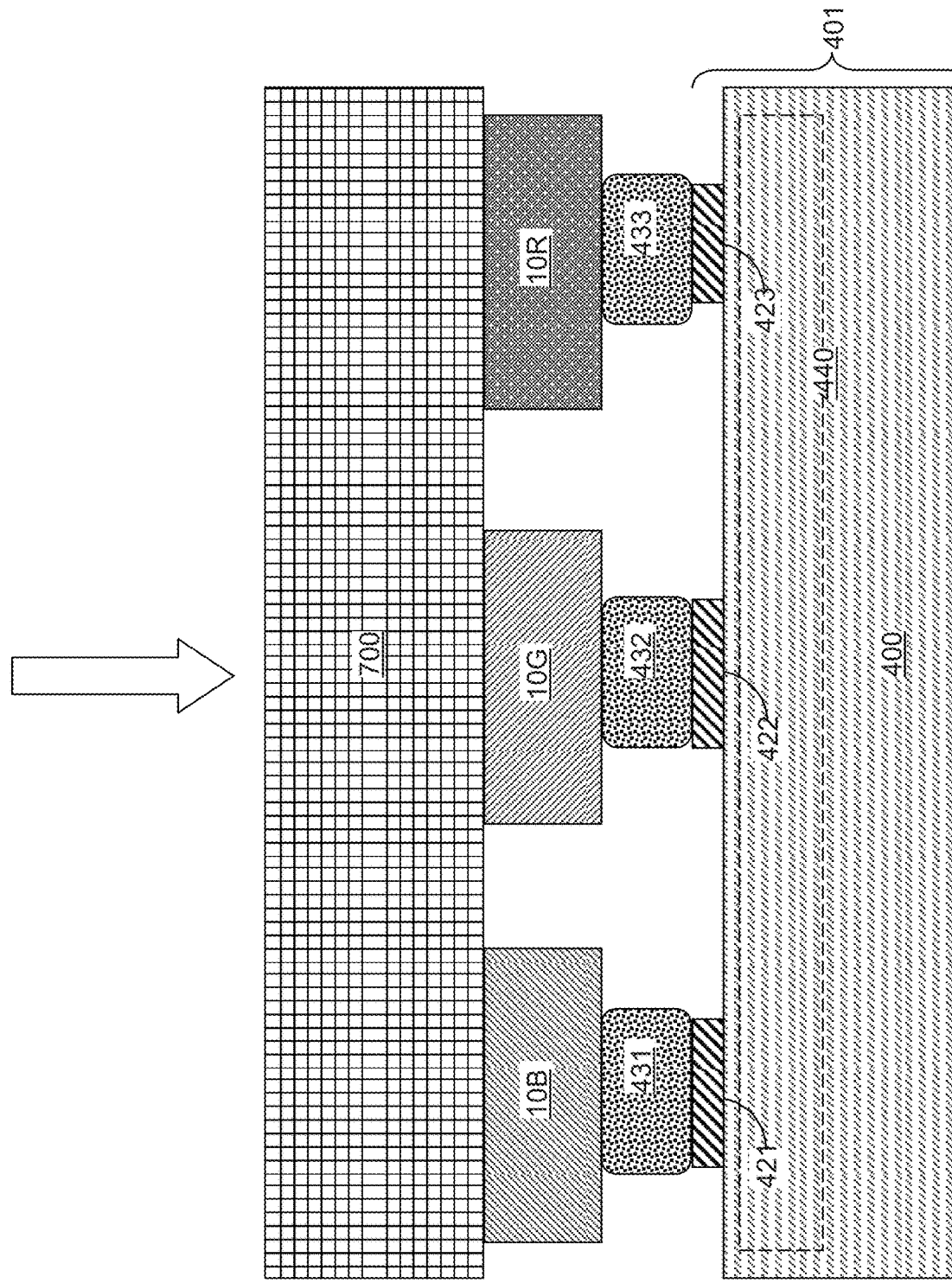

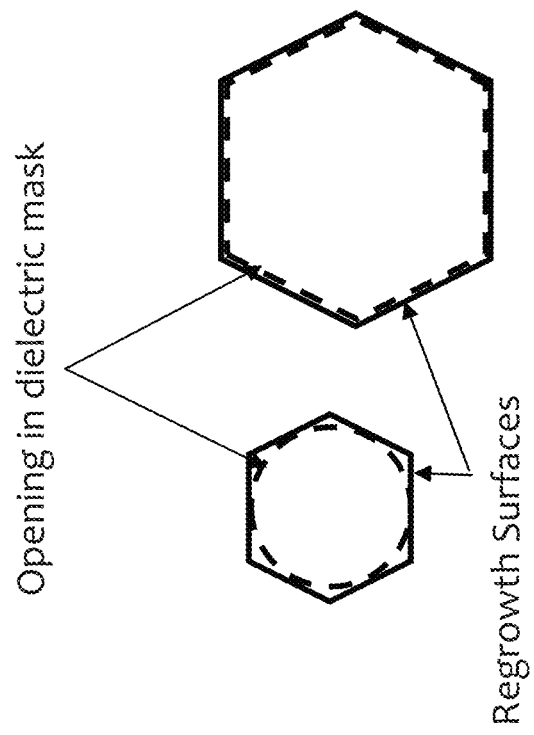
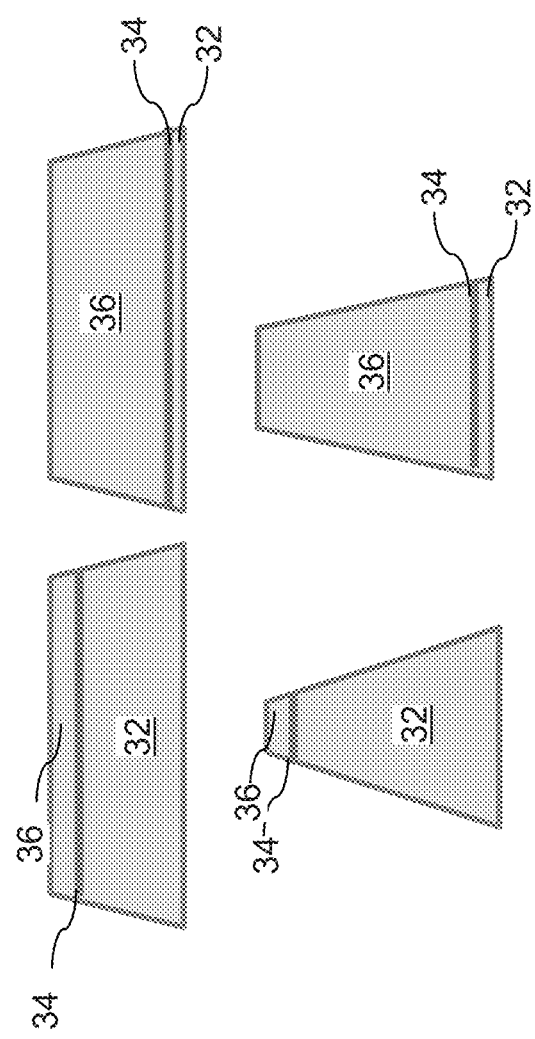
FIG. 17A
FIG. 17B
FIG. 17C

| | Case 1 | Case 2 | Case 3 | Case 4 | Case 5 | Reference structure |
|---|---|---|---|---|---|---|
| A (um) | 1 | 1.3 | 1.66 | 2.3 | 3 | 5.5x5.5 (with 10x10 on top surface) |
| Z (um) | 2.442 | 2.198 | 1.915 | 1.384 | 0.814 | 6.5 |
| Model | | | | | | |
| ER | 58.2% | 55% | 50.5% | 41.6% | 38.2% | 51.9% |
| Angle (°) | 108 | 102 | 94 | 97 | 118 | 108 |
| NF Map | | | | | | |

FIG. 20

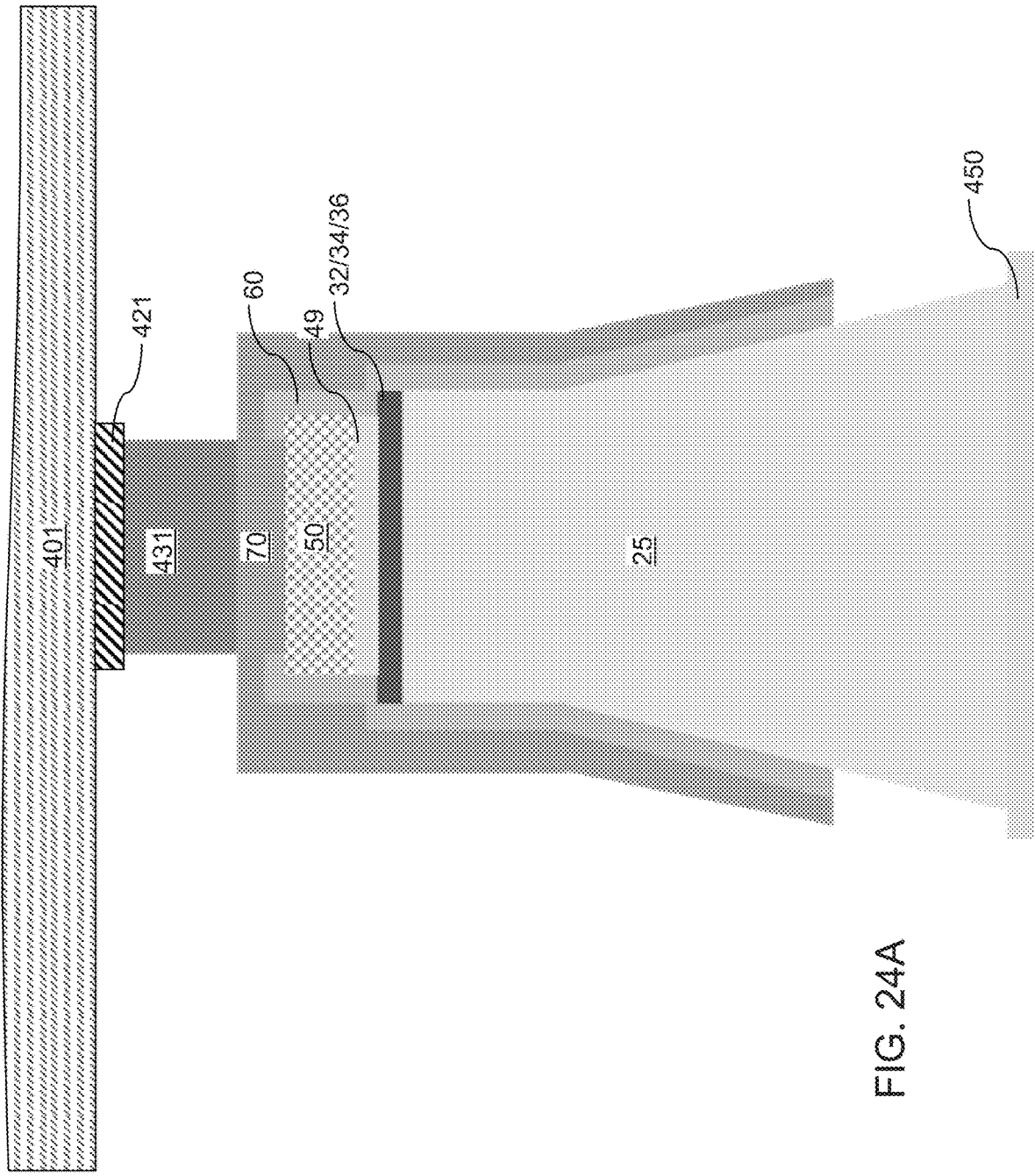

ETENDUE ENHANCEMENT FOR LIGHT EMITTING DIODE SUBPIXELS

RELATED APPLICATIONS

The instant application claims the benefit of priority from U.S. Provisional Application No. 62/559,375 filed on Sep. 15, 2017; U.S. Provisional Application No. 62/598,224 filed Dec. 13, 2017, and U.S. Provisional Application No. 62/621,865 filed Jan. 25, 2018, which are incorporated herein by reference in their entirety for all purposes.

FIELD

The present invention relates to light emitting devices, and particularly to light emitting diode subpixels and power devices formed by selective area growth of active regions, and methods of fabricating the same.

BACKGROUND

Light emitting devices such as light emitting diodes (LEDs) are used in electronic displays, such as backlights in liquid crystal displays located in laptops or televisions. Light emitting devices include light emitting diodes (LEDs) and various other types of electronic devices configured to emit light.

SUMMARY

According to an aspect of the present disclosure, a semiconductor structure is provided, which comprises: a mesa base semiconductor portion having a doping of a first conductivity type; a growth mask layer located on a planar surface of the mesa base semiconductor portion and including a plurality of opening therethrough; a plurality of active regions configured to emit light and including bottom nodes that are electrically shorted to the mesa base semiconductor portion by electrically conductive paths through the openings; a plurality of second conductivity type semiconductor material layers having a doping of a second conductivity type located on a respective one of the plurality of semiconductor layer stacks; and an anode contact electrode contacting planar surfaces of, and overlie, each of the plurality of second conductivity type semiconductor material layers.

According to another aspect of the present disclosure, a semiconductor structure is provided, which comprises: a mesa base semiconductor portion having tapered sidewalls and having a doping of a first conductivity type; a growth mask layer located on a planar surface of the mesa base semiconductor portion and including at least one opening therethrough; at least one semiconductor layer stack including a respective bottommost layer that is electrically shorted to the mesa base semiconductor portion by a respective electrically conductive path through a respective opening; and at least one second conductivity type semiconductor material layer having a doping of a second conductivity type located on the at least one semiconductor layer stack, wherein a lateral dimension of the doped semiconductor material portion along a direction parallel to an interface between the growth mask layer and the mesa base semiconductor portion increases with a vertical distance from the interface between the growth mask layer and the mesa base semiconductor portion.

According to even another aspect of the present disclosure, a semiconductor structure is provided, which comprises: a mesa base semiconductor portion having a doping of a first conductivity type; a growth mask layer located on a planar surface of the doped compound semiconductor layer and including at least one opening therethrough; at least one semiconductor layer stack including a respective bottommost layer that is electrically shorted to the mesa base semiconductor portion by a respective electrically conductive path through a respective opening; at least one second conductivity type semiconductor material layer having a doping of a second conductivity type located on the at least one semiconductor layer stack; and an optically clear encapsulation matrix located on a bottom side of the mesa base semiconductor portion and having a non-planar surface profile.

According to still another aspect of the present disclosure, a method of forming a light emitting device is provided, which comprises: forming a growth mask layer including openings therethrough on a planar surface of a doped compound semiconductor layer having a doping of a first conductivity type and overlying a substrate; forming first light emitting diode (LED) subpixels by: forming a plurality of active regions including bottom nodes that are electrically shorted to the mesa base semiconductor portion by electrically conductive paths through the openings, wherein each of the plurality of active regions includes a respective optically active compound semiconductor layer stack configured to emit light, forming second conductivity type semiconductor material layers on a respective one of the plurality of active regions, and forming an anode contact electrode continuously extending over, and contacting, the second conductivity type semiconductor material layers; and transferring each first LED subpixel to a backplane to form a portion of a respective pixel of the light emitting device.

According to yet another aspect of the present disclosure, a method of forming a light emitting device is provided, which comprises: forming a growth mask layer including openings therethrough on a planar surface of a doped compound semiconductor layer having a doping of a first conductivity type and overlying a substrate; forming first light emitting diode (LED) subpixels by: forming a plurality of active regions including bottom nodes that are electrically shorted to the doped compound semiconductor material layer by electrically conductive paths through the openings, wherein each of the plurality of active regions includes a respective optically active compound semiconductor layer stack configured to emit light, forming second conductivity type semiconductor material layers on a respective one of the plurality of active regions, and forming mesa base semiconductor portions by patterning the doped compound semiconductor layer, wherein a lateral dimension of the doped semiconductor material portion along a direction parallel to an interface between the growth mask layer and the mesa base semiconductor portion increases with a vertical distance from the interface between the growth mask layer and the mesa base semiconductor portion; and transferring each first LED subpixel to a backplane to form a portion of a respective pixel of the light emitting device.

According to another aspect of the present disclosure, a method of forming a light emitting device is provided, which comprises: forming a growth mask layer including openings therethrough on a planar surface of a doped compound semiconductor layer having a doping of a first conductivity type and overlying a substrate; forming first light emitting diode (LED) subpixels by: forming a plurality of active regions including bottom nodes that are electrically shorted to the mesa base semiconductor portion by electrically conductive paths through the openings, wherein each of the plurality of active regions includes a respective optically active compound semiconductor layer stack configured to emit light; forming second conductivity type semiconductor material layers on a respective one of the plurality of active regions, and forming mesa base semiconductor portions by patterning the doped compound semiconductor layer; transferring each first LED subpixel to a backplane to form a portion of a respective pixel of the light emitting device; and forming optically clear encapsulation matrices on a bottom side of the mesa base semiconductor portions.

According to an aspect of the present disclosure, a light emitting diode (LED) subpixel is provided, which comprises: a mesa base semiconductor portion having tapered sidewalls and having a doping of a first conductivity type; a growth mask layer located on a planar surface of the mesa base semiconductor portion and including at least one opening therethrough; at least one semiconductor layer stack including a respective bottommost layer that is electrically shorted to the mesa base semiconductor portion by a respective electrically conductive path through a respective opening; at least one second conductivity type semiconductor material layer having a doping of a second conductivity type located on the at least one semiconductor layer stack; an anode contact electrode electrically shorted to the at least one second conductivity type semiconductor material layer; a reflector layer comprising a metal and having a thickness of at least 500 nm and electrically shorted to the anode contact electrode; and a dielectric liner layer providing electrical isolation between the reflector layer and the mesa base semiconductor portion. In one embodiment, the reflector layer has a thickness in a range from 1 micron to 10 microns, such as from 2 microns to 6 microns.

According to an aspect of the present disclosure, a method of forming a light emitting device is provided, which comprises: forming a growth mask layer including openings therethrough on a planar surface of a doped compound semiconductor layer having a doping of a first conductivity type and overlying a substrate; forming a release layer including a sacrificial compound semiconductor material on the planar surface of a doped compound semiconductor layer; forming at least one active region including a respective optically active compound semiconductor layer stack configured to emit light on the release layer; forming at least one second conductivity type semiconductor material layer on a respective active region; forming an anode contact electrode continuously extending over, and contacting, the at least one second conductivity type semiconductor material layer; releasing an assembly including the anode contact electrode, the at least one second conductivity type semiconductor material layer, and the at least one active region by removing the release layer; and transferring the assembly to a backplane to form a portion of a respective pixel of the light emitting device. In one embodiment, the release layer comprises an InGaN layer.

According to an aspect of the present disclosure, a semiconductor structure is provided, which comprises: a doped compound semiconductor layer located over a substrate; a growth mask layer located on a planar surface of the doped compound semiconductor layer and including at least one opening therethrough; at least one selectively grown epitaxial semiconductor structure extending through a respective opening through the growth mask layer and having a doping of a first conductivity type; at least one semiconductor layer stack located on a respective selectively grown epitaxial semiconductor structure; and at least one second conductivity type semiconductor material layer having a doping of a second conductivity type and located on a respective semiconductor layer stack.

According to another aspect of the present disclosure, a method of forming a semiconductor structure is provided, which comprises the steps of: forming a growth mask layer including openings therethrough on a planar surface of a doped compound semiconductor layer located over a substrate; forming a plurality of selectively grown epitaxial semiconductor structures extending through a respective opening through the growth mask layer and having a doping of a first conductivity type; forming a plurality of semiconductor layer stacks on a respective selectively grown epitaxial semiconductor structure; and forming at least one second conductivity type semiconductor material layer having a doping of a second conductivity type and on the plurality of semiconductor layer stacks.

According to an aspect of the present disclosure, a method of forming a light emitting device includes forming a growth mask layer including openings therethrough on a planar surface of a doped compound semiconductor layer located over a substrate, forming first light emitting diode (LED) subpixels by forming first conductivity type epitaxial semiconductor structures separated by isolation regions through the openings of the growth mask layer, forming a plurality of active regions on a respective one of the epitaxial semiconductor structures, wherein each of the plurality of active regions includes a respective optically active compound semiconductor layer stack configured to emit light, and forming second conductivity type semiconductor material layers on a respective one of the plurality of active regions, and transferring each first LED subpixel to a backplane to form a portion of a respective pixel of the light emitting device.

According to another aspect of the present disclosure, a light emitting device (LED), comprises a substrate, a doped compound semiconductor layer located over the substrate, a growth mask layer located on a planar surface of the doped compound semiconductor layer and including openings therethrough, a plurality of selectively grown epitaxial semiconductor structures separated by isolation regions, each epitaxial semiconductor structure having a doping of a first conductivity type and including an epitaxial mesa portion and an epitaxial connection portion located in the respective opening in the growth mask layer and connecting a top portion of the doped compound semiconductor layer to a bottom of the epitaxial mesa portion, wherein a planar surface of the epitaxial mesa portion includes a crystallographic c-plane that is parallel to the planar surface of the doped compound semiconductor layer, an active region located on the epitaxial mesa portion of each epitaxial semiconductor structure, and including an optically active compound semiconductor layer stack configured to emit light, and a second conductivity type semiconductor material layer having a doping of a second conductivity type and located on the active region.

BRIEF DESCRIPTION OF THE DRAWINGS

FIG. 1A is a plan view of a substrate with light emitting diodes of multiple colors according to an embodiment of the present disclosure.

FIG. 1B is a plan view of a substrate with light emitting diodes of a same color according to an embodiment of the present disclosure.

FIG. 2B is a vertical cross-sectional view of the first exemplary structure along the plane B-B' of FIG. 2A.

FIG. 6 is a vertical cross-sectional view of the first exemplary structure after formation of pedestal structures by patterning the doped compound semiconductor layer and the optional buffer layer according to the first embodiment of the present disclosure.

FIG. 14A is a plan view of a third exemplary structure after formation of epitaxial semiconductor structures and an epitaxial grid structure according to a third embodiment of the present disclosure.

FIG. 15A is a plan view of the third exemplary structure after formation of active regions, second conductivity type doped semiconductor layers, and a patterned photoresist layer for patterning pedestal structures according to the third embodiment of the present disclosure.

FIG. 17A illustrates exemplary relationships between a shape of an opening in a dielectric mask and regrowth surfaces of active regions.

FIG. 17B illustrates vertical cross-sectional profiles of exemplary self-aligned growth structures according to an embodiment of the present disclosure.

FIG. 17C illustrates vertical cross-sectional profiles of additional exemplary self-aligned growth structures according to an embodiment of the present disclosure.

FIG. 20 illustrates etendue for various cases of exemplary LED subpixels that employ tapered sidewalls according to an embodiment of the present disclosure.

FIG. 24A illustrates a first configuration for providing electrical connection to nodes of an LED subpixel according to an embodiment of the present disclosure.

DETAILED DESCRIPTION

Figure 2A:
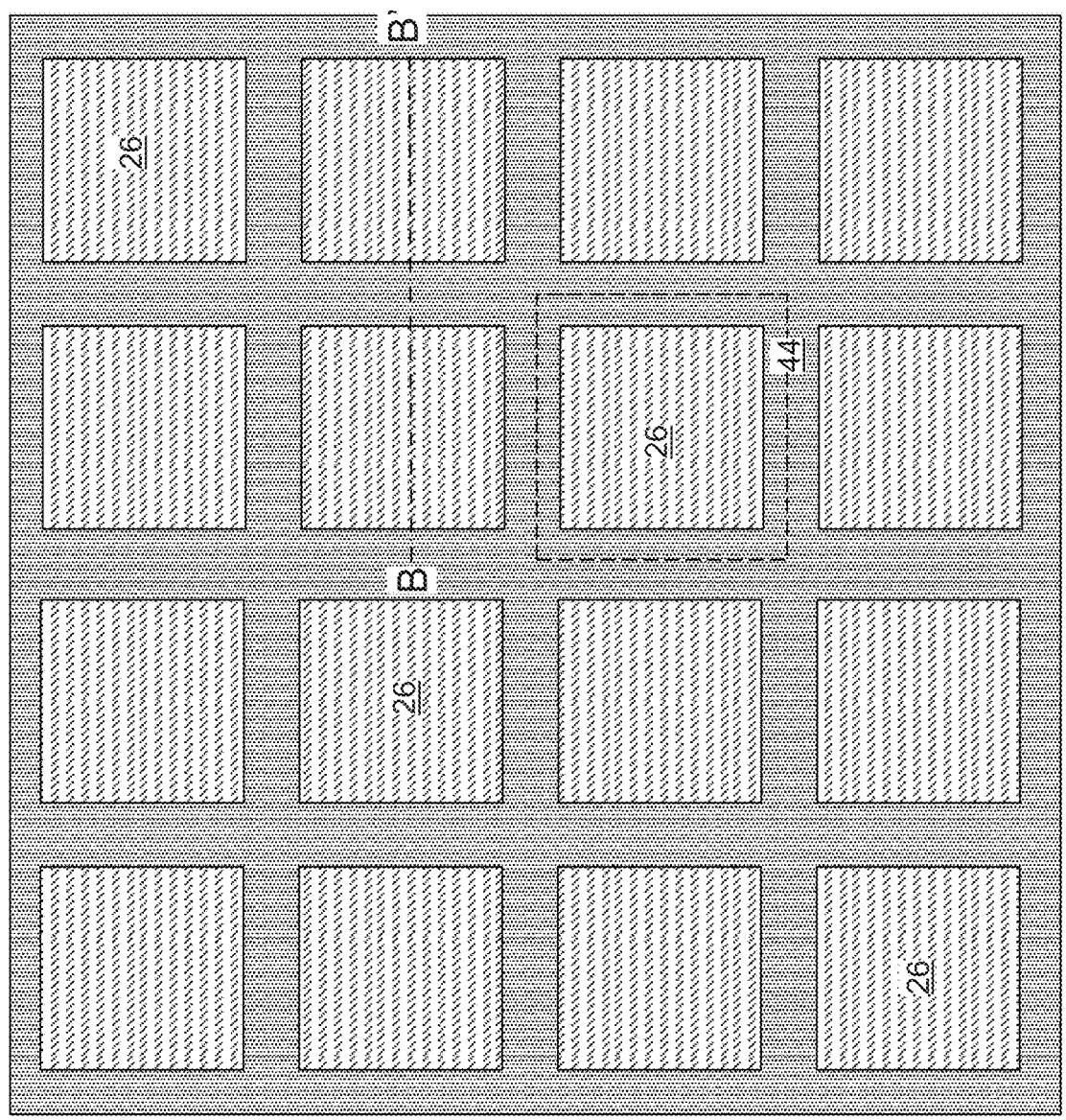
FIG. 2A is a plan view of a first exemplary structure including a substrate and a patterned growth mask layer according to a first embodiment of the present disclosure.

As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rate means layer growth rate along the direction perpendicular to a growth surface when not otherwise specified.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., epitaxial semiconductor structure) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green LED to form a red emitting subpixel. In another embodiment, a blue or green light emitting epitaxial semiconductor structure LED in each pixel is replaced with a regrown red emitting planar LED, such as an organic or inorganic red emitting planar LED to form a red emitting subpixel.

FIG. 1A illustrates a substrate 20 on which an array of pixels 25 is fabricated. Each pixel 25 can include a plurality of subpixels (10B, 10G, 10R), each of which includes a cluster of light emitting epitaxial semiconductor structures configured to emit light at a respective wavelength. Each pixel 25 can include light emitting diodes that emit light at different wavelengths. For example, each pixel 25 can include at least one first-type light emitting diode 10G (such as at least one green-light-emitting diode, for example two green-light-emitting diodes) that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm). The number of each type of light emitting diodes within a pixel 25 can be selected to provide a suitable level of illumination per pixel. For example, plural epitaxial semiconductor structure LEDs which emit green, blue and red light are formed in each respective green, blue and red light emitting areas of the pixel 25. Optionally, one of the sites in the pixel 25 (e.g., the site of one of the green-emitting LEDs 10G) may be left vacant as a repair site for later attaching a repair LED device to compensate for a defective or non-functioning LED device 10G, 10B or 10R in a particular pixel 25. A vacant site may be employed for one or more additional functionalities for a display device such as touch recognition through use of an infrared photodiode sensor. Methods of forming light emitting diodes having different peak wavelengths on a single semiconductor substrate, i.e., without stacking multiple substrates over one another, is disclosed, for example, in U.S. Pat. No. 9,054,233 B2 to Ohlsson et al, which is incorporated herein by reference in its entirety.

The pixels 25, or a subset of the subpixels (10B, 10G, 10R) can be subsequently transferred to a backplane to provide a direct view display device, as will be described in more detail below. As used herein, a direct view display device refers to a display device in which each pixel 25 includes at least one light source that generates light from within upon application of a suitable electrical bias. Thus, a direct view display device does not require a back light unit or a liquid crystal material. As used herein, a "multicolor" pixel refers to a pixel that can emit light of different peak wavelengths depending on application of electrical bias, and thus, inherently capable of displaying multiple colors.

Alternatively, only a single type of subpixels configured to emit light at a same peak wavelength may be formed on a substrate 20 instead of multiple types of subpixels (10B, 10G, 10R). FIG. 1B illustrates a substrate 20 on which only a single type of subpixels 10G (e.g., green LEDs) is formed. In this case, multiple substrates 20 can be employed as sources for multiple types of subpixels. For example, a first substrate can include subpixels 10G of a first type that emit light at a first wavelength, a second substrate can include subpixels 10B of a second type that emit light at a second wavelength (e.g., blue LEDs), and so on (e.g., third substrate can include subpixels 10R of a third type that emit light at a third wavelength, such as red LEDs).

Referring to FIGS. 2A and 2B, a first exemplary structure is illustrated, which is an in-process structure for fabricating monolithic multicolor pixels 25 or single color subpixels (10B, 10G or 10R) on the substrate 20, such as an initial growth substrate. As used herein, an "in-process" structure refers to a structure that is subsequently modified to make a final structure. The exemplary structure can include a stack, from bottom to top, of a support substrate 22, an optional buffer layer 24, and a doped compound semiconductor layer 26. The support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the planar surface of the single crystalline material layer is possible. As used herein, a "planar" surface refers a two-dimensional Euclidean surface without a curvature. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the planar surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the planar surface of the support substrate 22, the lateral dimensions of each bump or each dimple can be in a range from 1.5 micron to 6 microns although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material, for example a Group III-nitride compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the planar surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w-x}In_wAl_xN$ in which w and x range between zero and less than one, and can be zero (i.e., GaN) and are selected to match the lattice constant of the planar surface of the support substrate 22. Optionally, As and/or P may also be included in the material for the bottom portion of the buffer layer, in which case the bottom portion of the buffer layer 24 can include $Ga_{1-w-x}In_wAl_xN_{1-x-z}As_yP_z$ in which y and z between zero and less than one, that matches the lattice constant of the planar surface of the support substrate 22. The materials that can be employed for an top portion of the buffer layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb).

The composition of the buffer layer 24 can gradually change between the bottom portion of the buffer layer 24 and the top portion of buffer layer 24 such that dislocations caused by a gradual lattice parameter change along the growth direction (vertical direction) does not propagate to the planar surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the planar surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the planar surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HYPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed. Optionally, the planar surface of the doped compound semiconductor layer 26 may be planarized to provide a planar surface, for example, by chemical mechanical planarization. A suitable surface clean process can be performed after the planarization process to remove contaminants from the planar surface of the doped compound semiconductor layer 26.

A patterned growth mask layer 42 can be formed on the planar surface of the substrate 20 (e.g., on top of the doped compound semiconductor layer 26). The patterned growth mask layer 42 can be formed, for example, by depositing a dielectric material layer and patterning the dielectric material layer to form openings 43 therein. For example, a silicon nitride layer, a silicon oxide layer, or a dielectric metal oxide layer (such as an aluminum oxide layer) can be formed on the planar surface of the substrate 20. In one embodiment, the dielectric material layer can include a silicon nitride layer. The thickness of the dielectric material layer can be in a range from 3 nm to 100 nm, although lesser and greater thicknesses can also be employed.

In one embodiment, the patterned growth mask layer 42 for selective growth of the semiconductor materials is preferably composed of a thermally stable, etch-resistant, decomposition-resistant, and outgassing-resistant material. During the selective epitaxial growth process, the growth temperature may be in a range from 600 degrees Celsius and 1,000 degrees Celsius, and the growth mask material should be thermally stable in the temperature range, as well as be decomposition-resistant and outgassing-resistant under ambient including hydrogen, nitrogen, and/or ammonia. Preferably, the mask material should not include any dopant element (such as Si and/or Mg) for III-V compound semiconductors. In one embodiment, the mask material of the patterned growth mask layer 42 can be aluminum oxide or a refractory metal (such as niobium, molybdenum, tantalum, tungsten or rhenium). Such a material for the growth mask layer 42 can be deposited, for example, by atomic layer deposition (ALD) or chemical vapor deposition (CVD).

A photoresist layer (not shown) can be applied over the planar surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of epitaxial semiconductor structures to be subsequently formed. For example, the openings in the photoresist layer can have polygonal shapes (such as triangles, rectangles, pentangles, hexagons, heptagons, etc.), circular shapes, elliptical shapes, and/or any other generally curvilinear closed two-dimensional shapes. In an illustrative example, the openings in the photoresist layer can have rectangular shapes, triangular shapes, hexagonal shapes, or circular shapes that are arranged as a two-dimensional periodic array. The maximum lateral dimension of each opening in the photoresist layer (such as the diameter of a circular shape or a diagonal of a rectangular shape) can be in a range from 1 micron to 100 microns, such as from 2 microns to 50 microns, although lesser and greater maximum lateral dimensions can also be employed. The pattern of the openings in the photoresist layer can be transferred through the dielectric material layer to form the patterned growth mask layer 42. The photoresist layer can be subsequently removed, for example, by ashing.

The openings 43 in the patterned growth mask layer 42 may, or may not, be arranged as a two-dimensional periodic array. The shape of each opening 43 replicates the shape of the overlying opening in the photoresist layer. The shape of each opening 43 may be a polygon (such as a square, a rectangle, a hexagon, etc.), a closed curved shape (such as a circle or an ellipse), or any closed curvilinear shape including at least one curved segment and/or at least one linear segment. In one embodiment, straight edges of a polygonal shape of each opening 43 may align to an m-plane of the III-V compound semiconductor material in the doped compound semiconductor layer 26. A portion of the planar surface of the doped compound semiconductor layer 26 is physically exposed underneath each opening 43 through the patterned growth mask layer 42. In an illustrative example, the openings 43 can have the shapes of rectangles having a maximum lateral dimension in a range from 2 nm to 100 microns, and can form a two-dimensional periodic rectangular array. In one embodiment, the maximum lateral dimension of each opening 43 may be in a range from 10 nm to 30 microns, from 100 nm to 10 microns, an/or from 300 nm to 3 microns, although lesser and greater dimensions may also be employed. The ratio of the total area of the openings 43 to the entire area of the first exemplary structure (i.e., the sum of the areas of the openings 43 and the total area of the patterned growth mask layer 42) can be in a range from 0.1 to 0.95, such as from 0.6 to 0.9, although lesser and greater ratios can also be employed.

In one embodiment, each opening 43 through the patterned growth mask layer 42 can correspond to a subpixel area 44. In this case, each subpixel area 44 includes only a single opening 43. In one embodiment, the openings 43 can be arranged as a periodic two-dimensional array. While a periodic rectangular two-dimensional array is illustrated for the openings 43, embodiments in which the two-dimensional array is not periodic or have a different type of periodicity (such as the periodicity within a hexagonal array) are expressly contemplated herein.

Figure 3A:
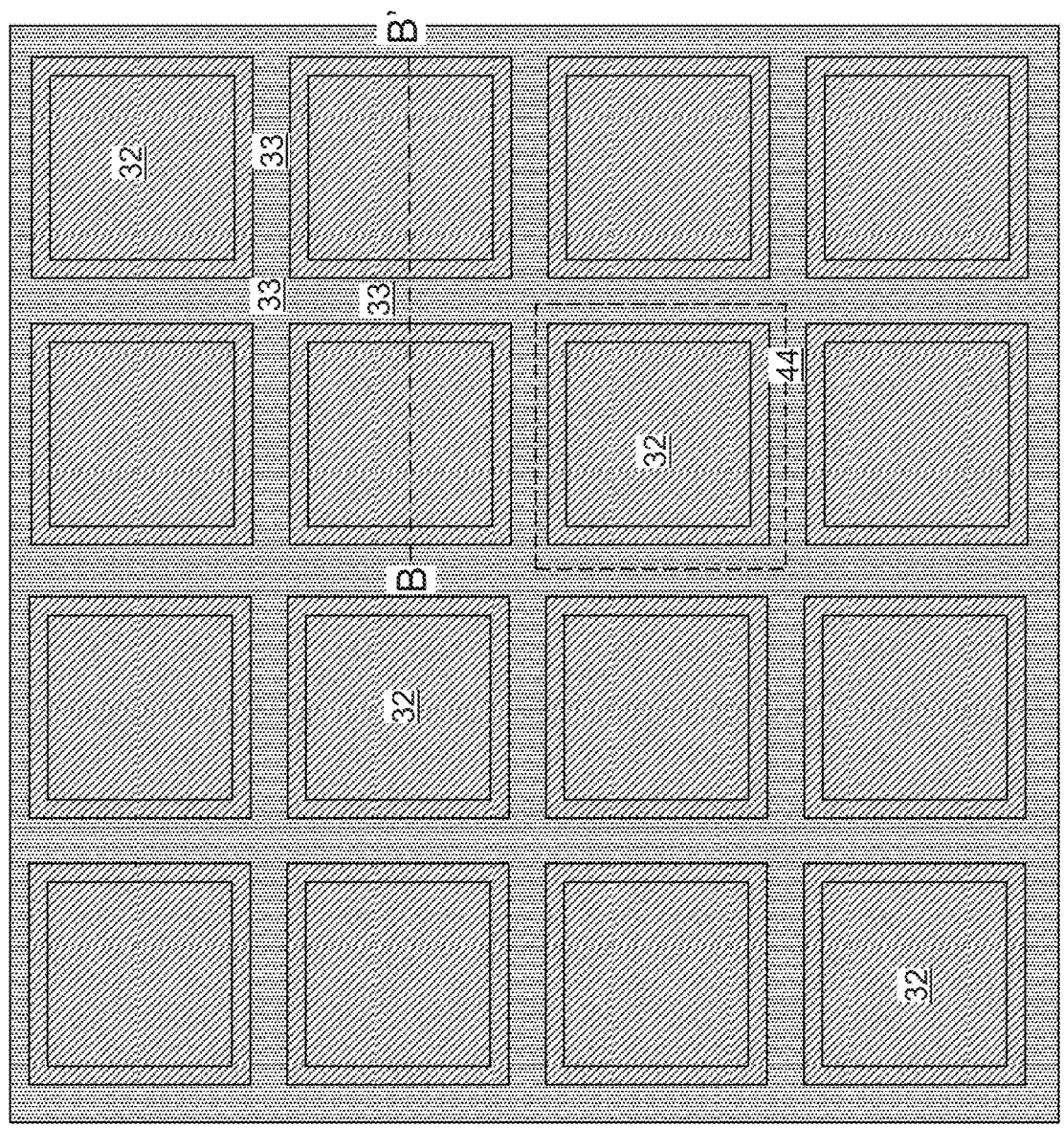
FIG. 3A is a plan view of the first exemplary structure after formation of epitaxial semiconductor structures according to the first embodiment of the present disclosure.
Figure 3B:
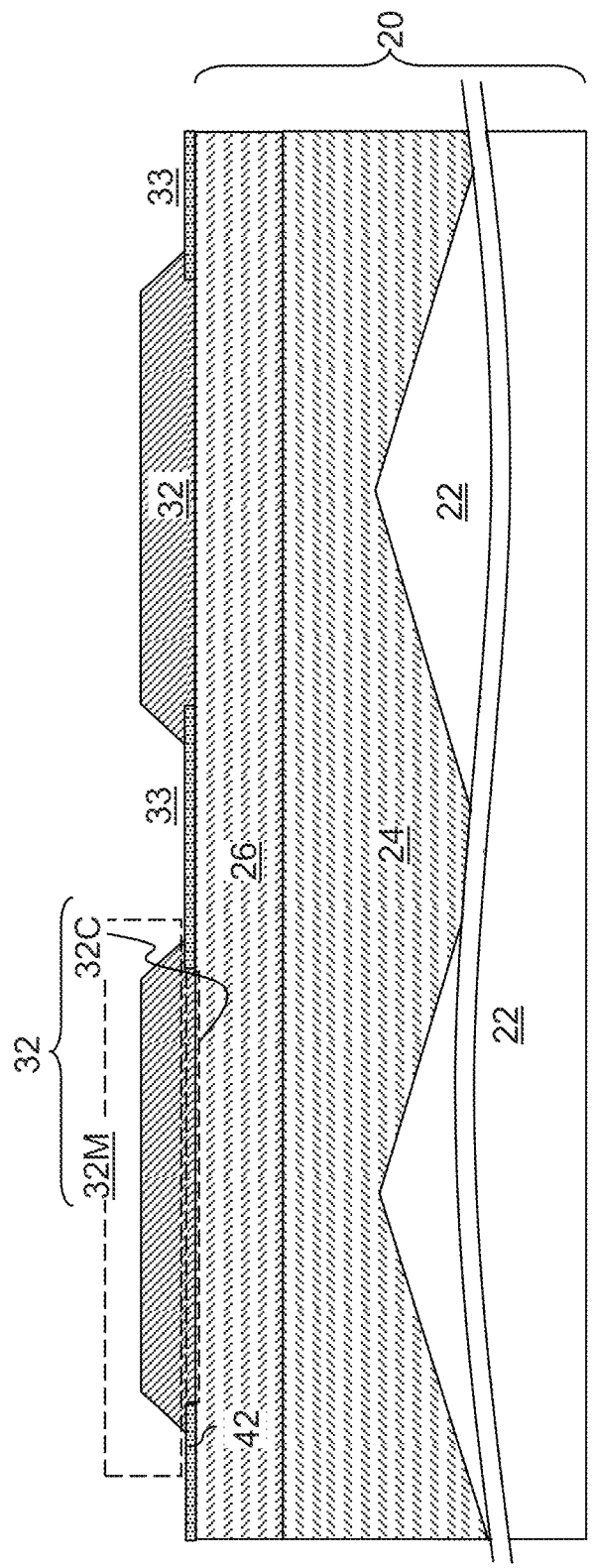
FIG. 3B is a vertical cross-sectional view of the first exemplary structure along the plane B-B' of FIG. 3A.

Referring to FIGS. 3A and 3B, a plurality of epitaxial semiconductor structures 32 are grown through, and over, the growth mask layer 42 by a selective compound semiconductor deposition process. In one embodiment, the plurality of epitaxial semiconductor structures 32 are formed employing a selective semiconductor deposition process that grows a doped semiconductor material from semiconductor surfaces and does not grow the doped semiconductor material from dielectric surfaces. Each of the plurality of epitaxial semiconductor structures 32 includes a respective epitaxial mesa portion 32M including a bottom surface, a horizontal planar surface, and tapered planar sidewalls adjoining the edges of the bottom surface and edges of the horizontal planar surface, and a respective epitaxial connection portion 32C contacting the bottom surface of the respective epitaxial mesa portion 32M. Each epitaxial connection portion 32C vertically extends from an underlying surface of the doped compound semiconductor layer 26 to a horizontal plane including the planar surface of the growth mask layer 42. Each of the epitaxial mesa portions 32M is surrounded by isolation regions 33 which are located over the growth mask layer 42. By selectively growing the epitaxial semiconductor structures 32 separated by the isolation regions 33, an isolation etch through the active semiconductor layers to separate the LEDs can be omitted.

Each of the epitaxial mesa portions 32M is formed with tapered sidewalls that grow outward from a periphery of a respective opening through the growth mask layer during the selective semiconductor deposition process. As used herein, a "tapered" element refers to an element that is not horizontal and is not vertical. Each epitaxial mesa portion 32M includes a doped compound semiconductor material having a doping of the first conductivity type, i.e., the conductivity type of doping of the doped compound semiconductor layer 26. The material of the epitaxial mesa portions 32M may be the same as, or may be different from, the material of the doped compound semiconductor layer 26. In one embodiment, the first conductivity type can be n-type, and each epitaxial mesa portion 32M includes an n-doped compound semiconductor material such as III-nitride compound semiconductor material, for example n-doped gallium nitride. Alternatively, any other suitable III-V or II-VI material may be used.

Each of the epitaxial mesa portions 32M can be formed with a set of angled facets, i.e., facets that are not horizontal and not vertical (i.e., not parallel or perpendicular to the planar surface of the substrate 20) that define a set of tapered sidewalls. The epitaxial mesa portions 32M can be grown, for example, by selective epitaxial growth of an n-doped compound semiconductor material. The epitaxial mesa portion 32M can have a width ranging from 2 nm to 100 microns (such as from 1 microns to 100 microns, including 2 microns to 50 microns) and a length ranging from 2 nm to 100 microns (such as from 1 microns to 100 microns, including from 2 microns to 50 microns). Other suitable dimensions can also be used. The entirety of each epitaxial mesa portion 32M can be single crystalline and epitaxially aligned to the single crystalline structure of the doped compound semiconductor layer 26.

In an embodiment of the present disclosure, the maximum lateral dimension of the openings 43 is significantly larger than the areas of openings that are employed to form semiconductor nanowires as known in the prior art. Further, the ratio of the total area of the openings to the total device area is at least 0.05, and is preferably greater than 0.2. In addition, the duration of the selective semiconductor deposition process is selected such that the height of the epitaxial semiconductor structures 32 is less than the maximum lateral dimension of the openings 42 in the growth mask layer 42.

In one embodiment, the ratio of the maximum lateral dimension of each bottom surface of the epitaxial semiconductor structure 32 to the height of the epitaxial semiconductor structure 32 can be greater than 1, and can be in a range from 3 to 1,000. In one embodiment, the height of the epitaxial semiconductor structures 32 can be in a range from 250 nm to 5 microns. In a non-limiting illustrative example, if the maximum lateral dimension of an opening 43 is in a range from 5 microns to 30 microns, the maximum lateral dimension of an epitaxial semiconductor structure 32 can be in a range from 5.5 microns to 35 microns, and the height of the epitaxial semiconductor structure can be in a range from 250 nm to 2,500 nm.

In one embodiment, each epitaxial mesa portion 32M can have tapered sidewalls, and bottom edges of the tapered sidewalls can be laterally offset outward from the periphery of the underlying opening through the growth mask layer 42 by a uniform or non-uniform lateral offset distance. The lateral offset distance is the width of the physical contact area between the epitaxial mesa portion 32M and the planar surface of the growth mask layer 42. In one embodiment, the ratio of the maximum lateral dimension of each opening 43 through the growth mask layer 42 to an average lateral offset distance can be greater than 2, and may be in a range from 5 to 500.

In one embodiment, each of the epitaxial mesa portions 32M can include a base plane that contacts the planar surface of the growth mask layer 42, a horizontal planar surface that is parallel to the planar surface of the doped compound semiconductor layer 26, and a set of tapered sidewalls that adjoin the edges of the base plane and the horizontal planar surface. In one embodiment, the base plane can be a crystallographic c-plane, and the planar surface can include another crystallographic c-plane. The tapered sidewalls of the epitaxial mesa portions 32M may, or may not, be crystallographic facets. If the edges of the openings 43 are parallel to a crystallographic direction of the doped compound semiconductor layer 26 included in a p-plane, sidewalls of the epitaxial mesa portions 32M can include crystallographic facets. If the edges of the openings 43 are not parallel to a crystallographic direction of the doped compound semiconductor layer 26 included in a p-plane, sidewalls of the epitaxial mesa portions 32M may not include crystallographic facets. In one embodiment, if the edges of the openings are not parallel to p-plane, then the sidewall of the epitaxial mesa portions 32M can be composed of multiple facets, which are distinct p-planes forming staggered edges. Generally, each tapered sidewall of the epitaxial mesa portions 32M laterally extend parallel to the edge of an underlying opening 43, and therefore, may, or may not, be crystallographic surfaces.

In one embodiment, each epitaxial mesa portion 32M can have a shape of a frustum, i.e., a truncated cone. The shape of the horizontal planar surface of each epitaxial mesa portion 32M generally replicates the shape of the underlying opening 43 with modifications induced by lateral shift of the edges of the horizontal planar surface of the epitaxial mesa portion 32 with respect to the edges of the underlying opening 43 during the selective areal growth of the doped compound semiconductor material of the epitaxial semiconductor structure 32. The horizontal cross-sectional shape of the frustum can be polygonal, circular, elliptical, or of any other general curvilinear two-dimensional closed shape.

Figure 4A:
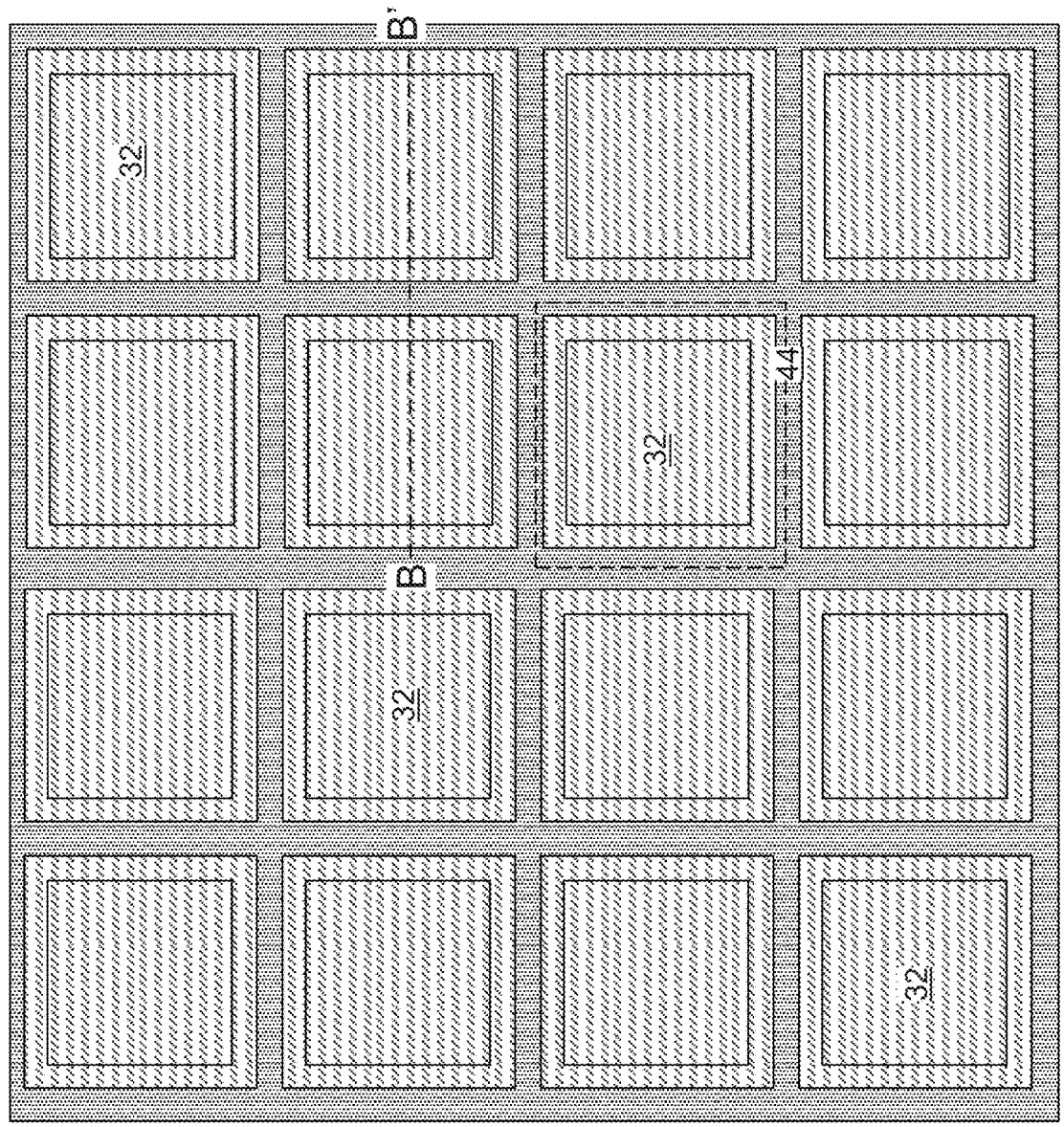
FIG. 4A is a plan view of the first exemplary structure after formation of active regions according to the first embodiment of the present disclosure.
Figure 4B:
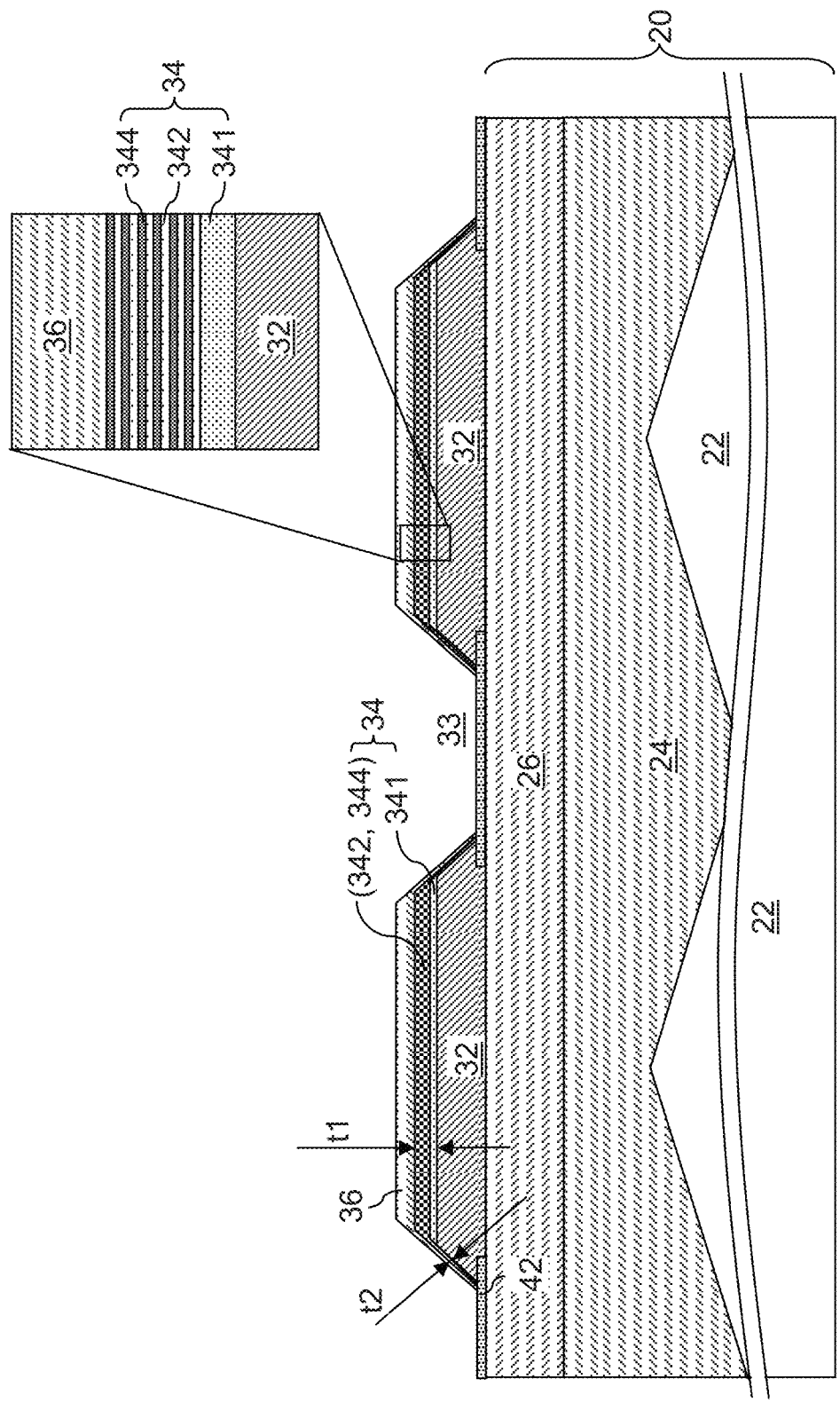
FIG. 4B is a vertical cross-sectional view of the first exemplary structure along the FIG. 5A is a vertical cross-sectional view of the first exemplary structure after formation of anode contact electrodes according to an embodiment of the present disclosure.

Referring to FIGS. 4A and 4B, an active region 34 is formed on each epitaxial mesa portion 32M. The active region 34 includes at least one semiconductor material that emits light upon application of a suitable electrical bias. In one embodiment, each of the plurality of active regions 34 includes a respective optically active compound semiconductor layer stack configured to emit light. For example, each active region 34 can include an epitaxial strain modulation layer 341 that that has a different lattice constant than the epitaxial mesa portions 32M, and at least one quantum well (QW) structure (342, 344) that emits light upon application of an electrical bias thereacross. Each multi-quantum well structure (342, 344) can include alternating repetitions of a first band gap semiconductor layer 342 having a first band gap and a second band gap semiconductor layer 344 having a second band gap. For example, the quantum well(s) may comprise indium gallium nitride well(s) located between gallium nitride or aluminum gallium nitride barrier layers. Alternatively, the active region 34 can include any other suitable semiconductor layers or stack of layers for light emitting diode applications provided that it can be grown on the surfaces of the epitaxial mesa portions 32M. The set of all layers within an active region 34 is herein referred to as an active layer.

In a non-limiting illustrative example, the epitaxial strain modulation layer 341 can include a silicon-doped GaN layer having a thickness of about 50 nm, the first band gap semiconductor layers 342 can be GaN layers having a thickness of about 5 nm, and the second band gap semiconductor layers 344 can be InGaN layers having a thickness of about 3 nm. Optionally, each active region 34 can include a barrier semiconductor layer (not expressly shown) such as a GaN barrier layer having a thickness of about 15 nm as a topmost layer. The sequence of layers, composition of each layer, and the thickness of each layer within the active region 34 can be optimized to increase emission intensity and to provide the target peak emission wavelength. The active region 34 may emit any color light, such as blue, green or red light depending on the composition of the semiconductor material therein and the strain that the semiconductor material is subjected to.

A selective epitaxy process can be employed to grow the active regions 34. The process parameters of the selective epitaxy process can be selected such that the active regions 34 are grown as conformal structures having a same, or substantially same, thickness throughout. In another embodiment, the active regions 34 can be grown as a pseudo-conformal structure in which the horizontal portions have the same thickness (such as a first thickness t1) throughout, and faceted portions have a thickness (such as a second thickness t2) that is less than the thickness of the horizontal portions. In one embodiment, each of the plurality of active regions 34 can include a top planar portion having the first thickness t1 and sidewall portions overlying tapered planar sidewalls of a respective one of the epitaxial mesa portions 32M and having the second thickness t2. In one embodiment, the ratio of the first thickness t1 to the second thickness t2 can be in a range from 2 to 50, although lesser and greater ratios can also be employed.

Any suitable for growing active regions can be employed to form the active regions 34 of the present disclosure, which are formed on epitaxial mesa portions 32M. In one embodiment, the outer surfaces of the active regions 34 can include horizontal surfaces that extend parallel to the planar surface of the doped compound semiconductor layer 26, and tapered faceted surfaces (i.e., tapered sidewalls) located over tapered facets of the epitaxial mesa portions 32M. In one embodiment, the horizontal surfaces of the active regions 34 can include crystallographic c-planes, and the tapered faceted surfaces of the active regions 34 can include crystallographic p-planes.

The thickness of the horizontal portions of the active regions 34 (as measured horizontally along a radial direction) can be in a range from 50 nm to 1 micron, although lesser and greater thicknesses can also be employed. Each active region 34 includes an active light emitting layer. The composition of the active regions 34 can be selected to emit light at a desired peak wavelength by changing the composition and strain of the active regions 34. In one embodiment, the active regions 34 can have the same composition and emit light of the same peak wavelength in each cluster 44 (e.g., having the structure shown in FIG. 1B). Alternatively, different clusters 44 can have active regions 34 with different compositions such that the active regions 34 in different clusters 44 emit light with a different peak wavelength (e.g., having the structure shown in FIG. 1A).

An active region 34 contacts, surrounds, and overlies an underlying epitaxial mesa portion 32M. In one embodiment, each subpixel areas includes a single epitaxial semiconductor structure 32 and a single active region 32, and corresponds to a subpixel (10G, 10B or 10R) of a direct view display device.

A second conductivity type semiconductor material layer 36 is formed on the planar surface and the tapered outer surfaces of each active region 34. The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type. The second conductivity type semiconductor material layers 36 can be formed by a selective semiconductor deposition process, and can be not in direct contact among one another, i.e., spaced among one another by physically exposed portions of the planar surface of the growth mask layer 42.

The second conductivity type semiconductor material layer 36 can include a compound semiconductor material. The compound semiconductor material of the second conductivity type semiconductor material layer 36 can be any suitable semiconductor material, such as p-type III-nitride compound semiconductor material, e.g., gallium nitride and/or aluminum gallium nitride. In one embodiment, the epitaxial mesa portions 32M can include n-doped GaN, and the second conductivity type semiconductor material layer 36 can include p-doped InGaN or GaN.

The second conductivity type semiconductor material layers 36 can be formed by selective deposition of the doped semiconductor material on the outer surfaces of the active regions 34. For example, a selective epitaxy process can be employed. During the selective deposition process (which can be a selective epitaxy process), discrete semiconductor material portions grow from the outer surfaces of each of the active regions 34 to form the second conductivity type semiconductor material layers 36. Each second conductivity type semiconductor material layer 36 can grow from a respective one of the active regions 34, and does not contact any other second conductivity type semiconductor material layer 36. Thus, a portion of the planar surface of the growth mask layer 42 can be physically exposed between each neighboring pair of the second conductivity type semiconductor material layers 36.

Figure 5A:
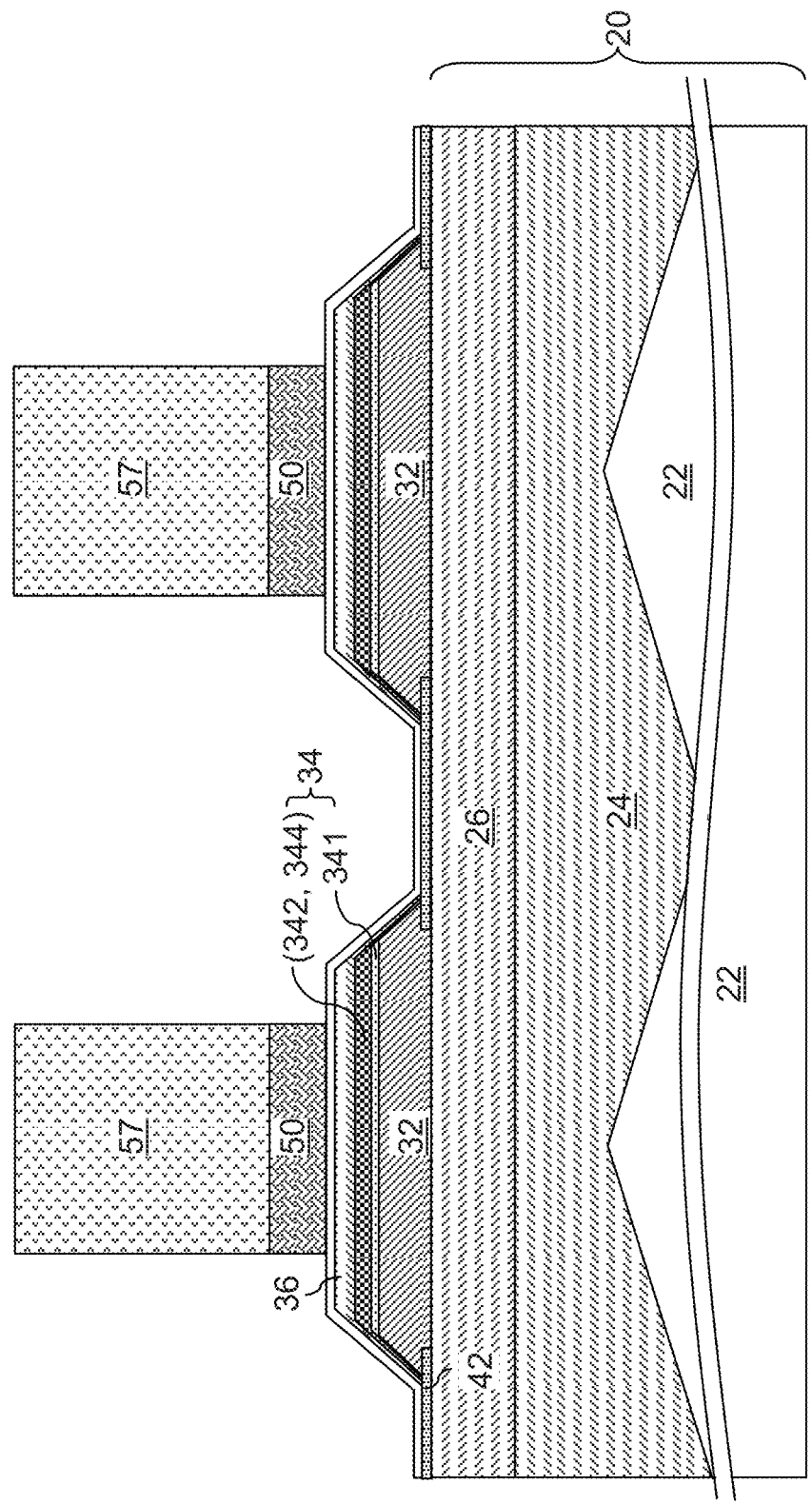
FIG. 5A is a vertical cross-sectional view of the first exemplary structure after formation of anode contact electrodes according to an embodiment of the present disclosure.

Referring to FIG. 5A, an optional transparent conductive layer 38, such as a transparent conductive layer can be deposited over the horizontally extending portion of the second conductivity type semiconductor material layers 36. The transparent conductive layer 38 includes a transparent conductive oxide material, as indium tin oxide, aluminum doped zinc oxide, or another suitable material. The transparent conductive layer 38 can be deposited as a continuous material layer that covers the entire area of the second conductivity type semiconductor material layers 36 and any physically exposed portions of the growth mask layer 42. The thickness of the transparent conductive layer 38 can be in a range from 5 nm to 600 nm, such as from 10 nm to 300 nm, although lesser and greater thicknesses can also be employed.

Alternatively, the transparent conductive layer 38 may be replaced with a silver layer, which can be deposited by physical vapor deposition and annealed to provide a contact to a p-type semiconductor material. In this case, the silver layer can function as an optically reflective material layer and subsequent deposition of an optically reflective material layer can be omitted.

A metallic material is deposited on the planar surface of the transparent conductive layer 38. The metallic material can include a reflective metal such as aluminum, silver, copper, and/or gold. The metallic material can be deposited, for example, by sputtering. The average thickness of the deposited metallic material can be in a range from 50 nm to 500 nm, although lesser and greater thicknesses can also be employed. A photoresist layer 57 can be applied over the metallic material, and can be lithographically patterned to cover a center portion of each sub-pixel to be subsequently formed. In one embodiment, the patterned portions of the photoresist layer can overlie center portions of the epitaxial semiconductor structures 32. An etch process can be performed to remove unmasked portions of the metallic material employing the photoresist layer as an etch mask. The etch process can be an isotropic etch process or an anisotropic etch process, and may, or may not, be selective to the materials of the transparent conductive layer 38. Each remaining portion of the metallic material that is patterned by the etch process constitutes an anode contact electrode 50. The photoresist layer is subsequently removed, for example, by ashing.

Optionally, at least one metallic (i.e., electrically conductive) barrier layer (not shown) can be formed as a component of the anode contact electrode 50. In this case, the at least one metallic barrier layer can be located at a planar surface of the anode contact electrode 50, and can be employed to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed. The photoresist layer 57 can be subsequently removed, for example, by ashing.

Figure 5B:
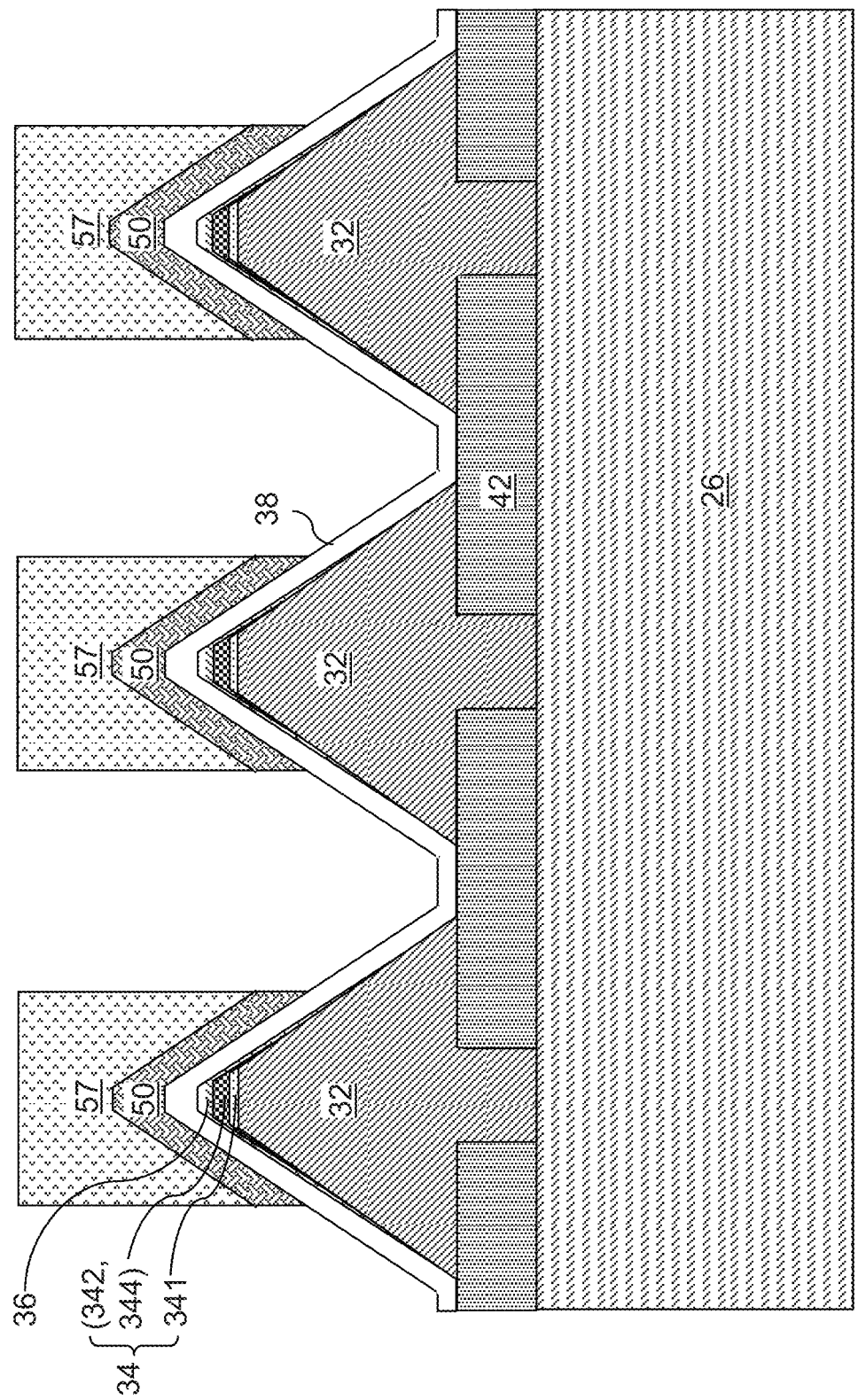
FIG. 5B is a vertical cross-sectional view of a first alternative embodiment of the first exemplary structure after formation of anode contact electrodes according to an embodiment of the present disclosure.

Referring to FIG. 5B, a first alternative embodiment of the first exemplary structure is illustrated, which may be obtained at the processing steps of FIGS. 2A and 2B by forming the epitaxial semiconductor structures 32 employing a pyramidal growth mode. In this case, the epitaxial mesa portions can be formed as frustums, such as microfrustums or nanofrustums. A nanofrustum is a frustum having nanoscale dimensions. In this case, each epitaxial semiconductor structure 32 may have a small planar top area with respect to the base area of the epitaxial semiconductor structure 32. The ratio of the planar top area to the base area of each epitaxial semiconductor structure 32 may be in a range from 0.001 to 0.3, such as from 0.01 to 0.1, although lesser and greater ratios can also be employed.

Subsequently, the processing steps of FIGS. 4A and 4B can be performed to form an active region 34 on the planar surface and faceted surfaces of each epitaxial semiconductor structure 32. The component layers and the thicknesses thereof within each active region 34 can be the same as in the active regions 34 illustrated in FIGS. 4A and 4B. The thickness of a planar portion of the active region 34 on the planar surface of each nanofrustum can be greater than the thickness of the faceted portions of the active region 34. The conductivity of the horizontal portion of each active region 34 along the vertical direction can be higher than the conductivity of the faceted portions of each active region 34. Thus, light emission occurs primarily at the planar portions of the active regions 34. The second conductivity type semiconductor material layer 36, the optional transparent conductive layer 38, and the anode contact electrode 50 can be subsequently formed by performing the processing steps of FIG. 5A.

Figure 5C:
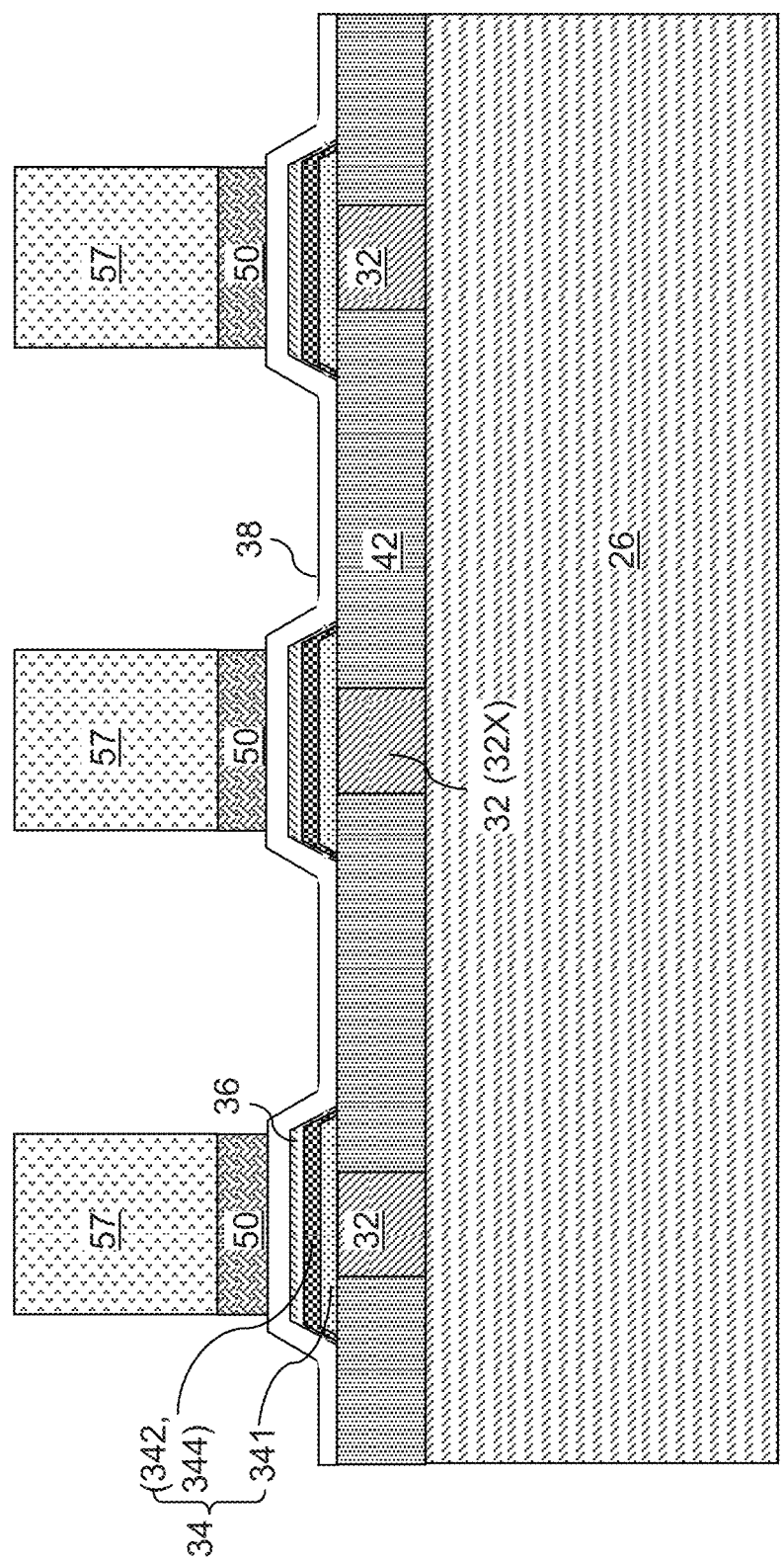
FIG. 5C is a vertical cross-sectional view of a second alternative embodiment of the first exemplary structure after formation of anode contact electrodes according to an embodiment of the present disclosure.

Referring to FIG. 5C, a second alternative embodiment of the first exemplary structure can be formed by terminating the selective epitaxy process that form the epitaxial semiconductor structures 32 at the processing steps of FIGS. 3A and 3B immediately upon completion of formation of the pillar portions that fill the openings 43. In this case, the epitaxial semiconductor structures 32 can consist of pillar portions 32X. The planar surfaces of the pillar portions may be substantially coplanar with the planar surface of the patterned growth mask layer 42. The active regions 34 may be formed as epitaxial mesa portions over a respective one of the epitaxial semiconductor structures 32 embodied as the pillar portions. Subsequently, the processing steps of FIGS. 4A and 4B and the processing steps of FIG. 5A can be performed.

In each of the embodiments illustrated in FIGS. 5A-5C, a relatively thin p-doped AlGaN layer having a thickness in a range from 20 nm to 100 nm and grown in a temperature range from 600 degrees Celsius to 1,000 degrees Celsius can be formed over the active regions 34 (e.g., it can be used as the second conductivity type semiconductor material layer 36 and/or it can be an additional layer underlying the second conductivity type semiconductor material layer 36). In this case, portions of the p-doped AlGaN layer formed on the facets (e.g., on the sidewalls of the active regions 34, such as on m-plane or p-plane sidewalls of the active regions 34) have a lower conductivity than portions of the p-doped AlGaN layer formed on top (e.g., on the c-plane) of the active regions 34. In this embodiment, the facet portions of the p-doped AlGaN layer function as current blocking regions. This can lead to a reduction of leakage current through the faceted (i.e., sidewalls) portions of the active regions 34 and/or can lead to emission of light with a more uniform wavelength distribution, i.e., with a smaller full width at half maximum in the distribution of intensity as a function of the wavelength.

In alternative embodiments, the epitaxial semiconductor structures 32, the active regions 34, and the second conductivity type semiconductor material layers 36 may be replaced with a device region including various doped epitaxial semiconductor material portions that collectively form a semiconductor device. Thus, each set of semiconductor material portions that are formed in lieu of a contiguous combination of an epitaxial semiconductor structures 32, and active regions 34, and a second conductivity type semiconductor material layers 36 may include a p-n junction, a p-i-n junction, a p-n-p junction, an n-p-n junction, a p-n-p-n junction, or any other suitable doping profile. An optional transparent conductive layer 38 and an anode contact electrode 50 can be subsequently formed on each semiconductor material portion.

Various semiconductor structures of some embodiments of the present disclosure can be employed as a high quality semiconductor material region on which various semiconductor devices can be manufactured. The various semiconductor devices that can be manufactured on the semiconductor structures include light emitting diodes, lasers, power diodes, junction transistors, field effect transistors, capacitors, varactors, resistors, inductors, or any other passive or active semiconductor devices known in the art. The planar surfaces of the semiconductor structures are free of etch damages and thus, are defect free. As such, the semiconductor structures can be employed as a template for manufacture of high quality semiconductor devices thereupon.

In one embodiment, the semiconductor devices that can be manufactured on the planar surfaces of the semiconductor structures can be power semiconductor devices. Exemplary power semiconductor devices include diodes, thyristors, triacs, bipolar junction transistors, power metal oxide semiconductor field effect transistors (MOSFETs), and insulated-gate bipolar transistors (IGBTs). Diodes are uni-polar, uncontrolled, switching devices used in applications such as rectification and circuit directional current control. Thyristors include silicon-controlled rectifiers (SCRs), metal-oxide-semiconductor controlled thyristors (MCTs), and gate turn-off thyristors (GTOs). The silicon-controlled rectifiers turn on only when a gate pulse is present and the anode is positive compared to the cathode. The metal-oxide-semiconductor controlled thyristors can be triggered on or off by a pulse to a metal-oxide-semiconductor field effect transistor (MOSFET) gate with minimal current flow, allowing for very low power control signals. The gate turn-off thyristors can be turned on and off with a gate pulse. Triacs include an integrated pair of phase-controlled thyristors connected in an inverse-parallel configuration. Bipolar junction transistors (BJTs) can provide high speed switching at the cost of high current consumption. Power MOSFETs can provide high voltage switching with minimal off-state leakage current. Insulated-gate bipolar transistors can provide hybrid characteristics between the MOSFETs and the BJTs.

For example, the multiple devices regions can be configured in a massively parallel connection in which the number of devices regions in the parallel connection can be in a range from 100 to 1,000,000,000, such as from 1,000 to 1,000,000, although lesser and greater number of devices are also contemplated herein. In one embodiment, each power semiconductor device can include at least one selectively grown epitaxial semiconductor structure 32 extending through a respective opening through a growth mask layer 42 and having a doping of a first conductivity type, at least one semiconductor layer stack 34 located on a respective selectively grown epitaxial semiconductor structure 32, and at least one second conductivity type semiconductor material layer 36 having a doping of a second conductivity type and located on a respective semiconductor layer stack. In one embodiment, the power rating of a power semiconductor device, as calculated by a product of a maximum current and a maximum voltage drop between a positive terminal and a negative terminal, may be in a range from 1 mWatts to 100 Watts, such as from 10 mWatts to 10 Watts and/or from 100 mWatts to 1 Watt, although lesser and greater power ratings may also be employed.

Referring to FIG. 6, optional isolation trenches 133 can be etched through the buffer layer 24 and the doped compound semiconductor layer 26. However, the isolation trenches 133 can be omitted in an alternative embodiment if the isolation regions 33 alone are sufficient to permit selective transfer of each subpixel 44 to a backplane as will be described below with respect to FIGS. 16A to 16P. To form the optional isolation trenches 133, a photoresist layer 67 can be applied over each anode contact electrode 50 and the transparent conductive layer 38, and can be lithographically patterned to cover an entire area of each sub-pixel to be subsequently formed. An anisotropic etch process can be performed to sequentially etch unmasked portions of the transparent conductive layer 38, the patterned growth mask layer 42, the doped compound semiconductor layer 26, and the buffer layer 24 employing the photoresist layer as an etch mask. The support substrate 22 can be employed as an etch stop structure. A continuous set of patterned portions of the doped compound semiconductor layer and the buffer layer 24 is herein referred to as a mesa base semiconductor portion 25, which constitutes a base portion of a mesa structure.

The photoresist layer 67 can be employed as a patterned etch mask layer for the anisotropic etch process. Generally, any patterned etch mask layer may be employed instead of the photoresist layer 67. The photoresist layer 67 (or any patterned etch mask layer) includes a plurality of discrete etch mask portions, each of which can cover a respective single subpixel area 44. In one embodiment, each of the plurality of discrete etch mask portions (such as discrete portions of the patterned photoresist layer 67) covers no more than only one of the plurality of active regions 34. The photoresist layer 67 (or any other patterned etch mask layer) covers each of the plurality of active regions 34. Portions of the doped compound semiconductor layer 26 that are not covered by the patterned etch mask layer are anisotropically etched. Each sidewall of the photoresist layer 67 (or any other patterned etch mask layer) can be located entirely outside areas of the plurality of active regions 34. In this case, the active region 34 are not etched during the anisotropic etch process. The doped compound semiconductor layer 26 is patterned into patterned discrete portions by the anisotropic etch process.

Each contiguous set of remaining portions of the transparent conductive layer 38, the second conductivity type semiconductor material layer 36, the semiconductor structures 32, the active regions 34, the patterned growth mask layer 42, the doped compound semiconductor layer 26, and the buffer layer 24 collectively constitute a pedestal structure 160. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each pedestal structure 160. The pedestal structures 160 are separated from each other by the isolation trenches 133. Sidewalls of the semiconductor structures 32, if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same pedestal structure 160. The photoresist layer 67 is subsequently removed, for example, by ashing.

Figure 7:
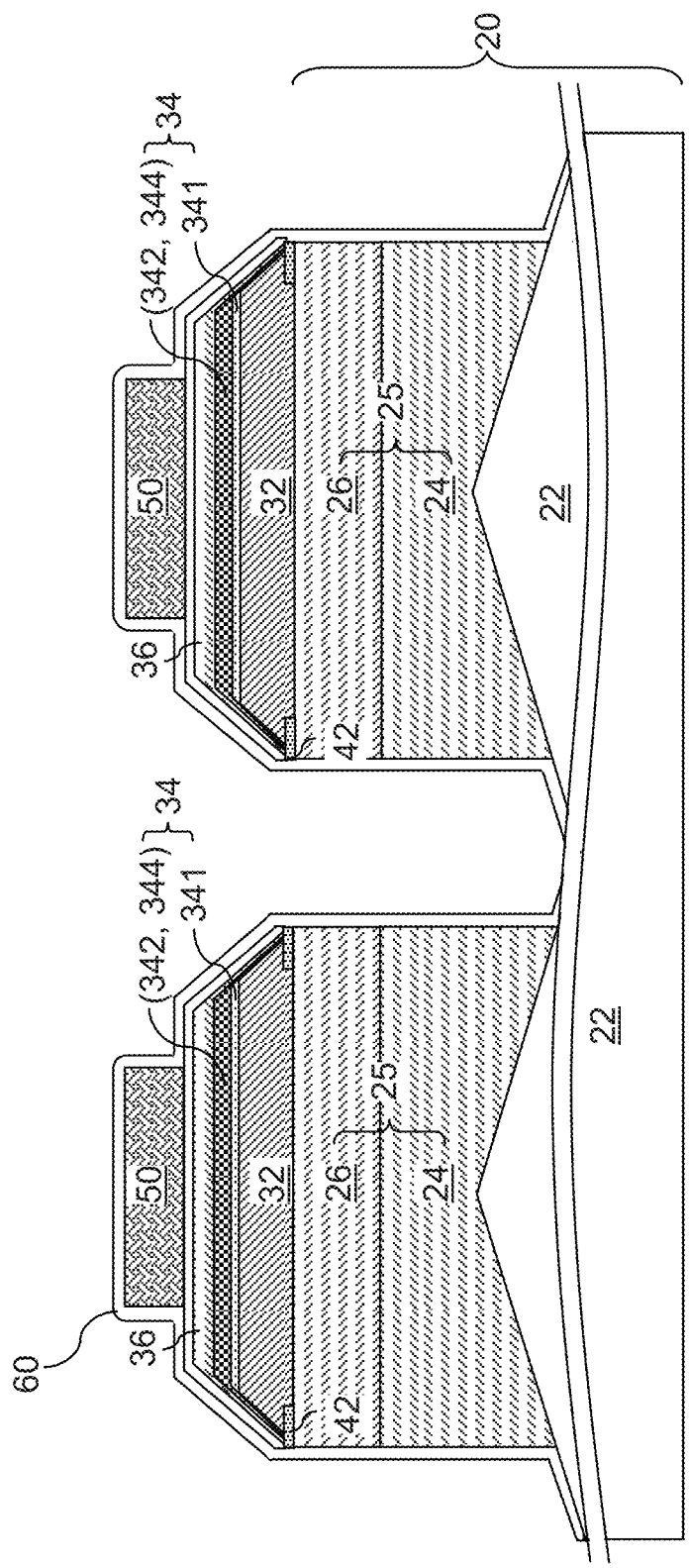
FIG. 7 is a vertical cross-sectional view of the first exemplary structure after formation of a dielectric liner layer according to the first embodiment of the present disclosure.

Referring to FIG. 7, a dielectric liner layer 60 may be deposited over the second conductivity type semiconductor material layer 36, the transparent conductive layer 38, and the anode contact electrodes 50. The dielectric liner layer 60 laterally surrounds, and contacts the sidewalls of, the pedestal structures 160, and physically exposed planar surfaces of the support substrate 22. The dielectric liner layer 60 includes a transparent dielectric material such as silicon oxide, silicon nitride, a dielectric metal oxide (such as aluminum oxide), organosilicate glass, or porous variants thereof. The dielectric liner layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition).

The dielectric liner layer 60 can be formed over each mesa structure, and encapsulates each mesa structure in combination with the support substrate 22. In one embodiment, the dielectric liner layer 60 can be formed as a conformal material layer, i.e., a layer having a uniform thickness throughout. The thickness of the dielectric liner layer 60 can be in a range from 100 nm to 4 microns, such as from 200 nm to 2 microns, although lesser and greater thicknesses can also be employed.

Figure 8:
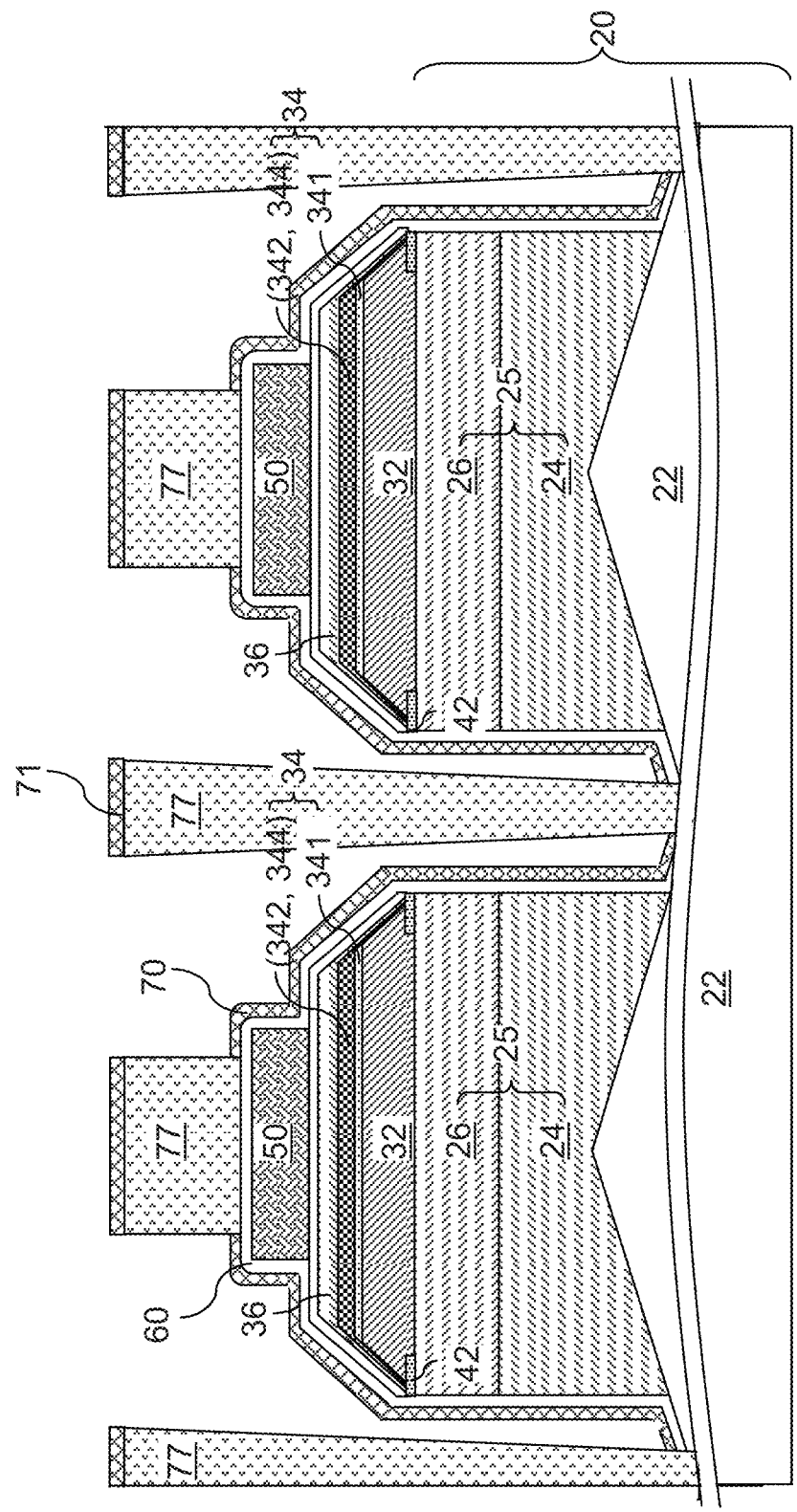
FIG. 8 is a vertical cross-sectional view of the first exemplary structure after formation of a patterned photoresist layer and deposition of a metallic material to form reflector layers according to the first embodiment of the present disclosure.

Referring to FIG. 8, a patterned liftoff mask 77 can be applied over the first exemplary structure. For example, the patterned liftoff mask 77 can be a patterned photoresist layer, which can be applied over the first exemplary structure and lithographically patterned to cover a center portion of each pedestal structure 160, while physically exposing an entire periphery of each pedestal structure 160. Portions of the planar surface of the support substrate 22 located between a neighboring pair of pedestal structures 160 can be covered with the patterned liftoff mask 77. In one embodiment, the uncovered areas of the first exemplary structure can include annular regions located at a periphery of each pedestal structure 160. The annular regions can be laterally spaced from one another by remaining portions of the patterned liftoff mask 77 that cover underlying portions of the support substrate 22. In one embodiment, the sidewalls of the patterned liftoff mask 77 can have a retro-taper to minimize deposition of a metallic material in a subsequent metallic material deposition process.

An optically reflective material can be deposited over the dielectric liner layer 60 in regions that are not covered with the patterned liftoff mask 77. The optically reflective material can be deposited by a direction deposition method such as vacuum evaporation or physical vapor deposition. Each portion of the optically reflective material that is deposited directly on the dielectric liner layer 60 constitutes a reflector layer 70, which can be topologically homeomorphic to a ring. In one embodiment, each reflector layer 70 includes a reflective material such as a metal. In one embodiment, each reflector layer 70 includes at least one material selected from silver, aluminum, copper, and gold. In one embodiment, the optically reflective material can be a thin film distributed Bragg reflector (DBR) with small index changes to provide better reflectivity. The optically reflective material can include at least one conductive material and/or at least one electrically insulating material.

Optically reflective material portions 71 are formed on the planar surfaces of the patterned portions of the photoresist layer. The thickness of horizontal portions of the reflector layer 70 can be in a range from 5 nm to 500 nm, such as from 10 nm to 250 nm, although lesser and greater thicknesses can also be employed. The patterned liftoff mask 77 can be removed with the optically reflective material portions 71. The remaining portions of the deposited optically reflective material constitute the reflector layers 70. For example, the remaining portions of the patterned liftoff mask 77 and the optically reflective material portions 71 thereupon can be lifted off the first exemplary structure, for example, by dissolving the patterned liftoff mask 77 in a solvent.

Figure 9:
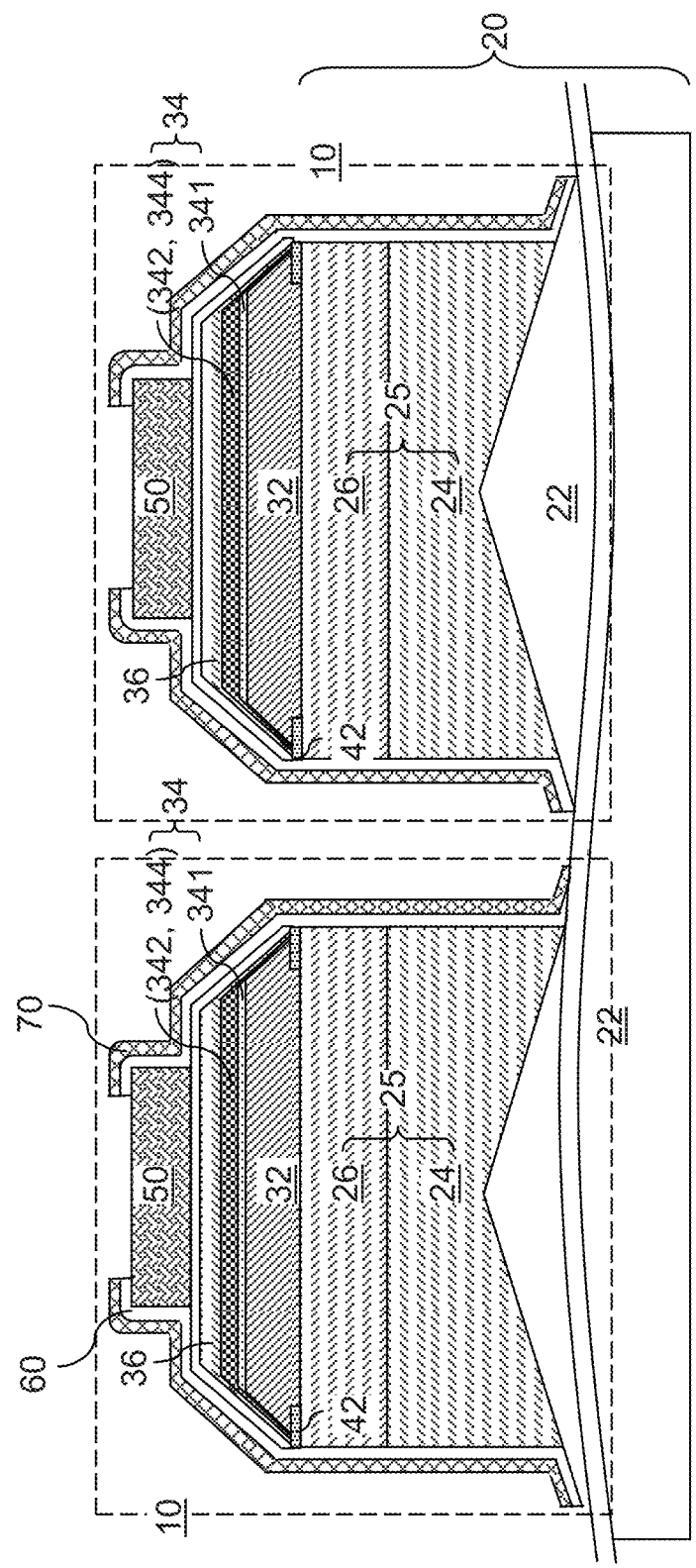
FIG. 9 is a vertical cross-sectional view of the first exemplary structure after lifting off the photoresist layer and etching portions of the dielectric liner layer that are not masked by the reflector layers according to the first embodiment of the present disclosure.

Referring to FIG. 9, an etch process can be performed to etch unmasked portions of the dielectric liner layer 60. The etch process may be an anisotropic etch process or an isotropic etch process. Portions of the dielectric liner layer 60 that are not masked by the reflector layers 70 are removed by the etch process. The planar surface of each anode contact electrode 50 and the planar surface of the support substrate 220 are physically exposed in each area that is not covered with the reflector layers 70. A light emitting diode (LED) 10 is provided, which includes a mesa structure, a dielectric liner layer 60, and a reflector layer 70 having an annular configuration. The planar surface of the anode contact electrode 50 is physically exposed within a hole in the reflector layer 70, and within a hole in the dielectric liner layer 60. Each LED 10 can be subsequently employed as a sub-pixel in a display device.

Figure 10:
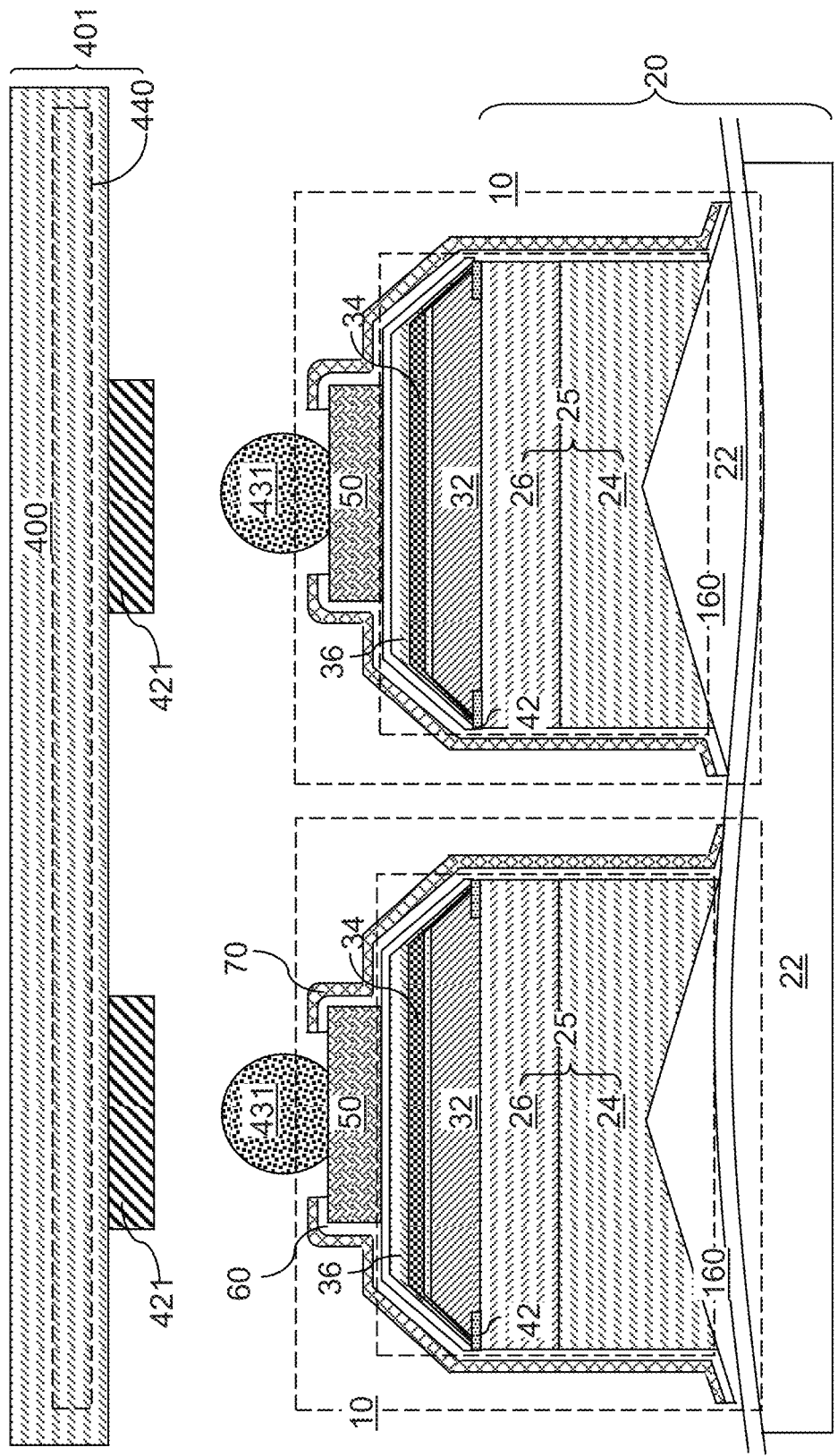
FIG. 10 is a vertical cross-sectional view of the first exemplary structure after bonding a conductive bonding structure to each subpixel according to the first embodiment of the present disclosure.

Referring to FIG. 10, a conductive bonding structure 431 is formed over on each LED 10. In one embodiment, the conductive bonding structures 431 can be formed directly on the at least one metallic barrier layer, which can be a topmost layer of an anode contact electrode 50. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material. The conductive bonding structures 431 before or after forming the moat trenches 89.

A backplane 401 is provided, which includes a backplane substrate 400 and bonding structures 421 located thereupon. A backplane can be an active or passive matrix backplane substrate for driving light emitting devices. As used herein, a "backplane substrate" refers to any substrate configured to affix multiple devices thereupon. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid. In some embodiments, active device circuits (such as field effect transistors) may not be present in the backplane substrate 400. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprise one or more transistors.

The backplane substrate 400 is disposed facing the substrate 20 (e.g., above, below or side-to-side) and aligned such that the conductive bonding structures 431 face, and contact, a respective one of the bonding structures 421. At least one of the LEDs 10 (i.e., at least one subpixel 10G, 10B or 10R) can be attached to the backplane 401 by inducing bonding between a respective pair of a conductive bonding structure 432 and a bonding structure 421 (which may be a bonding pad) on the backplane 401. Local heating (for example, by laser irradiation) of the respective pair of the conductive bonding structure 432 and the bonding structure 421 can be employed to induce reflow and bonding of the solder material. All, or only a subset, of the LEDs 10 on the substrate 20 can be bonded to the backplane 401, as will be described in more detail below with respect to FIGS. 16A to 16P. In one embodiment, each LED 10 die is subpixel (10B, 10G or 10R) that emits light of a given color, which may be, for example, blue, green, or red.

In a second embodiment of the present disclosure, each subpixel has several openings in the growth mask layers containing several epitaxial mesa portions. This provides a redundant sub-pixel design in case of a defective LED being formed on one of the plural epitaxial mesa portions. The plural epitaxial mesa portions in each sub-pixel are surrounded by the isolation regions located over the growth mask. Thus, each subpixel area includes isolation regions 33. In other words, each subpixel 44 can include several epitaxial semiconductor structures 32 separated by isolation regions 33. For example, a four micron wide by four micron long subpixel 44 can include four epitaxial semiconductor structures 32 arranged in a 2×2 configuration and having a size of slightly less than 1 micron square (to account for the space taken up by the isolation regions 33).

Figure 11A:
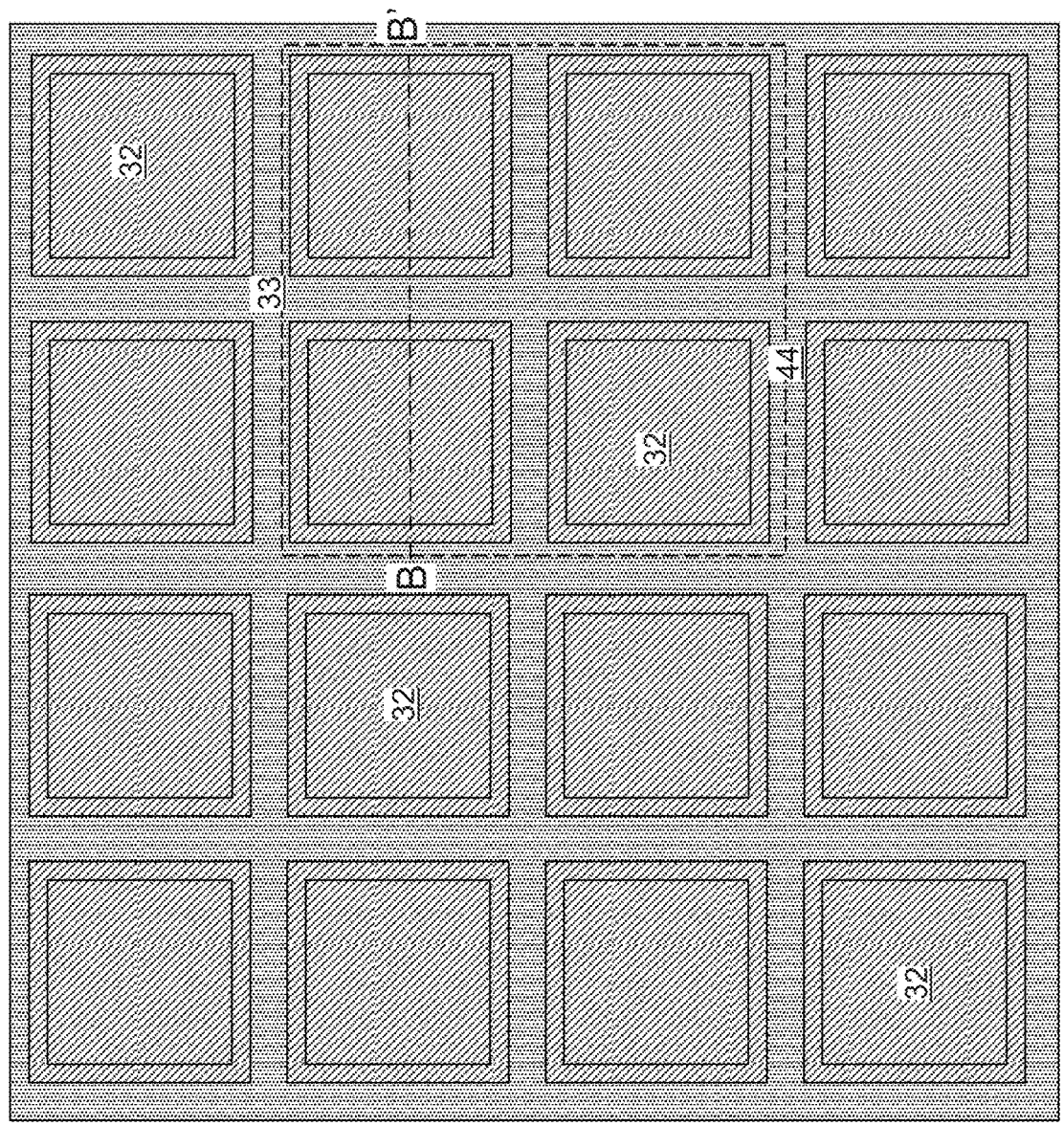
FIG. 11A is a plan view of a second exemplary structure after formation of epitaxial semiconductor structures according to a second embodiment of the present disclosure.
Figure 11B:
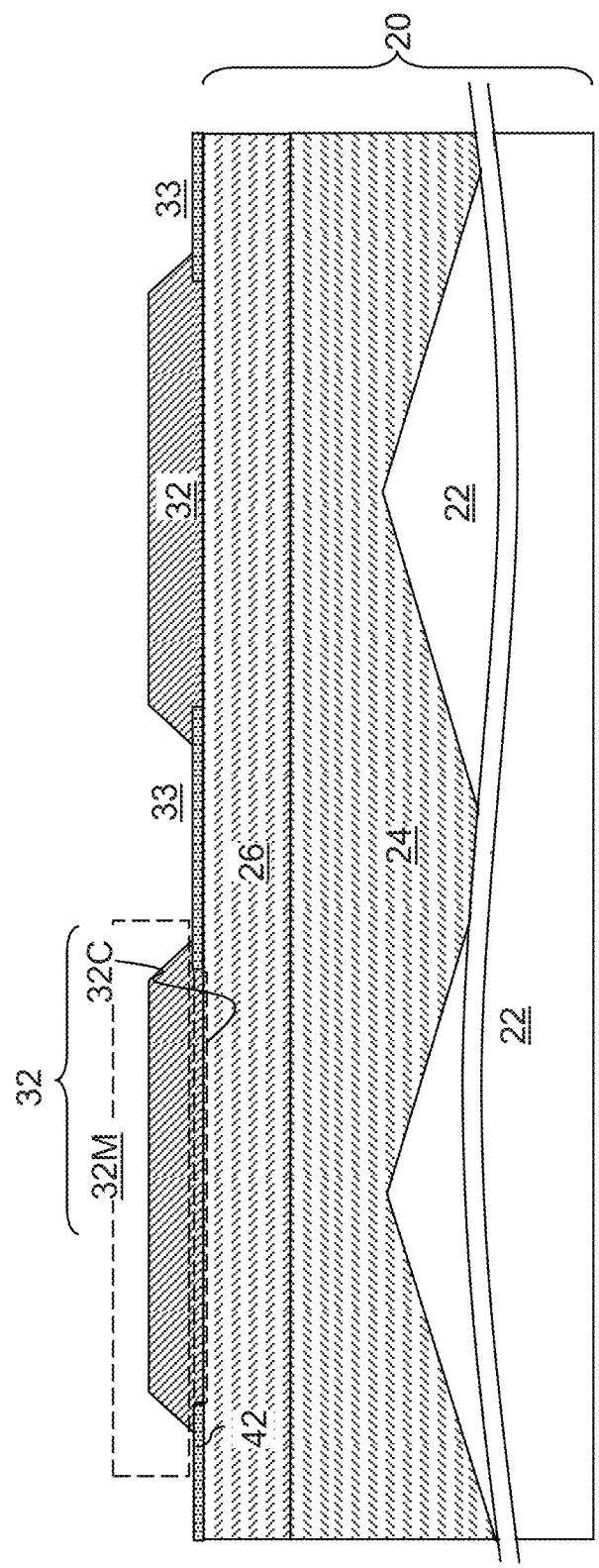
FIG. 11B is a vertical cross-sectional view of the second exemplary structure along the plane B-B' of FIG. 11A.

Referring to FIGS. 11A and 11B, a second exemplary structure according to the second embodiment of the present disclosure can be derived from the first exemplary structure of FIGS. 3A and 3B by modifying the pattern of the openings 43 through the growth mask layer 42 such that a subpixel area 44 includes a plurality of openings 43 in the growth mask layer 42. In this case, the size of each opening 43 can be adjusted so that the combined areas of the openings 43 within each subpixel area 44 are employed to form a plurality of epitaxial semiconductor structures 32. Each subpixel area 44 can include the same number of epitaxial semiconductor structures 32 as the number of openings 43 within the subpixel area 44.

In this case, each subpixel area 44 includes a set of multiple openings 43 through the growth mask layer 42. In one embodiment, the sets of multiple openings 43 can be arranged as a periodic two-dimensional array. A unit cell of the periodic two-dimensional array includes a set of multiple openings 43, which may be two, three, four, five, six, or more number of openings 43. The area of each opening may be correspondingly reduced such that each subpixel area 44 of the second embodiment has a same total area as a subpixel area 44 of the first exemplary structure. While a periodic rectangular two-dimensional array is illustrated for the openings 43, embodiments in which the two-dimensional array is not periodic or have a different type of periodicity (such as the periodicity within a hexagonal array) are expressly contemplated herein.

Figure 12:
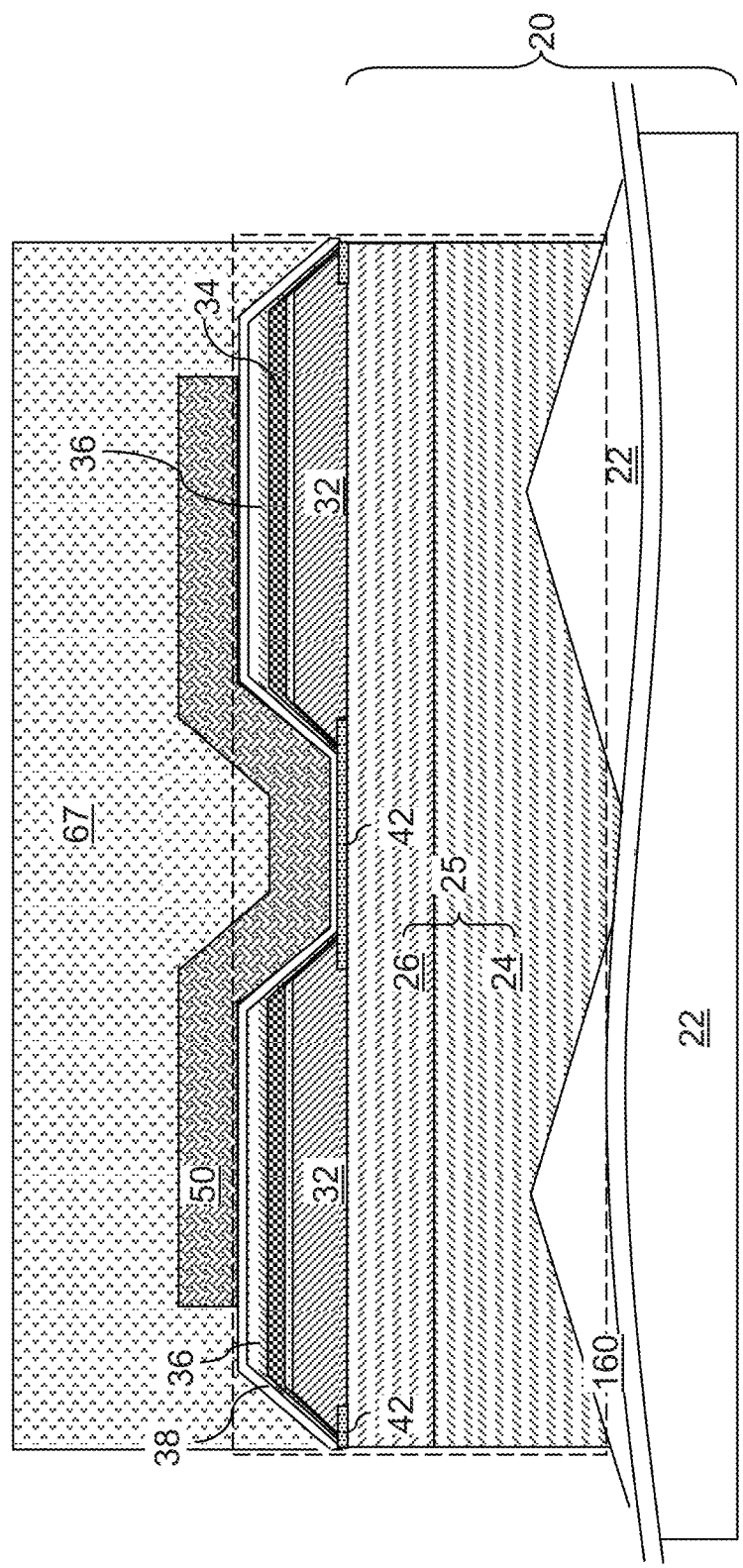
FIG. 12 is a vertical cross-sectional view of the second exemplary structure after formation of pedestal structures by patterning the doped compound semiconductor layer and the optional buffer layer according to the second embodiment of the present disclosure.

Referring to FIG. 12, the processing steps of 4A and 4B can be subsequently performed to form active regions 34 and the second conductivity type semiconductor material layers 36 in the same manner as in the first embodiment. The processing steps of FIG. 5A, FIG. 5B, or FIG. 5C can be performed to form anode contact electrodes 50 employing the same processing steps as in the first embodiment, but with a modification to the pattern of the photoresist layer 57. Specifically, the pattern of the photoresist layer 57 can be modified such that each anode contact electrode 50 is formed within a respective subpixel area 44. Thus, each anode contact electrode 50 may overlie areas of a plurality of active regions 34 within a same subpixel area 44.

Subsequently, a photoresist layer 67 can be applied over each anode contact electrode 50 and the transparent conductive layer 38, and can be lithographically patterned to cover an entire area of each sub-pixel to be subsequently formed. Each patterned portion of the photoresist layer 67 can cover the entire area of an underlying anode contact electrode 50. An anisotropic etch process can be performed to sequentially etch unmasked portions of the transparent conductive layer 38, the patterned growth mask layer 42, the doped compound semiconductor layer 26, and the buffer layer 24 employing the photoresist layer as an etch mask. The support substrate 22 can be employed as an etch stop structure. A continuous set of patterned portions of the doped compound semiconductor layer and the buffer layer 24 is herein referred to as a mesa base semiconductor portion 25, which constitutes a base portion of a mesa structure.

The photoresist layer 67 can be employed as a patterned etch mask layer for the anisotropic etch process. Generally, any patterned etch mask layer may be employed instead of the photoresist layer 67. The photoresist layer 67 (or any patterned etch mask layer) includes a plurality of discrete etch mask portions, each of which can cover a respective single subpixel area 44. In one embodiment, each of the plurality of discrete etch mask portions (such as discrete portions of the patterned photoresist layer 67) covers a respective plurality of active regions 34. The photoresist layer 67 (or any other patterned etch mask layer) covers each of the plurality of active regions 34. In one embodiment, each subpixel area 44 can include a respective number of the plurality of active regions 35 that is greater than 1 and less than 65. In this case, each of the plurality of discrete etch mask portions (such as a patterned portion of the photoresist layer 67) covers a respective number of the plurality of active regions that is greater than 1 and less than 65.

Portions of the doped compound semiconductor layer 26 that are not covered by the patterned etch mask layer are anisotropically etched. Each sidewall of the photoresist layer 67 (or any other patterned etch mask layer) can be located entirely outside areas of the plurality of active regions 34. In this case, the active region 34 are not etched during the anisotropic etch process. The doped compound semiconductor layer 26 is patterned into patterned discrete portions by the anisotropic etch process.

Each contiguous set of remaining portions of the transparent conductive layer 38, the second conductivity type semiconductor material layer 36, the semiconductor structures 32, the active regions 34, the patterned growth mask layer 42, the doped compound semiconductor layer 26, and the buffer layer 24 collectively constitute a pedestal structure 160. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each pedestal structure 160. Sidewalls of the semiconductor structures 32, if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same pedestal structure 160. The photoresist layer 67 is subsequently removed, for example, by ashing.

Figure 13:
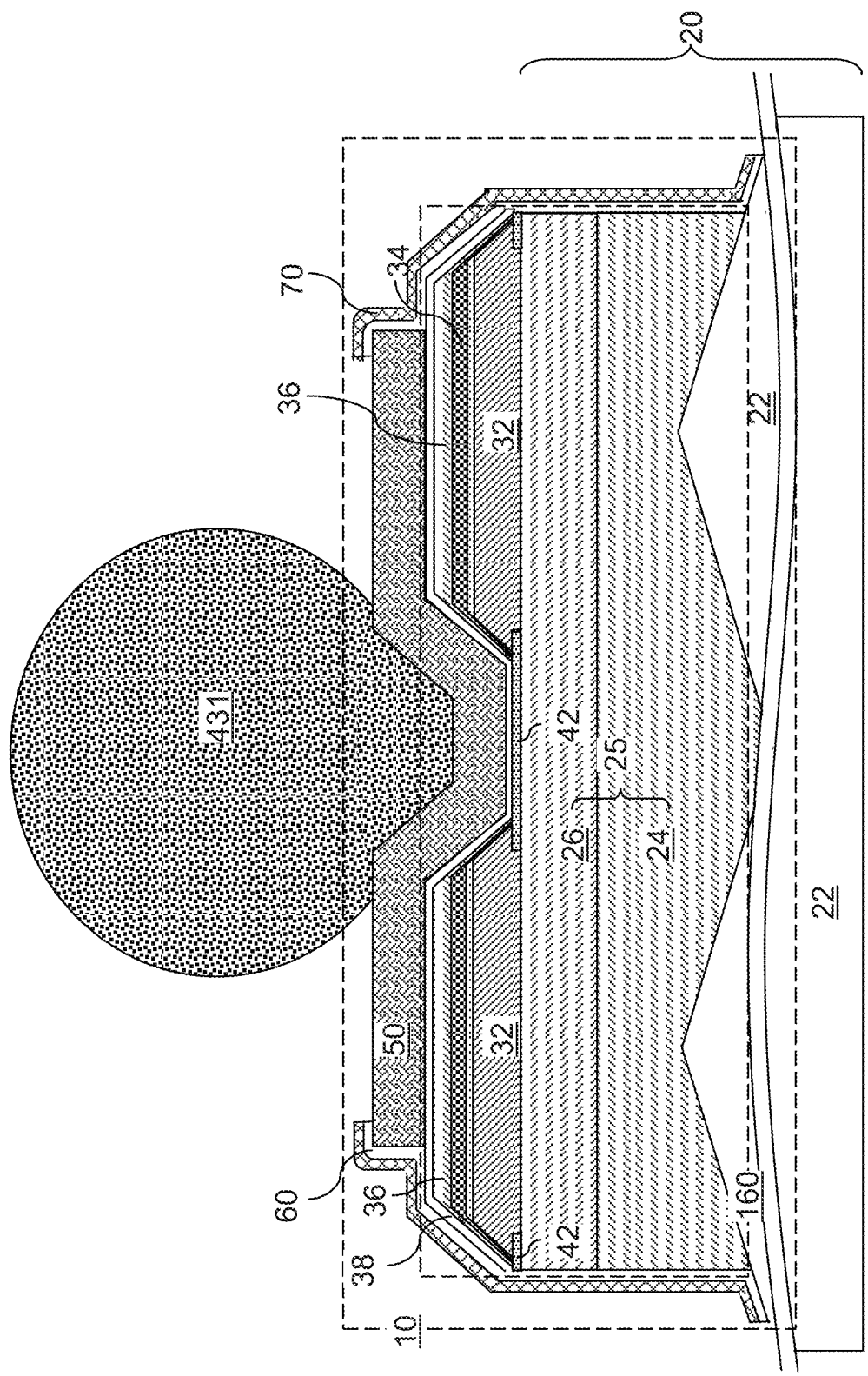
FIG. 13 is a vertical cross-sectional view of the second exemplary structure after formation of a dielectric liner layer, a reflector layer, an opening through the dielectric liner layer, and a conductive bonding structure to each subpixel according to the second embodiment of the present disclosure.

Referring to FIG. 13, the processing steps of FIGS. 7, 8, and 9 can be performed to form a dielectric liner layer 60, a reflector layer 70, and opening through the dielectric liner layer 60, and a conductive bonding structure 431 that is bonded to an anode contact electrode 50 for each of the pedestal structures 160. An array of LEDs 10 with conductive bonding structures 431 thereupon is formed on the support substrate 22. Each LED 10 can include the same number of epitaxial semiconductor structures 32, active regions 34, and second conductivity type semiconductor material layers 36, and a single anode contact electrode 50.

Figure 14B:
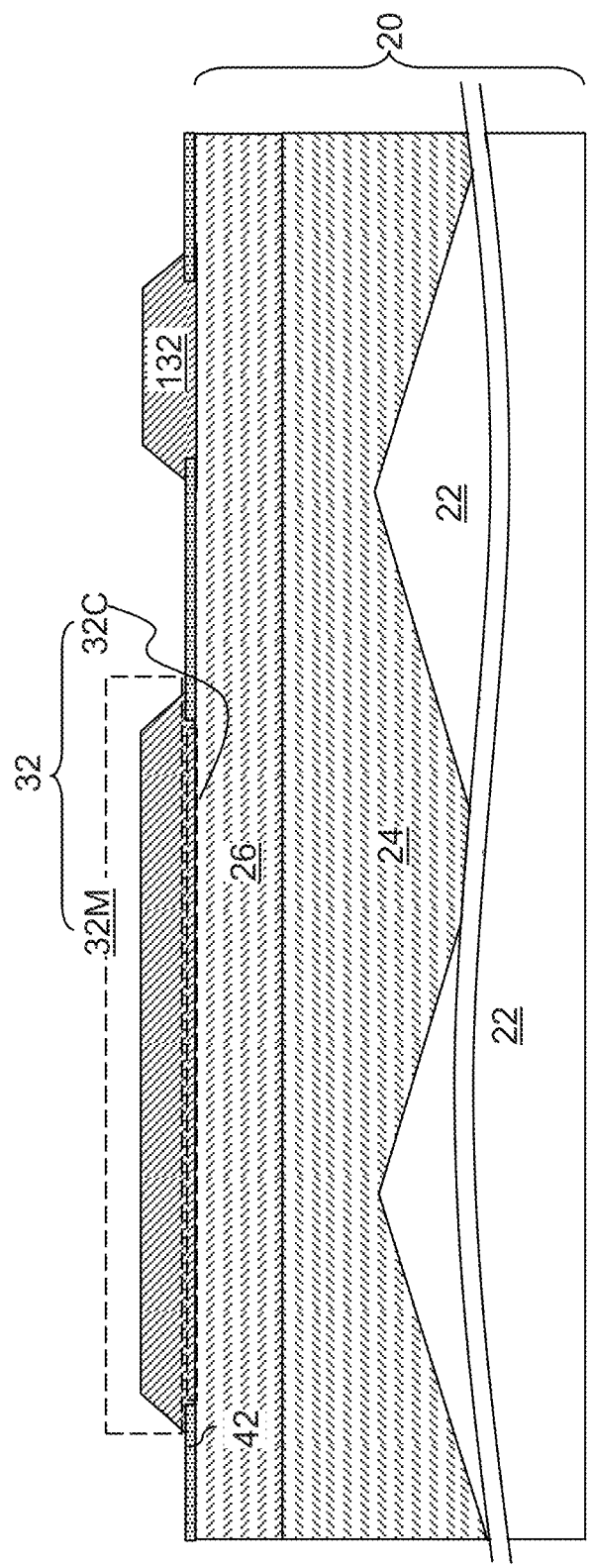
FIG. 14B is a vertical cross-sectional view of the third exemplary structure along the plane B-B' of FIG. 14A.

Referring to FIGS. 14A and 14B, a third exemplary structure according to a third embodiment of the present disclosure can be derived from the first exemplary structure of FIGS. 3A and 3B by modifying the pattern of the openings 43 through the growth mask layer 42. Specifically, a grid of interconnected openings can be formed in addition to a two-dimensional array of discrete openings 43. In other words, a two-dimensional array of openings 43 can be formed as in the first or second embodiment so that portions of the planar surface of the doped compound semiconductor layer 26 are physically exposed to enable subsequent formation of epitaxial semiconductor structures 32 thereupon. In addition, additional portions of the planar surface of the doped compound semiconductor layer 26 are physically exposed as interconnected channels between each neighboring pair of openings 43 to form the grid of interconnected openings. In this case, the grid of interconnected openings laterally surrounds each discrete opening 43 within the two-dimensional array of discrete openings 43, and each discrete opening 43 is laterally spaced from the grid of interconnected openings by a discrete annular portion of the growth mask layer 42.

In case the array of discrete openings 43 is formed as a rectangular array, the grid of interconnected opening can include areas of first street openings S1 that laterally extend along a first horizontal direction hd1 and areas of second street openings S2 that laterally extend along a second horizontal direction hd2 and connected to the first street openings S1 at each intersection area. Each of the discrete openings 43 in the two-dimensional rectangular array is located between a respective neighboring pair of first street openings S1 and between a respective pair of second street openings S2. In case the array of discrete openings 43 is formed as a hexagonal array or a triangular array, the grid of interconnected openings can be accordingly modified such that the grid of interconnected openings laterally surrounds each discrete opening 43 within the two-dimensional array of discrete openings 43, and each discrete opening 43 is laterally spaced from the grid of interconnected openings by a discrete annular portion of the growth mask layer 42. The width of each street opening (S1, S2) can be on the order of about 0.2-2 times the maximum dimension of each discrete opening 43, although lesser and greater widths can also be employed.

Subsequently, the selective area growth process of FIGS. 3A and 3B can be performed to grown an epitaxial semiconductor structure 32 from each of the discrete openings 43 through the growth mask layer 42. An epitaxial street grid 132 cam be collaterally grown from the areas of the grid of interconnected openings concurrently with selective growth of the epitaxial semiconductor structures 32. The exposure of the planar surface of the doped compound semiconductor layer 26 between each neighboring pair of discrete openings 43 has an effect of alleviating differential growth rates between the center of each opening 43 and peripheral portions of each opening 43 by providing additional growth area near the peripheral portions of the openings 43. Thus, faster growth of the doped epitaxial compound semiconductor material at the peripheral portions of the openings 43 is suppressed, and each epitaxial semiconductor structure 32 can develop a respective crystallographic c-plane as a horizontal planar surface. In other words, formation of the epitaxial street grid 132 reduces depletive effects during formation of the epitaxial semiconductor structures 32, and helps formation of a planar crystallographic c-plane for each of the epitaxial semiconductor structures 32.

Figure 15B:
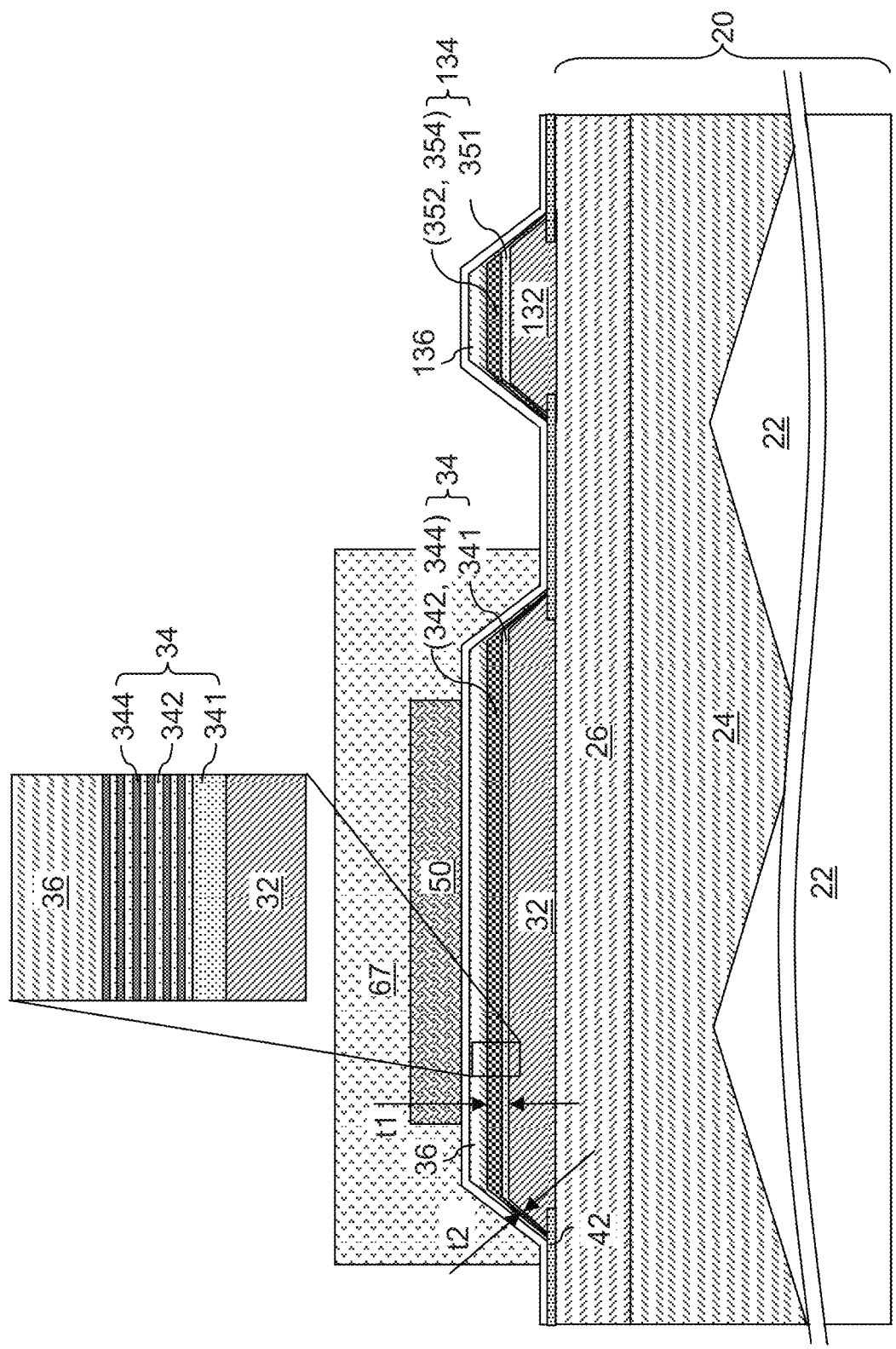
FIG. 15B is a vertical cross-sectional view of the third exemplary structure along the plane B-B' of FIG. 15A.

Referring to FIGS. 15A and 15B, the processing steps of 4A and 4B can be subsequently performed to form active regions 34 and the second conductivity type semiconductor material layers 36 in the same manner as in the first embodiment. An active material street grid 134 including the same material stack as an active region 34 can be formed on the epitaxial street grid 132. For example, the active material street grid 134 can include an epitaxial strain modulation material portion 351 including the same material as an epitaxial strain modulation layer 341, first band gap semiconductor material portions 352 including the same material as the first band gap semiconductor layers 342, and second band gap semiconductor material portions 354 including the same material as the second band gap semiconductor material layers 344. A second conductivity type street grid 136 can be formed on the active material street grid 134 concurrently with formation of the second conductivity type semiconductor material layers 36.

The processing steps of FIG. 5A. 5B, or SC can be performed to form a transparent conductive layer 38 in the same manner as in the first embodiment. Anode contact electrodes 50 can be formed over each active region 34 employing the same processing steps as in the first embodiment. A photoresist layer 57 can be applied and patterned so that each patterned portion of the photoresist layer 57 covers a respective subpixel area 44. The areas of the second conductivity type street grid 136, the active material street grid 134, and the epitaxial street grid 132. Each patterned portion of the photoresist layer 67 can cover the entire area of an underlying anode contact electrode 50. An anisotropic etch process can be performed to sequentially etch unmasked portions of the transparent conductive layer 38, the patterned growth mask layer 42, the doped compound semiconductor layer 26, and the buffer layer 24 employing the photoresist layer as an etch mask. The patterned photoresist layer 67 does not cover any portion of the second conductivity type street grid 136, the active material street grid 134, and the epitaxial street grid 132, and thus, the entirety of the second conductivity type street grid 136, the active material street grid 134, and the epitaxial street grid 132 is removed during the anisotropic etch process. The support substrate 22 can be employed as an etch stop structure.

The photoresist layer 67 can be employed as a patterned etch mask layer for the anisotropic etch process. Generally, any patterned etch mask layer may be employed instead of the photoresist layer 67. The photoresist layer 67 (or any patterned etch mask layer) includes a plurality of discrete etch mask portions, each of which can cover a respective single subpixel area 44. In one embodiment, each of the plurality of discrete etch mask portions (such as discrete portions of the patterned photoresist layer 67) covers a respective plurality of active regions 34. The photoresist layer 67 (or any other patterned etch mask layer) covers each of the plurality of active regions 34.

Portions of the doped compound semiconductor layer 26 that are not covered by the patterned etch mask layer are anisotropically etched. Each sidewall of the photoresist layer 67 (or any other patterned etch mask layer) can be located entirely outside areas of the plurality of active regions 34. In this case, the active region 34 are not etched during the anisotropic etch process. The doped compound semiconductor layer 26 is patterned into patterned discrete portions by the anisotropic etch process.

Each contiguous set of remaining portions of the transparent conductive layer 38, the second conductivity type semiconductor material layer 36, the semiconductor structures 32, the active regions 34, the patterned growth mask layer 42, the doped compound semiconductor layer 26, and the buffer layer 24 collectively constitute a pedestal structure 160 as in the first embodiment. The sidewalls of the transparent conductive layer 38, the second conductivity type semiconductor material layer 36, the patterned growth mask layer 42, the doped compound semiconductor layer 26, and the buffer layer 24 can be vertically coincident (i.e., located within a same vertical plane) for each pedestal structure 160. Sidewalls of the semiconductor structures 32, if physically exposed, can be vertically coincident with the sidewalls of the transparent conductive layer 38, the second conductivity type semiconductor material layer 36, the patterned growth mask layer 42, the doped compound semiconductor layer 26, and the buffer layer 24 in a same pedestal structure 160. The photoresist layer 67 is subsequently removed, for example, by ashing.

Subsequently, the processing steps of FIGS. 6-10 can be sequentially performed as in the first embodiment.

Figure 16A:
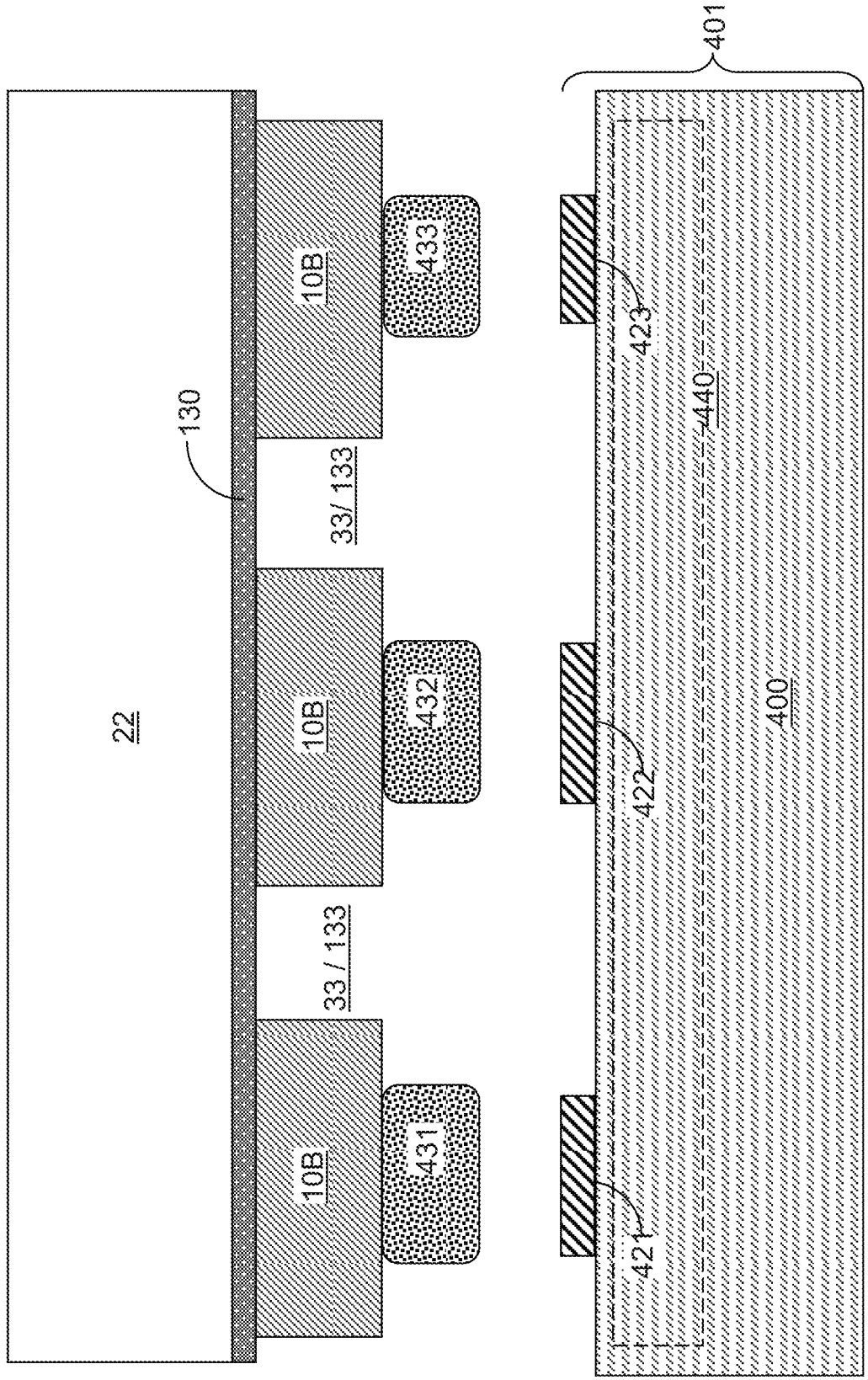
FIGS. 16A to 16P are schematic vertical cross-sectional views of steps in a method of incorporating LEDs into a display panel according to an embodiment of the present disclosure.

Each LED 10 die is subpixel (10B, 10G or 10R) that emits light of a given color, which may be, for example, blue, green, or red. FIGS. 16A-16P illustrate a method of incorporating the LEDs 10, such as a blue, green and/or red light emitting subpixels (10B, 10G, 10R) into a single pixel of direct view display from different growth substrates 20 shown in FIG. 1B. The LEDs 10 can be the epitaxial semiconductor structure LEDs described above, different epitaxial semiconductor structure LEDs and/or bulk (i.e., planar) LEDs. Each of the pixels comprises a red-light emitting diode 10R configured to emit light at a peak wavelength in a range from 620 nm to 750 nm, a green-light emitting diode 10G configured to emit light at a peak wavelength in a range from 495 nm to 570 nm, and a blue-light emitting diode 10B configured to emit light at a peak wavelength in a range from 450 to 495 nm. The LED die 10 on the same substrate 20 (which comprise respective subpixels of a direct view display device) can be separated from each other by isolation regions 33 and/or by the isolation trenches 133 described above.

Referring to FIG. 16A, an in-process structure is illustrated, which can be employed to form an exemplary light emitting device assembly (e.g., direct view display) according to an embodiment of the present disclosure. In this embodiment, the backplane substrate 400 may have a substantially planar (i.e., not stepped) upper surface or a stepped upper surface. The bond pads (421, 422, 423) can have the same height or different heights. The conductive bonding structures (431, 432, 433) can have the same height or different heights. The exemplary light emitting device assembly can include the same thickness bonding pads (421, 422, 423) for the respective first, second and third LEDs (10B, 10G, 10R) and the same height for the conductive bonding structures (431, 432, 433). The bond pads (421, 422, 423) can have the same or different composition as each other. The conductive bonding structures (431, 432, 433) can have the same or different composition as each other.

In one embodiment, the conductive bonding structures (431, 432, 433) can be formed on the LEDs 10 to be transferred to the backplane 401. For example, first light emitting diodes 10B can be the first devices to be transferred to the backplane substrate 400. The first light emitting diodes 10B can be located on first support substrate 22, which can be a first transfer substrate or a first-type growth substrate. The conductive bonding structures 431 are formed on a first subset of the first light emitting diodes 10B, for example as described above and include the conductive bonding structure 431. The second conductive bonding structures 432 are formed on a second subset of the first light emitting diodes 10B and the third conductive bonding structures 433 are formed on a third subset of the first light emitting diodes 10B.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 0.25 microns to 100 microns (such as from 0.5 microns to 1 micron), although lesser and greater maximum horizontal dimensions can also be employed.

Referring to FIG. 16B, the backplane 401 and the assembly including the first light emitting diodes 10B are positioned such that each conductive bonding structure 431 is attached to one first LED 10B, and contacts the respective bonding pad 421. Each second conductive bonding structure 432 can be attached to the another first LED 10B and contacts the second bonding pad 422. Each third conductive bonding structure 433 is attached to yet another first LED 10R and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first LEDs 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first LED 10B and to an underlying first bonding pad 421. Preferably, the laser beam is provided through the support substrate 22. The laser beam may be transmitted through the support substrate 22 and through the devices to the conductive reflector layer 82 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Figure 16C:
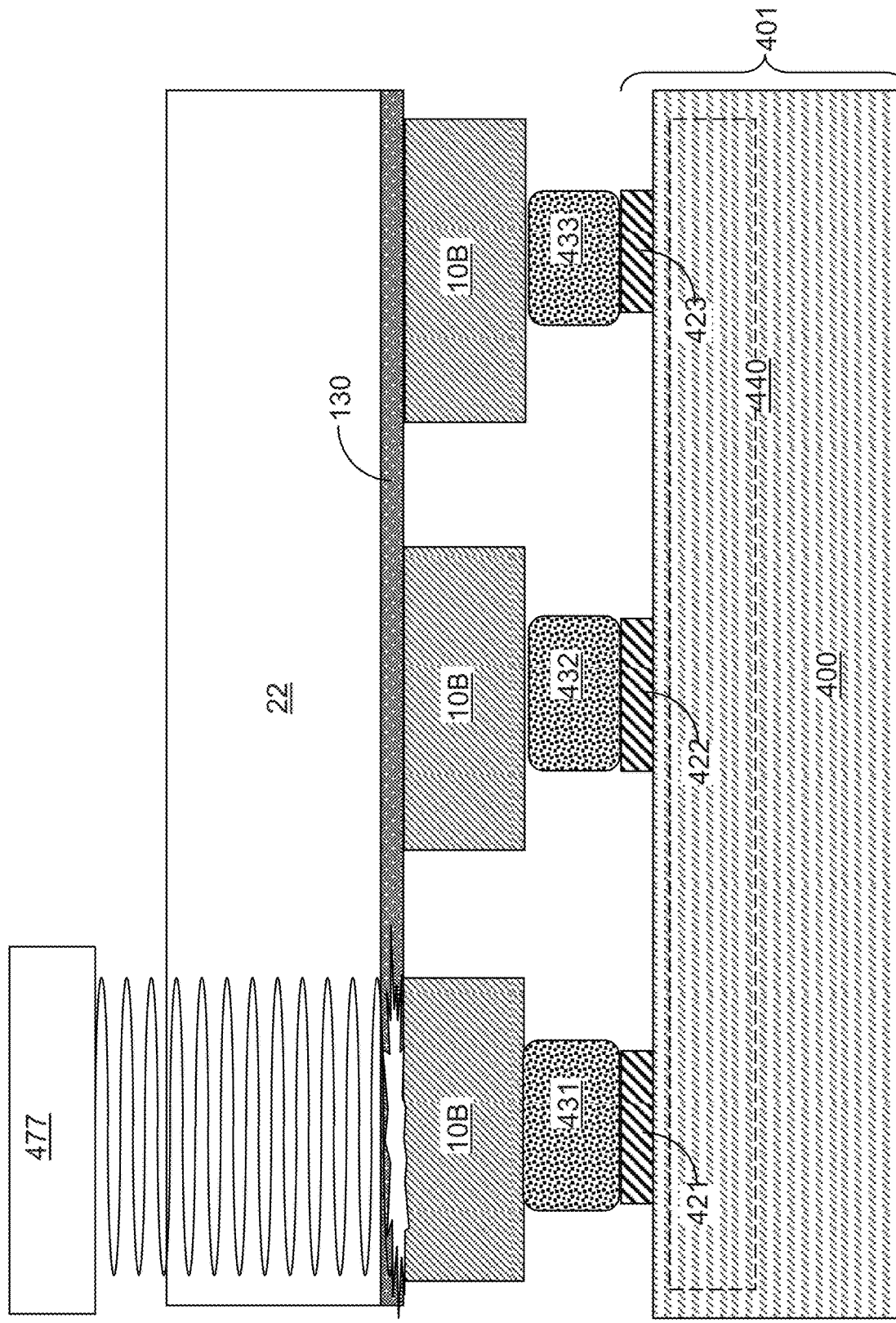

Referring to FIG. 16C, a laser irradiation process is performed to separate each bonded first LED 10B from the first support substrate. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes 10B). The ablation material layer 130 may comprise the semiconductor buffer layer 24 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first LED 10B.

Figure 16D:
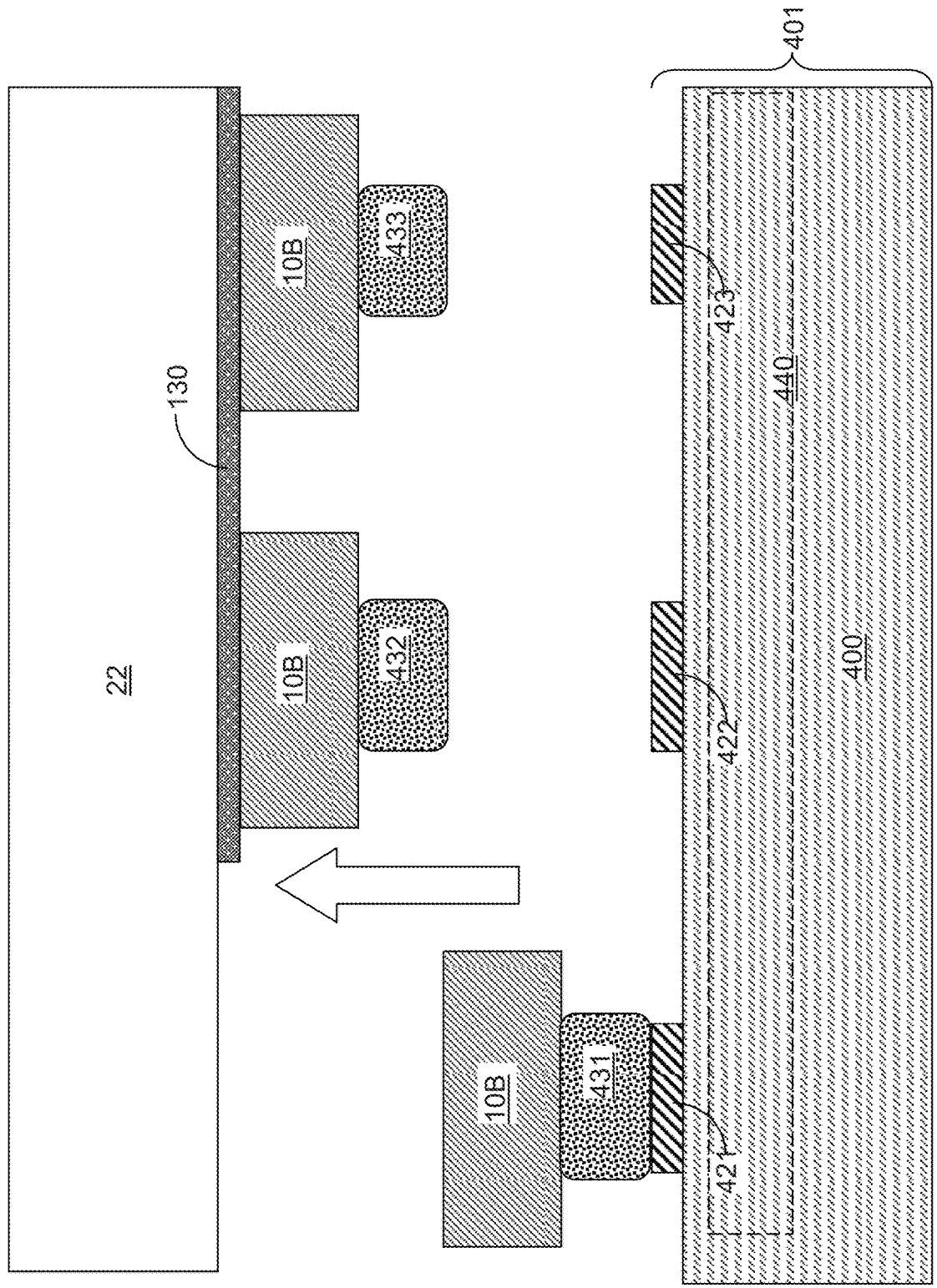

Referring to FIG. 16D, the assembly of the first support substrate 22 and attached first light emitting diodes 10B (i.e., the complement of the first subset of the first light emitting diodes 10B) is separated from the backplane 401 and the first subset of the first light emitting diodes 10B.

Figure 16E:
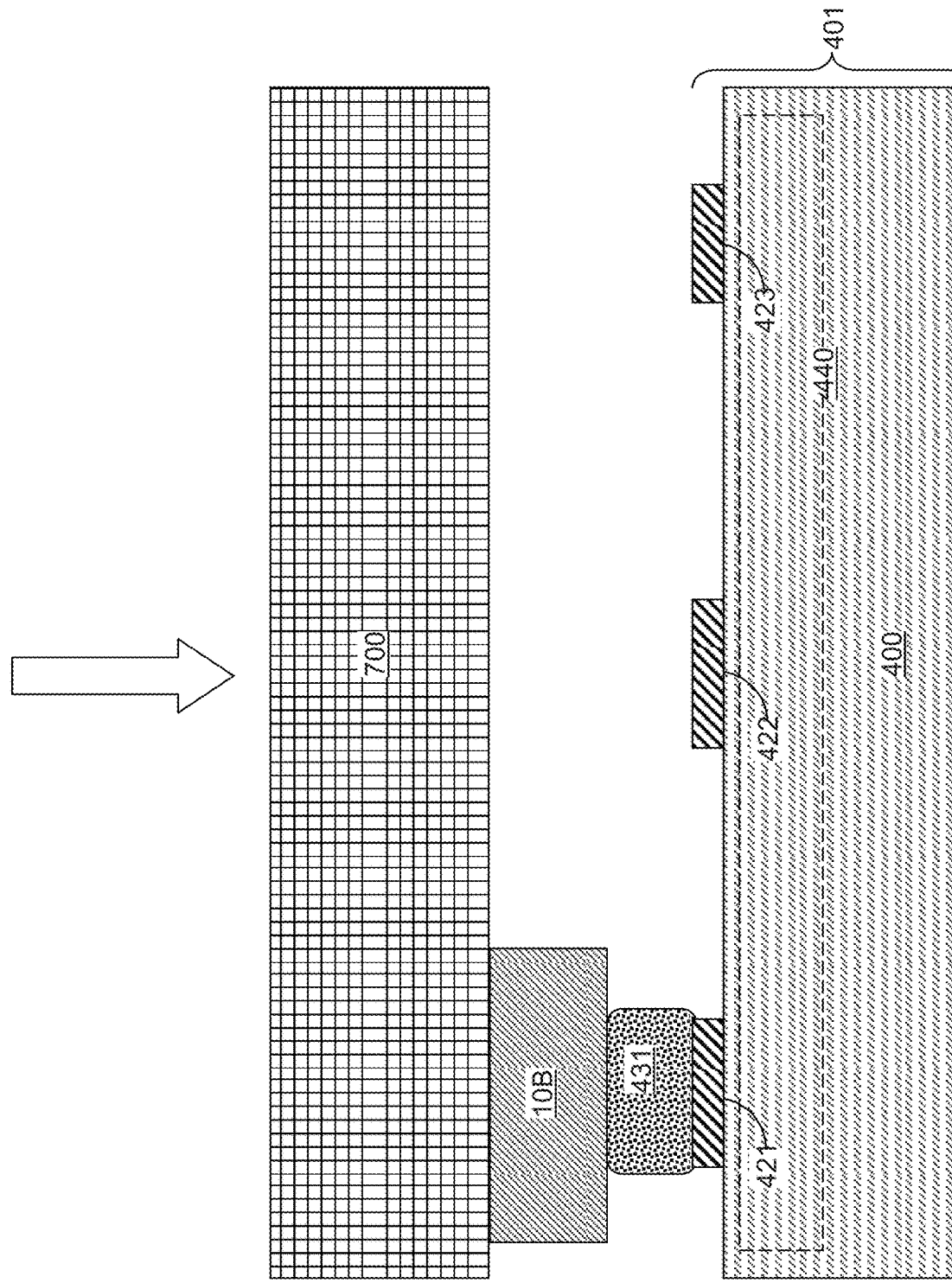

Referring to FIG. 16E, a dummy substrate 700 can employed to push the first light emitting diodes 10B on the first conductive bonding structures 431 toward the backplane 401 while optionally thermally reflowing the first conductive bonding structures 431. The compressible first conductive bonding structures can be compressed by 5 to 20% of their thickness during this step.

Figure 16F:
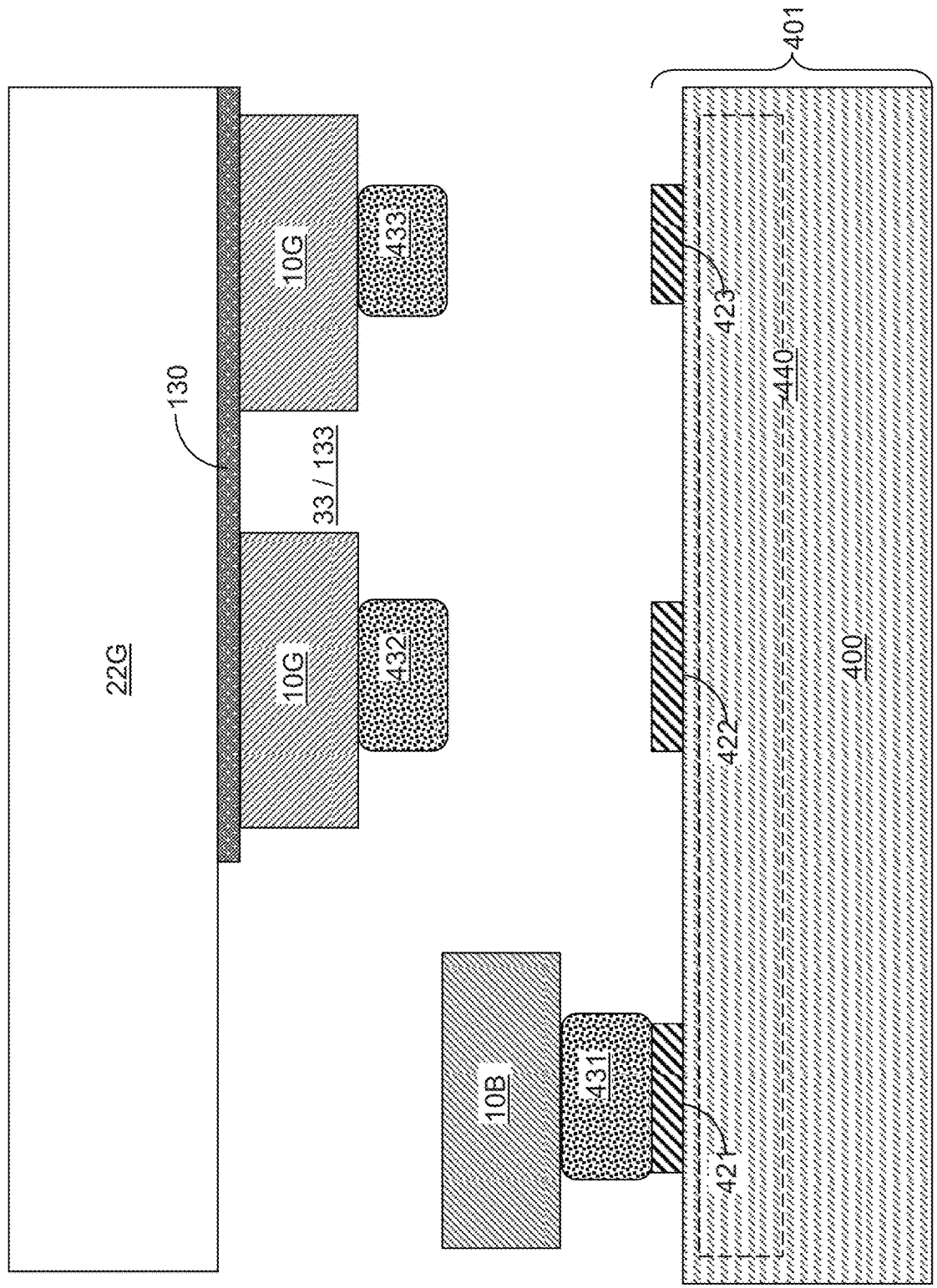

Referring to FIG. 16F, a second support substrate (such as a second growth or transfer substrate) 22G from which a first subset of second LEDs 10G are removed is positioned over the in-process exemplary light emitting device assembly, and is aligned such that a second subset of the second light emitting diodes 10G overlies the second bonding pads 422.

Figure 16G:
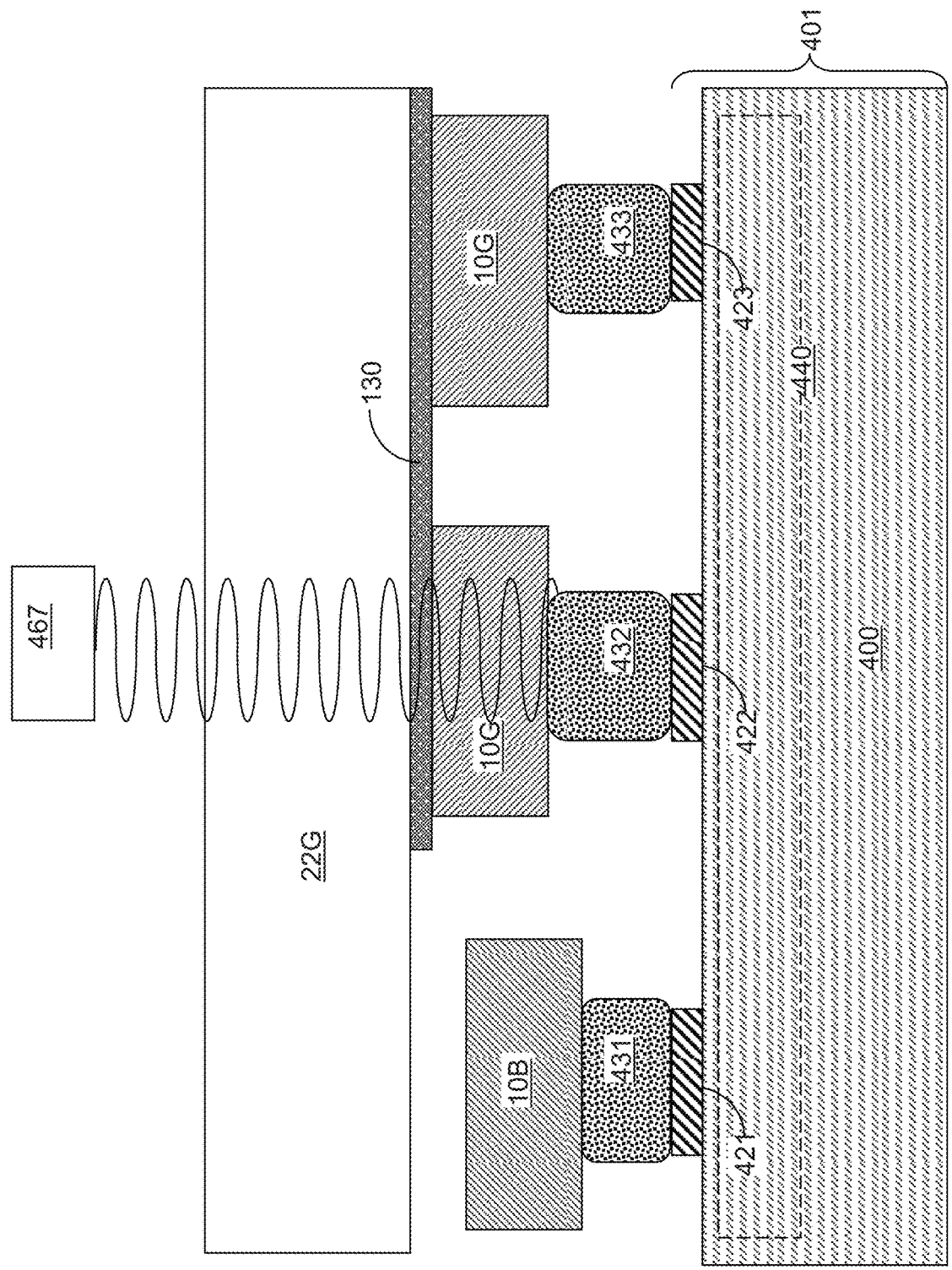

Referring to FIG. 16G, the backplane 401 and the assembly including the second light emitting diodes 10G are positioned such that each second conductive bonding structure 432 is attached to the second LED 10G and contacts the second bonding pad 422.

In one embodiment, each second conductive bonding structure 432 can be attached to one of an overlying second LED 10G, and the second bonding pad 422, and each third conductive bonding structure 433 can be attached to one of an overlying second LED 10G and contacts the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second LEDs 10G). The same heating laser can be employed as in the processing steps of FIG. 16B. The second conductive bonding structures 432 can be sequentially irradiated by a laser beam from the heating laser 467 to reflow each second conductive bonding structure 432, and to bond each second conductive bonding structure 432 to an overlying second LED 10G and to an underlying second bonding pad 422.

Figure 16H:
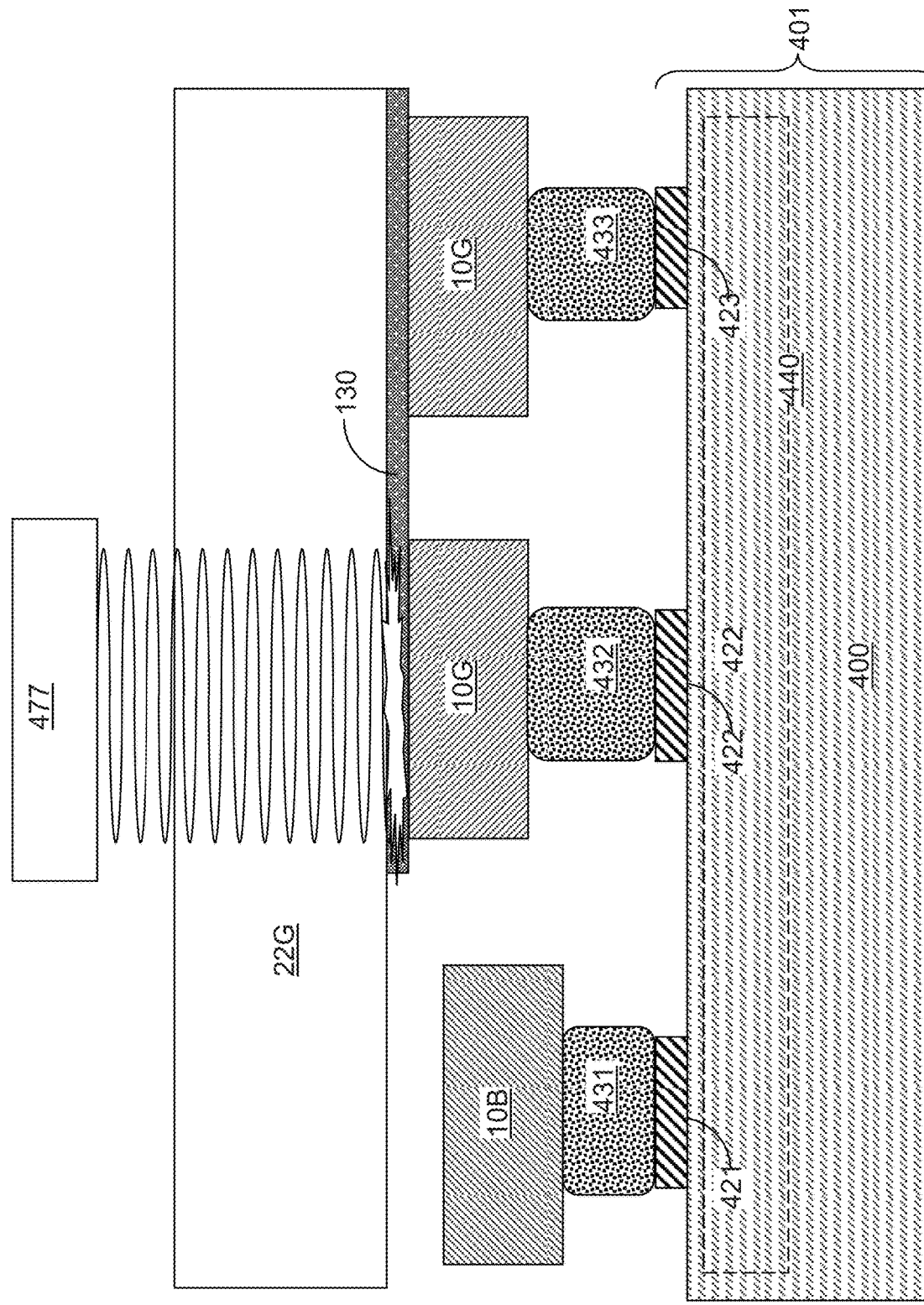

Referring to FIG. 16H, a laser irradiation process is performed to separate each bonded second LED 10G from the second support substrate. The wavelength of the laser 477 can be different from the wavelength of the heating laser 467, and provides more heating to the material of the ablation material layer 130 than to the materials of the support substrate 22G and the transferred devices (e.g., the second light emitting diodes 10G). Each portion of the ablation material layer 130 overlying the second conductive bonding structures 432 can be sequentially irradiated by a laser beam from the laser 477 to dissociate each underlying second LED 10G.

Figure 16I:
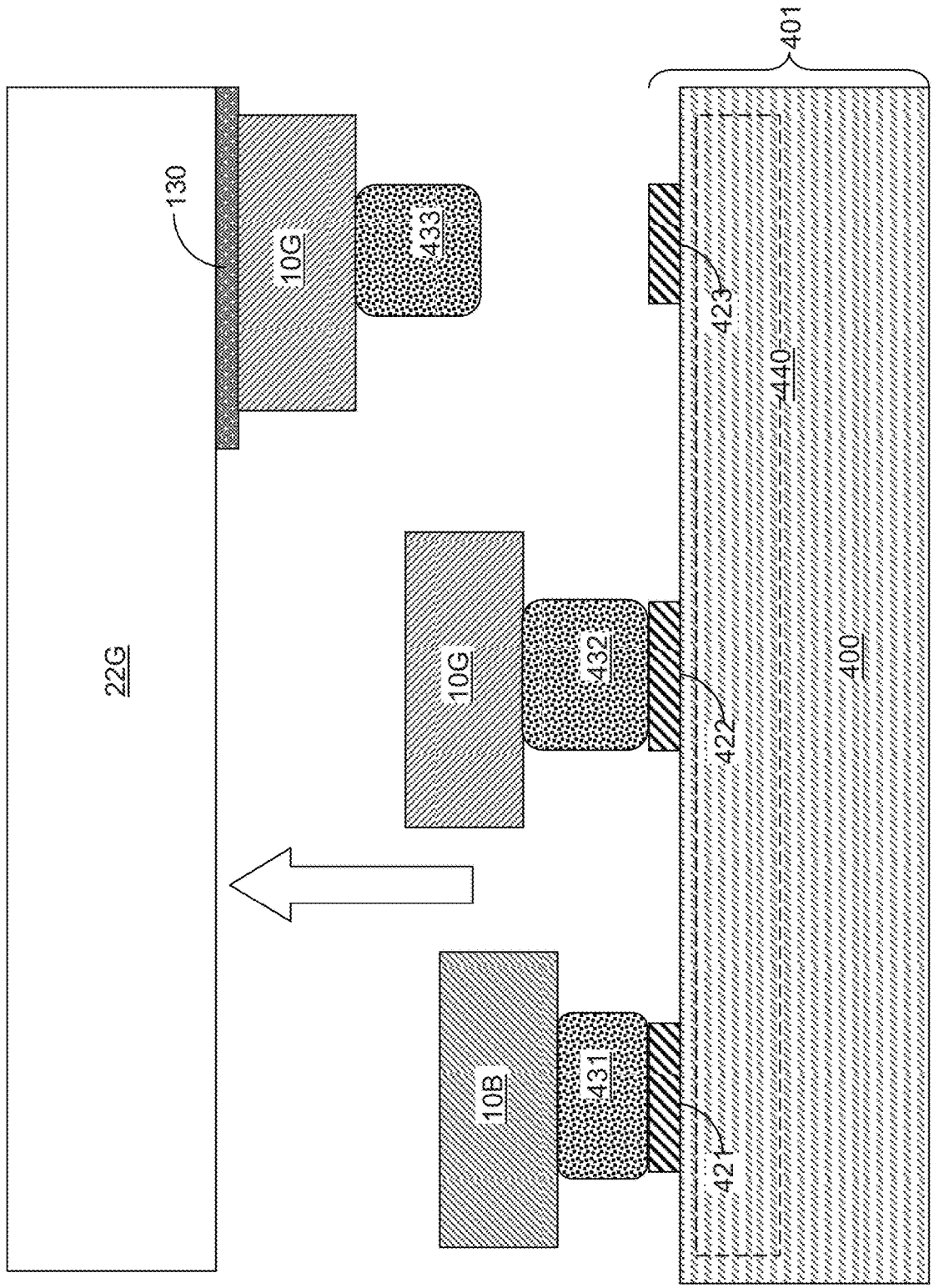

Referring to FIG. 16I, the assembly of the second support substrate 22G and attached second light emitting diodes 10G (a third subset of the second light emitting diodes 10G that remain on the second support substrate) is separated from the backplane 401 and the second subset of the second light emitting diodes 10G that are now attached to the backplane 401.

Figure 16J:
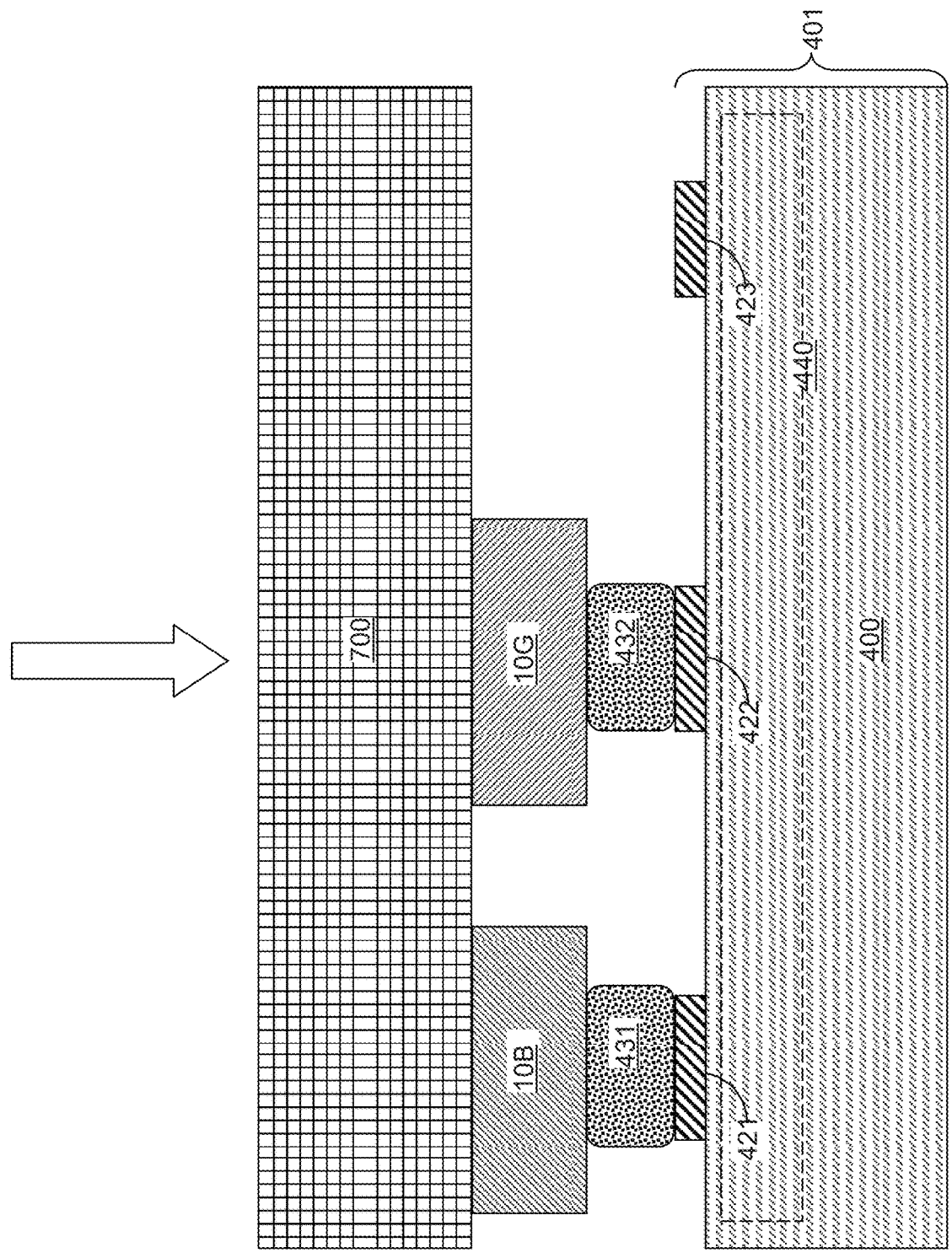

Referring to FIG. 16J, a dummy substrate 700 can employed to push the second light emitting diodes 10G on the second conductive bonding structures 432 toward the backplane 401 in the same manner as described above.

Figure 16K:
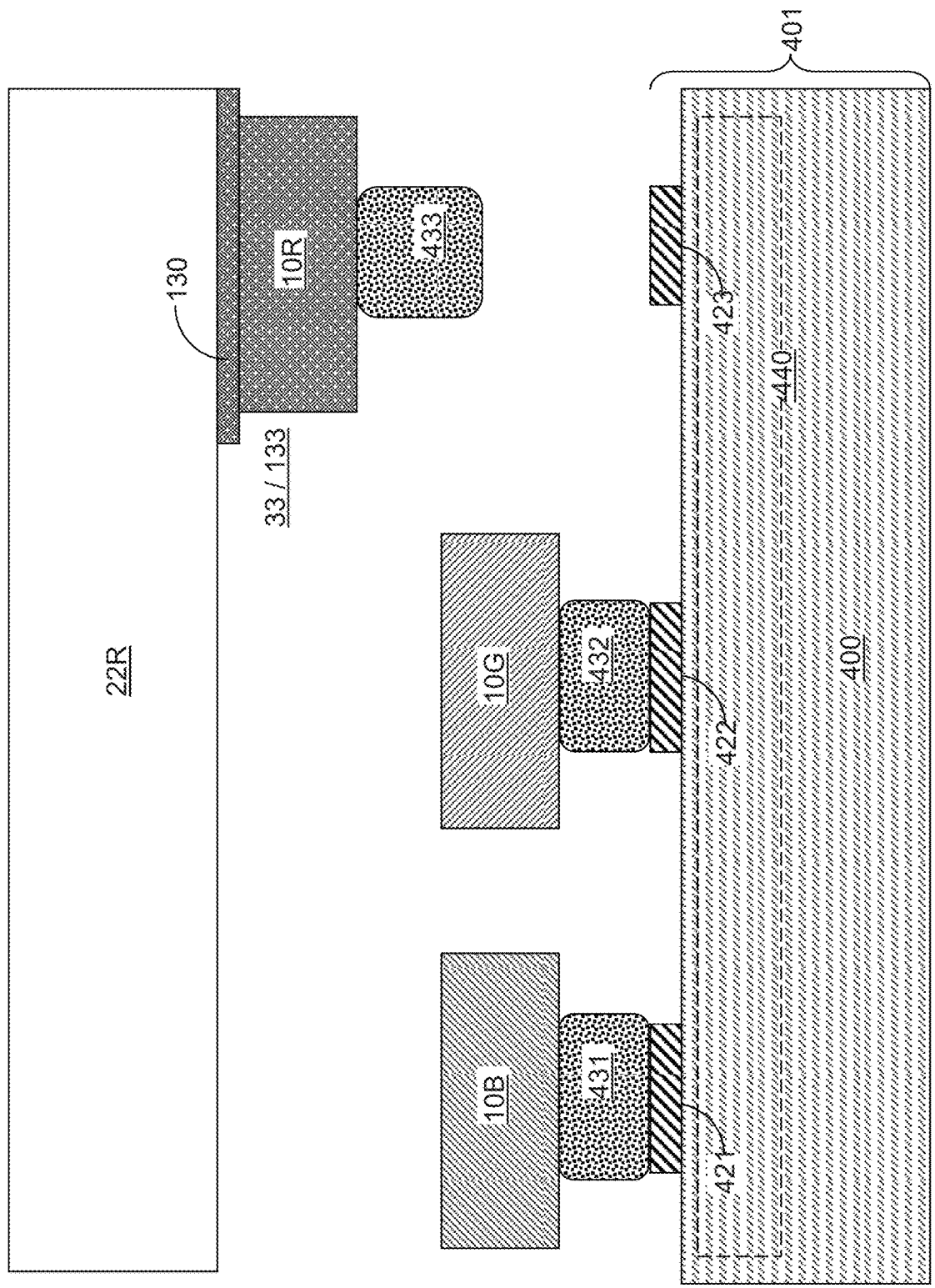

Referring to FIG. 16K, a third support substrate (such as a third transfer substrate 22R), from which a first subset and a second subset of third LEDs 10R have been removed in prior processing steps, is positioned over the in-process fourth exemplary light emitting device assembly, and is aligned such that a third subset of the third light emitting diodes 10R overlies the third bonding pads 423.

Figure 16L:
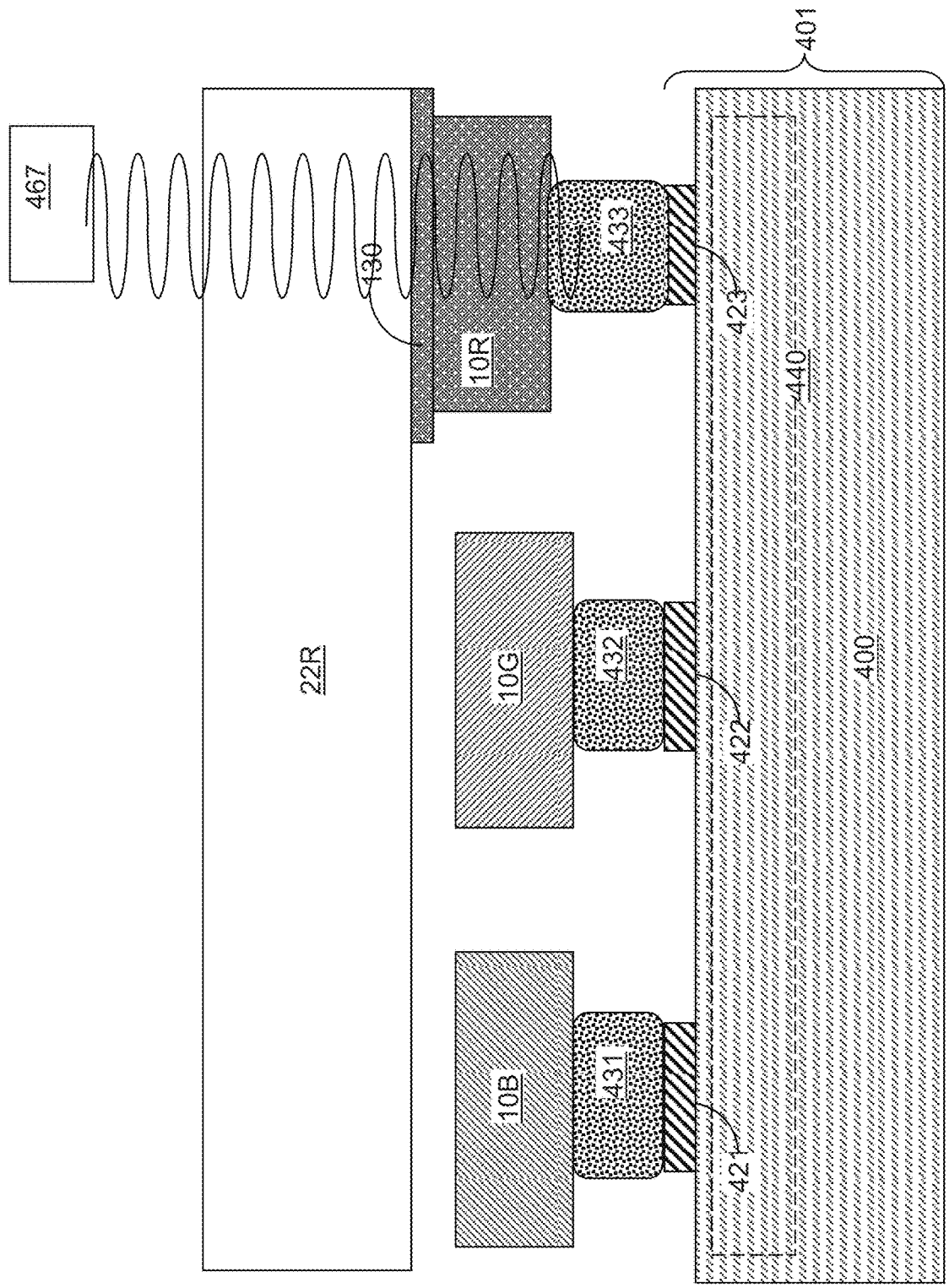

Referring to FIG. 16L, the backplane 401 and the assembly including the third light emitting diodes 10R are positioned such that each third conductive bonding structure 433 is attached a third LED 10R and contacts the third bonding pad 423. If any addition conductive bonding structures (not shown) are present, additional conductive bonding structures (not shown) overlying such additional bonding pads can contact underlying additional bonding pads and overlying third LEDs 10R, and can be attached to the underlying additional bonding pads or to the overlying third LEDs 10R.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third LEDs 10R). The same heating laser can be employed as in the processing steps of FIG. 16B or FIG. 16G. The third conductive bonding structures 433 can be sequentially irradiated by a laser beam from the heating laser 467 to reflow each third conductive bonding structure 433, and to bond each third conductive bonding structure 433 to an overlying third LED 10R and to an underlying third bonding pad 423.

Figure 16M:
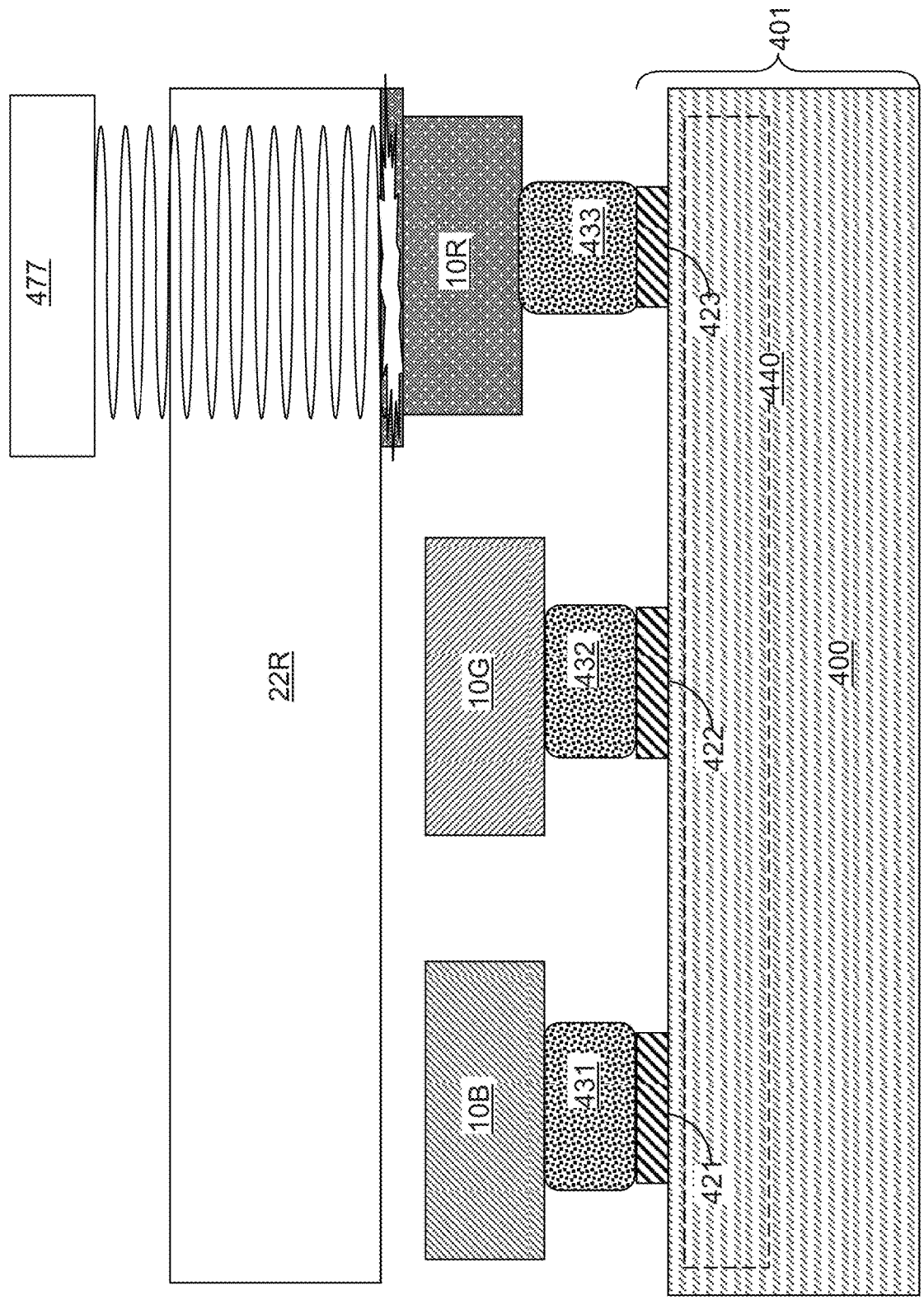

Referring to FIG. 16M, a laser irradiation process is performed to separate each bonded third LED 10R from the third support substrate in the same manner as in the processing steps of FIG. 15A.

Referring to FIG. 16N, a dummy substrate 700 may be employed to push the third light emitting diodes 10R on the third conductive bonding structures 433 toward the backplane 401. The assembly of the third support substrate 22R and any remaining third light emitting diodes 10R, if any, is separated from the backplane 401 and the third subset of the third light emitting diodes 10R that are now attached to the backplane 401 in the same manner as above. The first, second and third LEDs (10B, 10G, 10R) attached to the backplane 401 have co-planar top and bottom surfaces (e.g., planar surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Figure 16O:
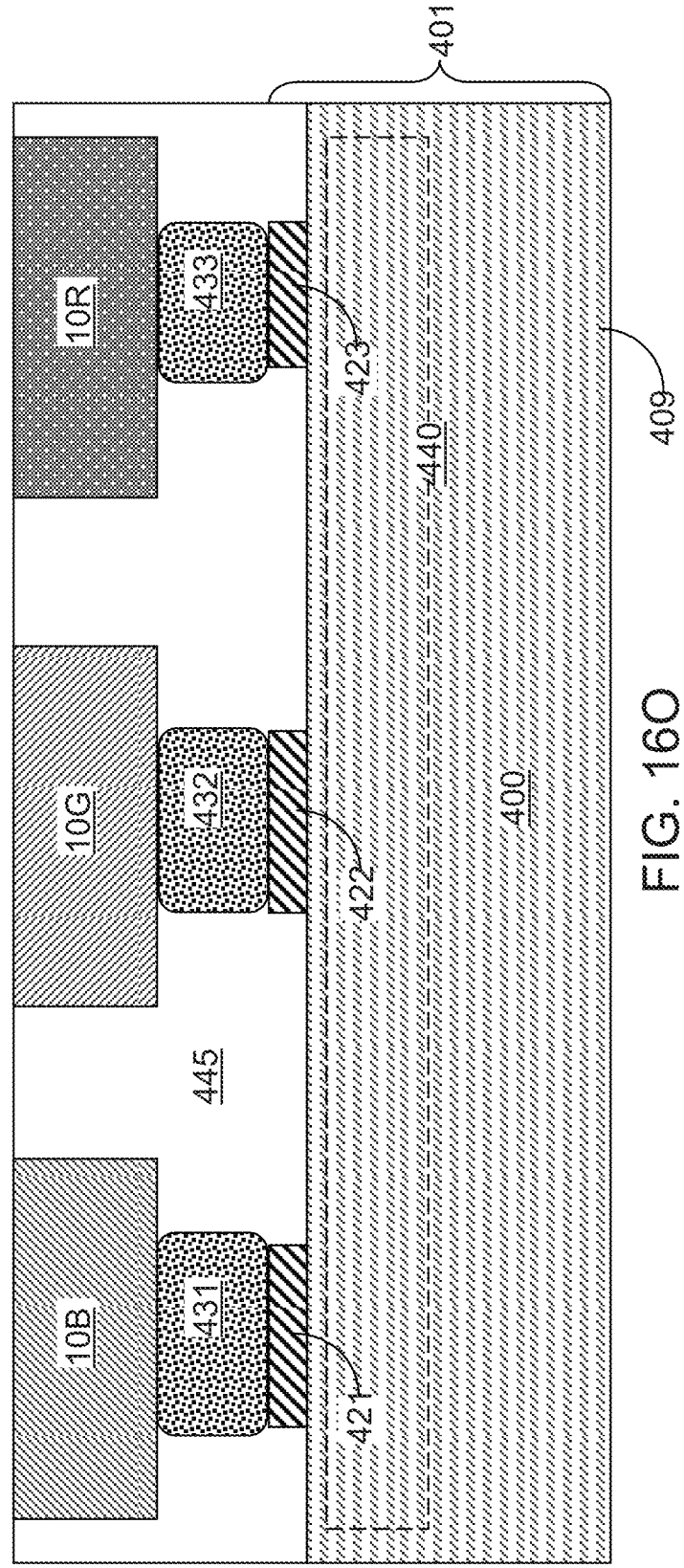
Figure 16P:
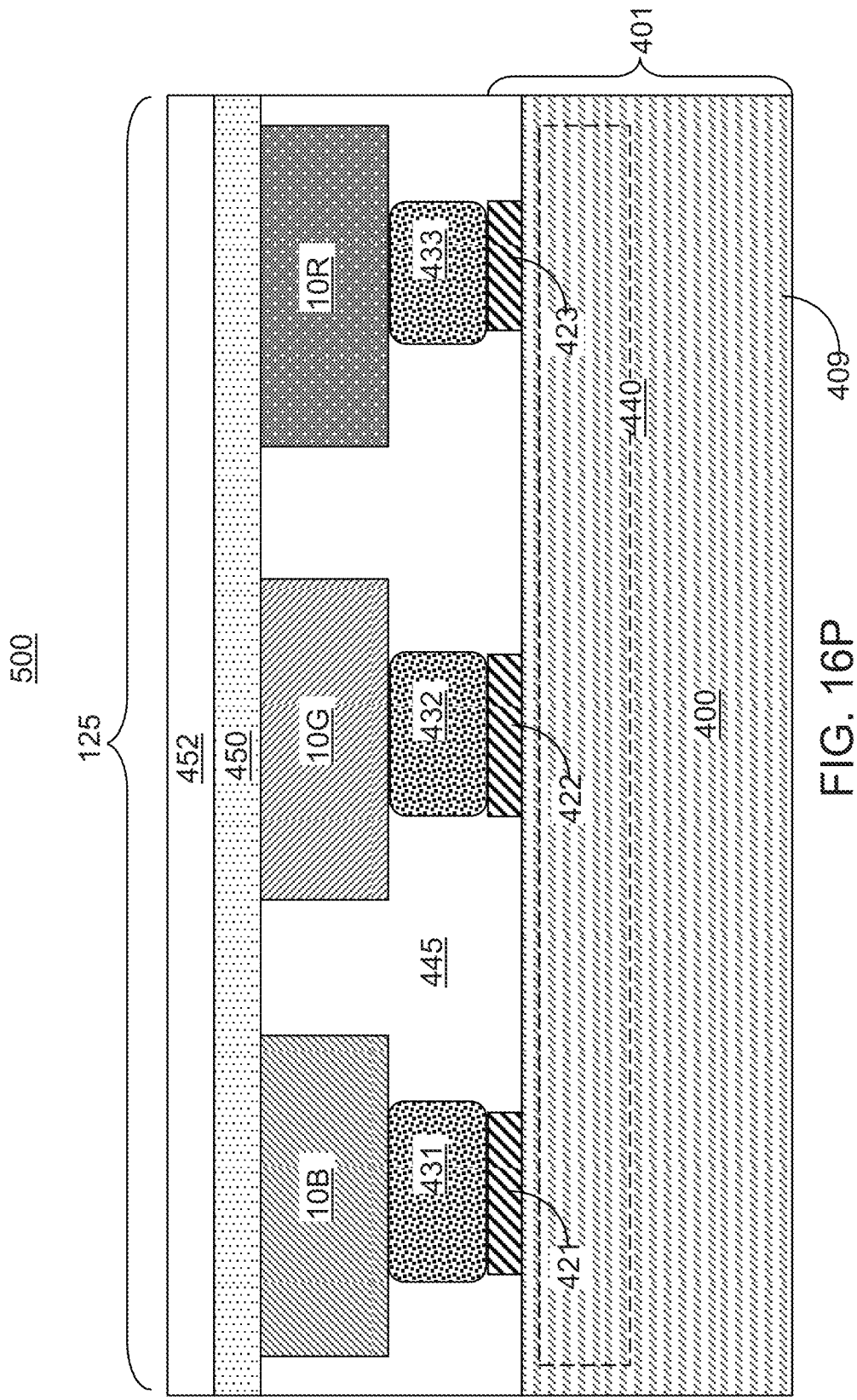

Referring to FIG. 16O, the dielectric matrix 445 illustrated in FIG. 15A can be applied in the spaces between the light emitting diode subpixels (10B, 10G, 10R) that are bonded to the backplane 401. While FIG. 16O illustrates only three subpixels (10B, 10G, 10R), it is understood that an array of pixels is formed on the backplane 401, and each pixel includes a set of light emitting diodes such as a blue-light emitting diode as a first LED subpixel 10B, a green-light emitting diode as a second LED subpixel 10G, and a red-light emitting diode as a third LED subpixel 10R. The dielectric matrix 445 can laterally surround each of the red-light emitting diodes, the green-light emitting diodes, and the blue light emitting diodes within the array of pixels.

The dielectric matrix 445 can include a self-planarizing dielectric material such as spin-on glass (SOG) or polymer, or can be planarized by a recess etch or chemical mechanical planarization. The planar surface of the dielectric matrix 445 as planarized can be within the horizontal plane including the planar surfaces of the subpixels (10B. 10G, 10R), or can be vertically recessed below the horizontal plane including the planar surfaces of the subpixels (10B. 10G, 10R).

Referring to FIG. 16P, a front side transparent conductive oxide layer 450 can be formed over the dielectric matrix 445 and directly on the electrical nodes that are located on top of each subpixel (10B, 10G, 10R). For example, the front side transparent conductive oxide layer 450 can be deposited on the semiconductor buffer layer 24 or directly on the compound semiconductor material layer 26 of the first conductivity type. For example, if the buffer layer 24 has a high resistivity and is not removed during the laser ablation step described above, then an additional etch back or CMP is performed to remove the buffer layer 24 and expose the doped compound semiconductor layer 26 of the first conductivity type.

In this case, the front side transparent conductive oxide layer 450 can be a common ground electrode for each of the red-light emitting diode subpixels 10R, the green-light emitting diode subpixels 10G, and the blue-light emitting diode subpixels 10B. The subpixels 10R, 10B, 10G form a pixel 125 of a direct view display device 500.

An optional transparent passivation dielectric layer 452 can be formed over the front side transparent conductive oxide layer 450. The transparent passivation dielectric layer 452 can include silicon nitride or silicon oxide. Thus, the LED subpixels 10B, 10G and 10R are so-called bottom emitting, vertical LEDs 10 which emit light through the compound semiconductor material layer 26, the front side transparent conductive oxide layer 450 and transparent passivation dielectric layer 452. The LEDs are vertical devices because they have electrical contacts (i.e., layer 450 and bonding structures or pads (431, 432, 433)) on opposite sides thereof.

According to one embodiment of the present disclosure, a light emitting device (LED) is provided, which comprises: a substrate (24, 26) including a doped compound semiconductor layer 26; a growth mask layer 42 located on a planar surface of the doped compound semiconductor layer 26 and including an opening 43 therethrough; an epitaxial semiconductor structure 32 having a doping of a first conductivity type and including a epitaxial mesa portion 32M and an epitaxial connection portion 32C located in the opening 43 in the growth mask layer 42 and connecting a top portion of the doped compound semiconductor layer 26 to a bottom of the epitaxial mesa portion 32M, wherein a periphery of a bottom surface of the epitaxial mesa portion 32M contacts a planar surface of the growth mask layer 42 around the opening 43, and a planar surface of the epitaxial mesa portion 32M includes a crystallographic c-plane that is parallel to the planar surface of the doped compound semiconductor layer 26; an active region 34 located on the epitaxial mesa portion 32M and including an optically active compound semiconductor layer stack configured to emit light; a second conductivity type semiconductor material layer 36 having a doping of a second conductivity type and located on the active region 34; a dielectric liner layer 60 located over the second conductivity type semiconductor material layer 36; and a reflector layer 70 located over the dielectric liner layer 60 and including sidewall portions that laterally surround the second conductivity type semiconductor material layer 36 and the doped compound semiconductor layer 26.

In one embodiment, the epitaxial mesa portion 32M has tapered sidewalls; and bottom edges of the tapered sidewalls are laterally offset outward from a periphery of the opening 43 through the growth mask layer 42 by a uniform or non-uniform lateral offset distance. In one embodiment, sidewalls of the doped compound semiconductor layer 26 are vertical or tapered, and contacts the dielectric liner layer 60. If the sidewalls of the doped compound semiconductor layer 26 are tapered, the bottom portion (i.e., a distal portion) of the doped compound semiconductor layer 26 that is distal from the epitaxial semiconductor structure 32 can have a greater width than a top portion (i.e., a proximal portion) of the doped compound semiconductor layer 26 that is proximal to the epitaxial semiconductor structure 32.

In one embodiment, an anode contact electrode 50 can overlie, and can be electrically shorted to, the second conductivity type semiconductor material layer 36. In one embodiment, the dielectric liner layer 60 can laterally surround the anode contact electrode 50 and can overlie a peripheral portion of the anode contact electrode 50; and the reflector layer 70 can laterally surround the anode contact electrode 50 and the dielectric liner layer 60, and can overlie the peripheral portion of the anode contact electrode 50. In one embodiment, the dielectric liner layer 60 includes an opening over the anode contact electrode 50; the reflector layer 70 includes an opening over the anode contact electrode 50; and the opening through the dielectric liner layer 60 and the opening through the reflector layer 70 are vertically coincident. As used herein, a first surface and a second surface are vertically coincident if the second surface overlies or underlies the first surface and if there exists a vertical plane that includes the first surface and the second surface. In one embodiment, a conductive bonding structure 431 can be located within an opening through the reflector layer 70 and can be bonded to the anode contact electrode 50.

According to another aspect of the present disclosure, a direct view display device is provided, which includes a plurality of LEDs 10 of the present disclosure; and a backplane 401 comprising metal interconnect structures 440 therein or thereupon; wherein each of the plurality of LEDs 10 is electrically connected to a respective one of the metal interconnect structures 440 and constitutes a first subpixel which emits light at a first peak wavelength of a respective pixel of the direct view display device. The respective pixel can further comprise: a second subpixel comprising a second LED which emits light at a second peak wavelength different from the first peak wavelength; and a third subpixel comprising a third LED which emits light at a third peak wavelength different from the first and the second peak wavelengths.

Generally, the exemplary LEDs 10 of the present disclosure can be employed to form a direct view display device 500 shown in FIG. 16P. In this case, a backplane 401 with bonding structures (421, 422, 423) can be employed. Each of the bonding structures (421, 422, 423) is electrically connected to a respective one of metal interconnect structures 440 located within, or on, the backplane 401. Multiple instances of the LED 10 are provided as subpixels. Each instance of the LED 10 can be bonded to a respective bonding structure (421, 422, 423) on the backplane 401. Each bonded instance of the LED subpixel emits light at a given peak wavelength for a respective pixel 125 of the direct view display device 500.

Thus, each LED 10 is electrically connected to a respective one of the metal interconnect structures 440 and constitutes a first subpixel (e.g., 10B) which emits light at a first peak wavelength (e.g., blue) of a respective pixel of the direct view display device. The respective pixel further comprises a second subpixel 10G comprising a second LED 10 which emits light at a second peak wavelength (e.g., green) different from the first peak wavelength, and a third subpixel 10R comprising a third LED 10 which emits light at a third peak wavelength (e.g., red) different from the first and the second peak wavelengths.

Each instance of the first LED subpixel 10B can be electrically connected to a respective one of the metal interconnect structures 440 and constitutes a subpixel which emits light at a first peak wavelength for a respective pixel. Multiple instances of a second LED subpixel 10G can be provided, which includes a same set of components as the first LED subpixel 10B with a modification that the active layer of the second LED subpixel 10G is configured to emit light at a second peak wavelength that is different from the first wavelength. Each instance of the second LED subpixel 10G is electrically connected to a respective one of the metal interconnect structures 440 and constitutes another subpixel for a respective pixel. Likewise, multiple instances of a third LED subpixel 10R can be provided, which includes a same set of components as the first LED subpixel 10B with a modification that the active layer of the third LED subpixel 10R is configured to emit light at a third peak wavelength that is different from the first wavelength and from the second wavelength. Each instance of the third LED subpixel 10R is electrically connected to a respective one of the metal interconnect structures 440 and constitutes yet another subpixel for a respective pixel. The direct view display device can be a multicolor direct view display device in which each pixel comprises a plurality of subpixels which emits light at different wavelengths (e.g., red, green and blue light).

The direct view display can be used in any suitable device, such as a smart phone, television, augmented reality display, virtual reality display, computer screen, large area display, watch, and the like.

Referring to FIG. 17A, exemplary relationships between a shape of an opening in a growth mask layer 42 (which may be a dielectric growth mask layer such as an aluminum oxide layer) and regrowth surfaces of active regions 34 are illustrated. The maximum lateral dimensions of the openings in the growth mask layer 42 may be in a range from 1 micron to 200 microns, such as from 2 microns to 100 microns, although lesser and greater maximum lateral dimensions can also be employed. The shape of each opening may be circular, hexagonal, or of any closed curvilinear shape. If a periphery of an opening includes a straight etch, such a straight edge may be aligned to a specific alignment mask provided in an underlying doped compound semiconductor layer 26 (such as an n-doped GaN layer) that marks a crystallographic direction of the single crystalline material in the doped compound semiconductor layer 26. For example, a straight edge in an opening in the dielectric mask may be aligned to an m-plane of an n-doped GaN layer. The shapes and layout of the openings in the growth mask layer 42 can be optimized for packing density and for light extraction of light emitting devices to be formed.

Referring to FIGS. 17B and 17C, vertical cross-sectional profiles of various exemplary self-aligned growth structures (32, 34, 36) are illustrated. In one embodiment, the growth pattern of the self-aligned growth structures (32, 34, 36) can produce LED device geometry in which the c-plane (i.e., a top flat facet) has dimensions ranging from 0 nm (pyramid)

to the opening width (flat truncated pyramid). The active region 34, which may be implemented as a quantum well structure, may be placed anywhere from 20 nm from the topmost surface of a self-aligned regrowth structure (32, 34, 36) to the regrowth interface (the thickness of the epitaxial semiconductor structure 32 becomes zero, for example, by eliminating the regrowth of n-doped GaN). The height of the active region 34 can be optimized to maximize light extraction.

Selective growth of LED subpixels can employ a mask material that thermally stable and resistant to etching or decomposition or outgassing in typical process gases (such as $H_2$, $N_2$, and $NH_3$) employed for deposition of a compound semiconductor material such as GaN. Preferred mask materials are materials that do not contain any dopant elements (such as silicon or magnesium) for GaN. In one embodiment, the growth mask layer 42 can include aluminum oxide, which is thermally stable and is free of any dopant elements for GaN. The growth of the self-aligned regrowth structure (32, 34, 36) may be effected by atomic layer deposition (ALD) or chemical vapor deposition (CVD). The epitaxial semiconductor structure 32 can function as a "current aperture" that restricts electrical current to c-plane region of the active area 34, which can be the only light emitting region in some embodiments.

In one embodiment, selective area growth of an LED subpixel can provide multiple physically exposed facets. In such configurations, the planar c-plane region extending horizontally with a uniform thickness can be a desired light emitting area. The growth condition can be selected such that the c-plane region has a greater thickness than any other faceted regions, which function as electrical insulators and provide electrical isolation. Thus, the electrical current can be confined within the c-plane region of the active region 34. In other words, the electrical current can be isolated by angled facets (non-c-plane facets), and potential leakage paths at sidewalls and near mask interfaces can be effectively shut off.

P-doped AlGaN employed for the second conductivity type semiconductor material layer 36 can be grown in a temperature ranges from 600 degrees Celsius to 1,000 degrees Celsius. In one embodiment, the second conductivity type semiconductor material layer 36 can have a thickness in a range from 20 nm to 100 nm. The second conductivity type semiconductor material layer 36 can function as a current blocking layer for the angled facets of the active region 34, and thus, reduces the leakage current through the angled facets of the active region 34. This feature enables uniform emission of light with narrow full width at half maximum (FWHM) from the planar c-plane region within the active region 34, and also enables parallel emission of light along the vertical direction from multiple LEDs.

In one embodiment, the epitaxial semiconductor structure 32 can be omitted in the self-aligned regrowth structure (34, 36). For example, regrown n-type GaN may be omitted. In this case, the active regions 34 can be formed directly on the planar surface of the doped compound semiconductor layer 26 within the openings in the growth mask layer 42. The regrowth of a compound semiconductor material can begin with selective growth of active regions 34. This method can enable consistent regrowth of the active regions 34 in opening area, and can provide consistent device properties, and allows flexibility in the design of device geometry.

In one embodiment, the sidewalls of the self-aligned growth structures (32, 34, 36) are faceted crystallographic surfaces that are defined during the selective epitaxial growth of the semiconductor materials of the self-aligned growth structures (32, 34, 36). Thus, the faced sidewalls of the self-aligned growth structures (32, 34, 36) have an atomic level surface roughness that is difficult to obtain in any etched semiconductor surface. Because the faceted sidewalls are inherently crystallographically defined during growth, exposed faceted surfaces function as crystallographic etch stop planes.

In one embodiment, the selective epitaxial growth of the self-aligned regrowth structure (32, 34, 36) can enhance LED light extraction by limiting the light emission area to a planar layer including a c-plane facet that is parallel to the planar surface of the doped compound semiconductor layer 26. The light emission area of the self-aligned growth structure (32, 34, 36) can be limited by controlling the growth geometry with the selective epitaxial deposition process.

Figure 18A:
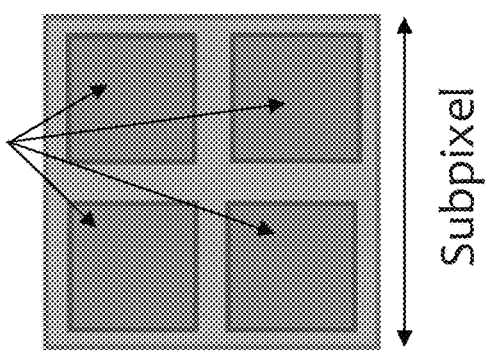
FIG. 18A is a plan view of an exemplary LED subpixel that employs redundant light emitting regions contacted by a common metal layer as an anode contact electrode according to an embodiment of the present disclosure.
Figure 18B:
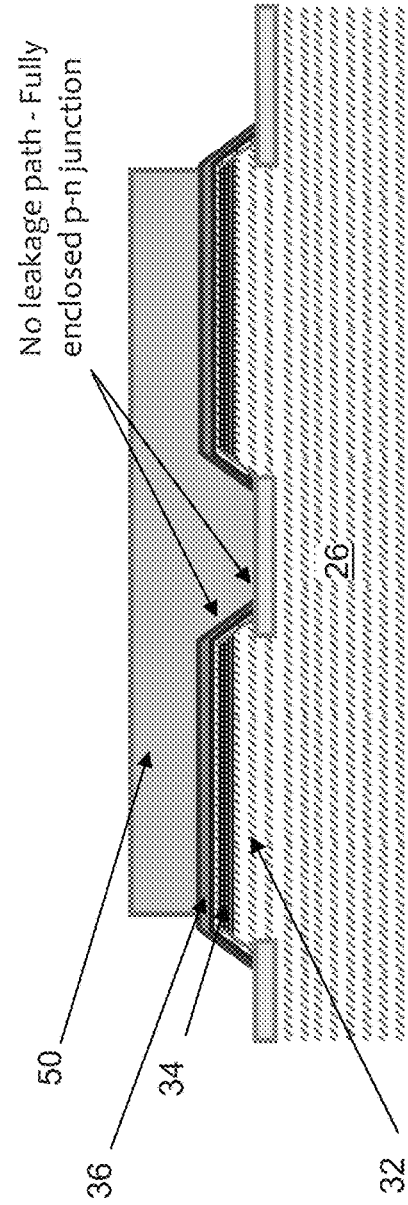
FIG. 18B is a vertical cross-sectional view of the exemplary LED subpixel of FIG. 18A.

According to an aspect of the present disclosure, an exemplary LED subpixel is illustrated in FIGS. 18A and 18B, which employs redundant light emitting regions contacted by a common anode contact electrode 50 such as a metal layer. The exemplary LED subpixel employs a redundant subpixel design that may be employed for micro-LED display applications. In this case, the LEDs are in a parallel connection configuration such that multiple self-aligned growth structures (32, 34, 36) are electrically connected to a common metal contact provided by a continuous meal layer. This configuration employs independent "encapsulated" LEDs in which each p-n junction is completely enclosed within a respective LED, and leakage paths among the LEDs are blocked by the angled faceted portions of the active regions 34 that function as insulating material portions. Redundancy is a desirable attribute in micro-LED display application, and can be employed to improve yield that arise from dead subpixels.

According to an aspect of the present disclosure, a semiconductor structure is provided, which comprises: a mesa base semiconductor portion 25; a growth mask layer 42 located on a planar surface of the mesa base semiconductor portion 25 and including a plurality of opening therethrough; a plurality of semiconductor layer stacks 34 (i.e., active regions 34) including bottom nodes that are electrically shorted to the mesa base semiconductor portion 25 by electrically conductive paths through the openings; a plurality of second conductivity type semiconductor material layers 36 having a doping of a second conductivity type located on a respective one of the plurality of semiconductor layer stacks 34; and an anode contact electrode 50 contacting planar surfaces of, and overlie, each of the plurality of second conductivity type semiconductor material layers 36. In one embodiment, the plurality of semiconductor layer stacks 34 can be arranged as a P×Q rectangular array, wherein P and Q are integers greater than 1. In one embodiment, a plurality of selectively grown epitaxial semiconductor structures 32 can extend through the a respective one of the plurality of openings through the growth mask layer 42 and can have a doping of a first conductivity type and can be separated among one another by isolation regions.

According to an aspect of the present disclosure, a method of forming a light emitting device is provided, which comprises the steps of: forming a growth mask layer 42 including openings therethrough on a planar surface of a doped compound semiconductor layer 26 located over a substrate 22; and forming first light emitting diode (LED) subpixels by: forming a plurality of semiconductor layer stacks 34 (i.e., active regions 34) including a respective bottommost layer that is electrically shorted to the doped compound semiconductor layer 26 by electrically conductive paths through the openings, wherein each of the plurality of active regions 36 includes a respective optically active compound semiconductor layer stack 34 configured to emit light; forming second conductivity type semiconductor material layers 36 on a respective one of the plurality of active regions 34; and forming an anode contact electrode 50 continuously extending over, and contacting, the second conductivity type semiconductor material layers 36. Each first LED subpixel can be transferred to a backplane 401 to form a portion of a respective pixel of the light emitting device. In one embodiment, first conductivity type epitaxial semiconductor structures 32 separated by isolation regions can be formed through the openings of the growth mask layer 42.

According to another aspect of the present disclosure, the doped compound semiconductor layer 26 can be patterned with tapered sidewalls to improve the etendue of the LED subpixel. FIGS. 19A-19D illustrate sequential vertical cross-sectional views during formation of an LED subpixel that includes tapered sidewalls of a compound semiconductor material portion for enhancing etendue according to an embodiment of the present disclosure.

Figure 19B:
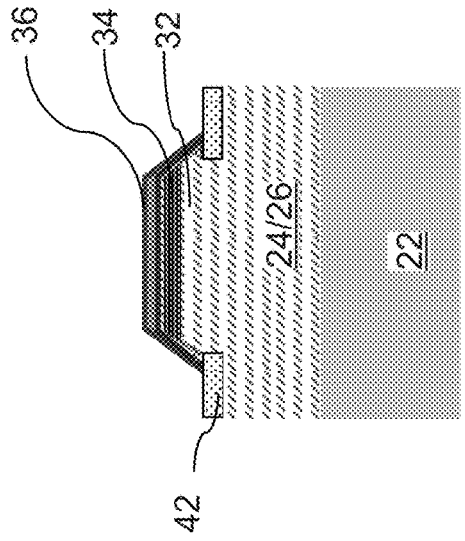
FIGS. 19A-19D illustrate sequential vertical cross-sectional views during formation of a LED subpixel that includes tapered sidewalls of a compound semiconductor material portion for enhancing etendue according to an embodiment of the present disclosure.
Figure 19A:
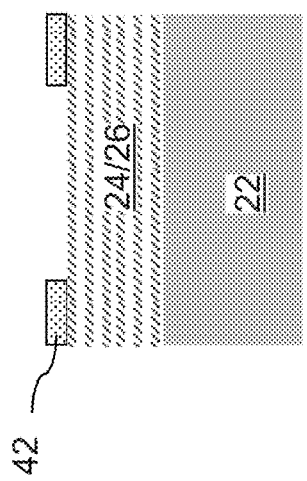

Referring to FIG. 19A, the exemplary structure of FIGS. 2A and 2B is illustrated.

Referring to FIG. 19B, the processing steps of FIGS. 3A and 3B and the processing steps of FIGS. 4A and 4B can be sequentially performed to form self-aligned growth structures (32, 34, 36).

Figure 19D:
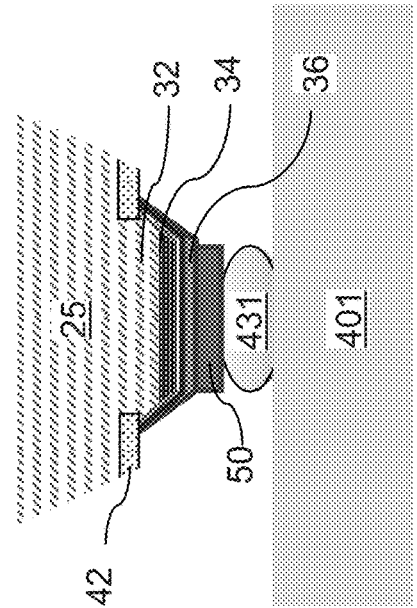
Figure 19C:
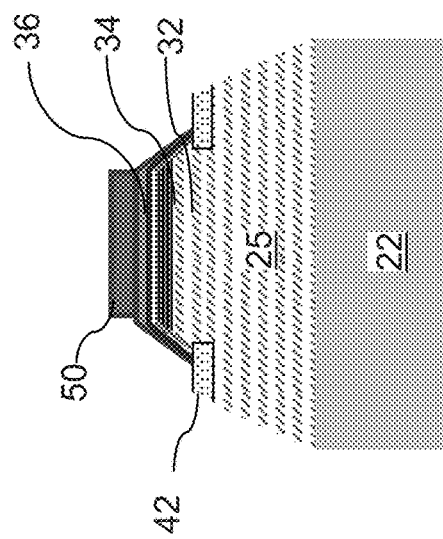

Referring to FIG. 19C, additional processing steps from the processing steps of FIGS. 5A-5C to the processing steps of FIG. 9 can be performed with the modification of forming tapered sidewalls on the doped compound semiconductor layer 26 and on the buffer layer 24, if present. A continuous set of patterned portions of the doped compound semiconductor layer and the buffer layer 24 constitutes a mesa base semiconductor portion 25, which constitutes a base portion of a mesa structure.

Referring to FIG. 19D, the LED subpixel can be transferred to a backplane 401. In one embodiment, the methods of FIGS. 16A-16P may be employed to transfer the LED subpixel to the backplane 401.

In one embodiment, a truncated inverted pyramid LED chip shape structure may be employed to increase light extraction. Truncated inverted pyramid configurations for enhanced light extraction are disclosed in Krames et al., "High-power truncated-inverted-pyramid $(Al_xGa_{1-x})_{0.5}In_{0.5}P$/GaP light-emitting diodes exhibiting >50% external quantum efficiency," Applied Physical Letters, 75, 2365 (1999); U.S. Pat. No. 6,323,063 to Krames et al., titled "Forming LED having angled sides for increased side light extraction," and U.S. Pat. No. 6,229,160 to Krames et al., titled "Light extraction from a semiconductor light-emitting device via chip shaping."

Referring to FIG. 20, etendue for various cases of exemplary LED subpixels that employ tapered sidewalls according to an embodiment of the present disclosure. Focused light extraction can be enabled by employing tapered sidewalls of a mesa base semiconductor portion 25, which can be a patterned portion of the doped compound semiconductor layer 26 and the buffer layer 24. The etendue of each configuration depends on various parameters including the maximum lateral dimension (such as the diameter A) of the light emitting region (e.g., the c-plane area of an active region 34), and the height Z of the doped compound semiconductor layer 26, as well as other geometrical parameters.

According to an aspect of the present disclosure, a semiconductor structure is provided, which comprises: a mesa base semiconductor portion 25 having tapered sidewalls; a growth mask layer 42 located on a planar surface of the mesa base semiconductor portion 25 and including at least one opening therethrough; at least one semiconductor layer stack 34 including a respective bottommost layer that is electrically shorted to the mesa base semiconductor portion 25 by a respective electrically conductive path through a respective opening; and at least one second conductivity type semiconductor material layer 36 having a doping of a second conductivity type located on the at least one semiconductor layer stack 34, wherein a lateral dimension of the doped semiconductor material portion 25 along a direction parallel to an interface between the growth mask layer 42 and the mesa base semiconductor portion 25 increases with a vertical distance from the interface between the growth mask layer 42 and the mesa base semiconductor portion 25.

In one embodiment, the tapered sidewalls of the mesa base semiconductor portion 25 have a taper angle with respect to a vertical direction that is perpendicular to the interface between the growth mask layer 42 and the mesa base semiconductor portion 25 in a range from 30 degrees to 60 degrees.

According to another aspect of the present disclosure, a method of forming a light emitting device is provided, which comprises the steps of: forming a growth mask layer 42 including openings therethrough on a planar surface of a doped compound semiconductor layer 26 located over a substrate 22; and forming first light emitting diode (LED) subpixels by: forming a plurality of active regions 34 including bottom nodes that are electrically shorted to the doped compound semiconductor layer 26 by electrically conductive paths through the openings, wherein each of the plurality of active regions 34 includes a respective optically active compound semiconductor layer stack 34 configured to emit light; forming second conductivity type semiconductor material layers 36 on a respective one of the plurality of active regions 34; and patterning the doped compound semiconductor layer 26 into a mesa base semiconductor portion 25 having tapered sidewalls, wherein a lateral dimension of the doped semiconductor material portion 25 along a direction parallel to an interface between the growth mask layer 42 and the mesa base semiconductor portion 25 increases with a vertical distance (for any height of measurement of the lateral dimension within the mesa base semiconductor portion 25) from the interface between the growth mask layer 42 and the mesa base semiconductor portion 25. Each first LED subpixel can be transferred to a backplane 401 to form a portion of a respective pixel of the light emitting device.

In one embodiment, the source size (i.e., the area of the c-plane region within the active region 34) can be controlled merely by changing the growth time for forming the epitaxial semiconductor structure 32. As discussed above, the angled faceted regions can be thinner than the c-plane region, and thus, can function as insulating material portions. In this case, only the c-plane region is the light emitting region within each self-aligned growth structure (32, 34, 36).

Etendue considerations imply that decreasing a source area-to-interface area ratio in a light source results in favorable light extraction improvements. The source area-to-interface area ratio can be the ratio of the quantum well emission plane area to the area of a compound semiconductor material-to-air interface (such as a GaN-to-air interface or an interface between the mesa base semiconductor portion 25 and any low refractive index medium). If light emission is limited to only the planar surface (i.e., the surface of a c-plane region), and therefore, if the sidewalls of the active regions 34 do not emit any light, the source area-to-interface area ratio can be purely a function of epitaxial growth time, which is easily controllable.

Controlling source size allows for a simple way to influence the beam shape, with smaller sources showing narrower beam angle. The self-aligned growth mesa approach enables alteration of the beam shape to meet diverse etendue requirements that may be required for different types of applications without changing the manufacturing processes significantly. Only the thickness of the epitaxial semiconductor structure 32 needs to be adjusted for different products.

Further, controlling source size also allows changes in the operating current density with minimal changes to the device manufacturing process. Simultaneous control of the external quantum efficiency (EQE) and the current density is known to be difficult in the art. The alteration of the growth time for the epitaxial semiconductor structure 32 induces minimal change in other device characteristics, and thus, an optimized LED device that functions at peak efficiency can be altered such that the current density remains constant with changes in the emission area for the LED subpixels of the present disclosure.

Figure 21:
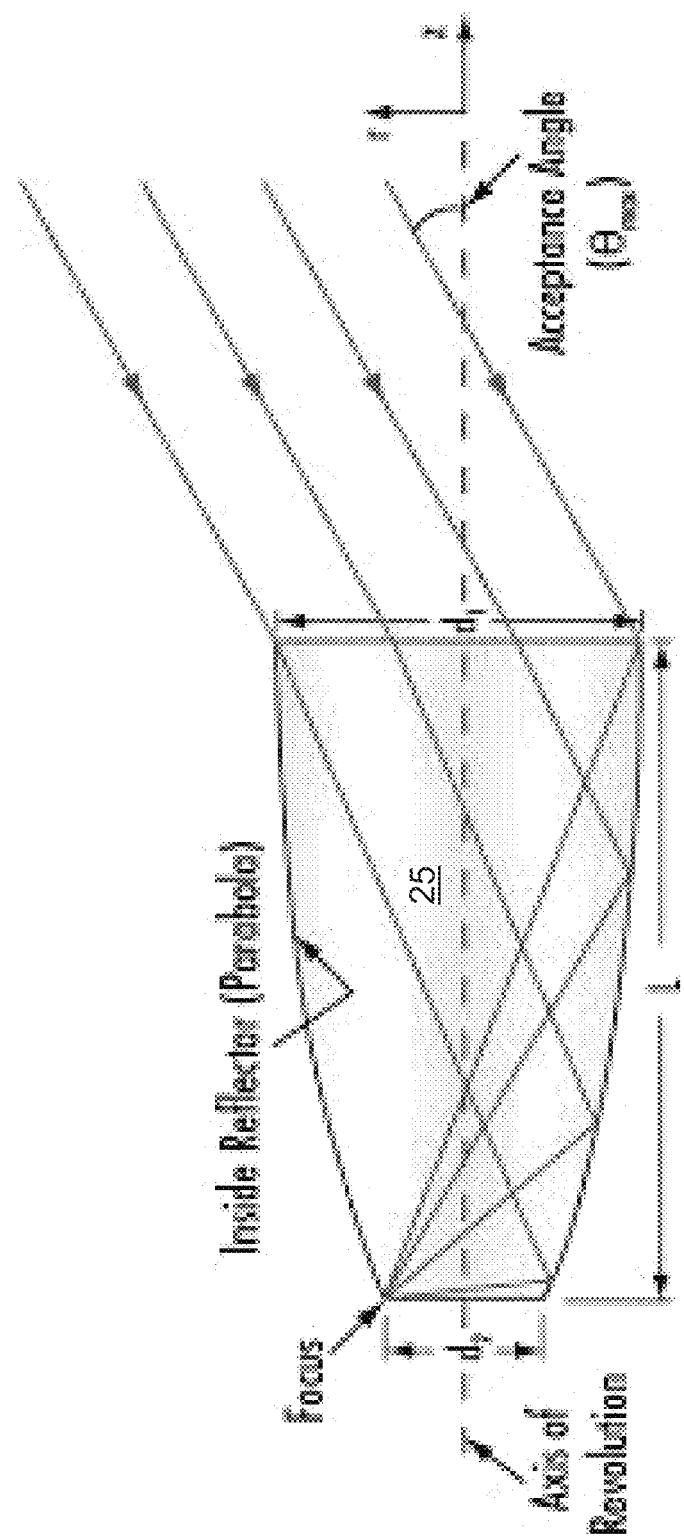
FIG. 21 illustrates a concave tapered sidewall that can be employed for an LED subpixel of the present disclosure.

Referring to FIG. 21, a concave tapered sidewall can be employed for an LED subpixel of the present disclosure. In one embodiment, light extraction from a "point source" configuration can be mimicked, which may be optimal for micro-LED applications and low current density operation. In this case, the tapered sidewalls of the mesa base semiconductor portion 25 have convex surfaces.

In one embodiment, the shape of a compound parabolic concentrator may be employed for the convex surfaces of the tapered sidewalls of the mesa base semiconductor portion 25. While the compound parabolic concentrator was originally designed for solar applications to focus incoming solar radiation to a focal plane, the method of the present disclosure employs a reverse light path geometry for the compound parabolic concentrator such that the self-aligned growth structure (32, 34, 36) is provided at, or near, the focal plane. Thus, the LED subpixel of embodiments of the present disclosure employs an emission angle in lieu of an "acceptance angle" that is conventionally defined for a compound parabolic concentrator. An LED subpixel including convex surfaces having the profile of a compound parabolic concentrator can provide a focused beam profile along the axis that is perpendicular to the interface between the mesa base semiconductor portion 25 and the growth mask layer 42.

Generally speaking, the shapes of the mesa base semiconductor portion 25 (including the profile of the tapered sidewalls) can be modified by controlling the process parameters of an isotropic and/or anisotropic etch processes employed to pattern the doped compound semiconductor layer 26. The profiles of the tapered sidewalls of the mesa base semiconductor portion 25 can approximate the profiles for high light extraction non-imaging optics designs such as the compound parabolic concentrator.

In one embodiment, an anisotropic etch process can be employed to pattern the doped compound semiconductor layer 26. In a non-limiting example, a reactive ion etch process employing $BCl_3$ and $Cl_2$ can be employed. In this case, the ratio the flow rate of $BCl_3$ to the flow rate of $Cl_2$ can alter the taper angle of the sidewalls of the mesa base semiconductor portion 25. Other methods can be employed to control the taper angle profile of the sidewalls of the doped compound semiconductor layer 26. For example, a selective area etch process or imprinted shaped photoresist masking may be employed to improve light extraction and beam shape through control of the profile of the tapered sidewalls of the mesa base semiconductor portion 25.

In one embodiment, the physically exposed tapered sidewalls of the mesa base semiconductor portion 25 can include surfaces of an n-doped compound semiconductor material (such as n-doped GaN). In this case, passivation with a low index dielectric material may be employed.

Figure 22:
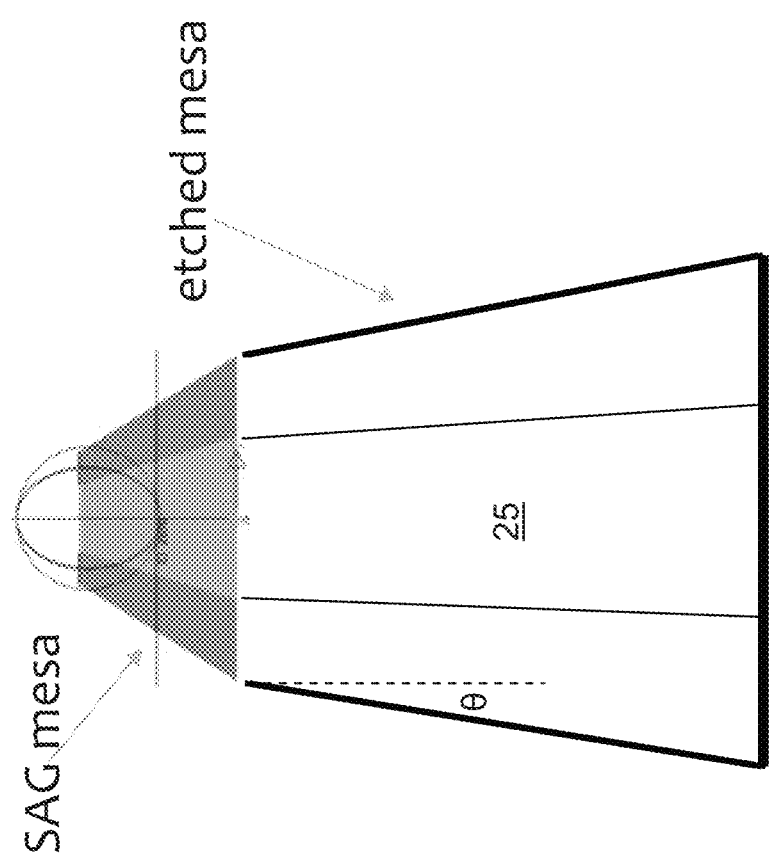
FIG. 22 illustrates straight tapered sidewalls that can be employed for an LED subpixel of the present disclosure.

The tapered sidewalls of the mesa base semiconductor portion 25 may have a straight profile. Referring to FIG. 22, straight tapered sidewalls are illustrated, which can be employed for an LED subpixel of embodiments of the present disclosure.

In one embodiment, faceted sidewalls having extremely smooth surfaces may be formed to provide reflective surfaces that function as mirrors. Tapered sidewalls with a constant taper angle θ for the mesa base semiconductor portion 25 provides a simple concentrator geometry.

In one embodiment, a reaction ion etch process may be employed as a deep mesa isolation etch process. The ratio of the flow rate of $BCl_3$ to the flow rate of $Cl_2$ during the anisotropic etch process can be selected to provide the optimum taper angle θ for light extraction and/or beam shaping. If the ratio of the flow rate of $BCl_3$ to the flow rate of $Cl_2$ is modulated during the anisotropic etch, a variable taper angle can be provided for the tapered sidewalls of the mesa base semiconductor portion 25 such as the curved tapered sidewalls a compound parabolic concentrator illustrated in FIG. 21.

Additionally or alternatively, a patterned substrate may be employed in which the doped compound semiconductor layer 26 has a variable thickness that modulates horizontally. For example, at least one step can be provided for each LED subpixel area such that each LED subpixel is formed on a stepped pyramid having stepped terraces and a topmost surface for forming a self-aligned growth structure (32, 34, 36). Alternatively, the modulation of the thickness of the doped compound semiconductor layer 26 can have a smooth thickness variation such that each LED subpixel is formed on a planar top surface of a truncated pyramid, i.e., on a top surface of a frustum. In this case, a self-aligned growth structure (32, 34, 36) can be formed on the top surface of the frustum. Generally, modulation of the thickness of the doped compound semiconductor layer 26 may be performed prior to formation of the self-aligned growth structures (32, 34, 36) on the substrate 22. The tapered sidewalls of the mesa base semiconductor portion 25 may be formed at least partially prior to formation of the self-aligned growth structures (32, 34, 36) on the substrate 22. In one embodiment, the tapered sidewalls of the mesa base semiconductor portion 25 may be completely formed prior to formation of the self-aligned growth structures (32, 34, 36) on the substrate 22. In another embodiment, the tapered sidewalls of the mesa base semiconductor portion 25 may be only partially formed prior to formation of the self-aligned growth structures (32, 34, 36) on the substrate 22, and additional patterning of the doped compound semiconductor layer 26 may be performed after formation of the self-aligned growth structures (32, 34, 36) to complete the tapered sidewalls of the mesa base semiconductor portion 25.

Modulation of the height of the mesa base semiconductor portion 25 can have a substantial effect on extraction of light and the beam shape. In one embodiment, the sidewalls of mesa base semiconductor portion 25 can be etched to provide crystallographic facets that have a hexagonal symmetry. In this case, each sidewall of the mesa base semiconductor portion 25 can provide the same etch characteristics, and the mesa base semiconductor portion 25 can have a six-fold symmetry. Optionally, surface roughness of the tapered sidewalls of the mesa base semiconductor portion 25 may be reduced by a touch-up etch process, which may employ a wet etch process (such as a wet etch employing a KOH solution) or a dry etch process (such as chemical dry etch). The touch-up etch process may induce formation of crystallographic facets to increase reflection of light at any faceted surface, or may induce rounding of physically exposed surfaces to provide a smooth taper profile with a gradually changing taper angle.

Figure 23:
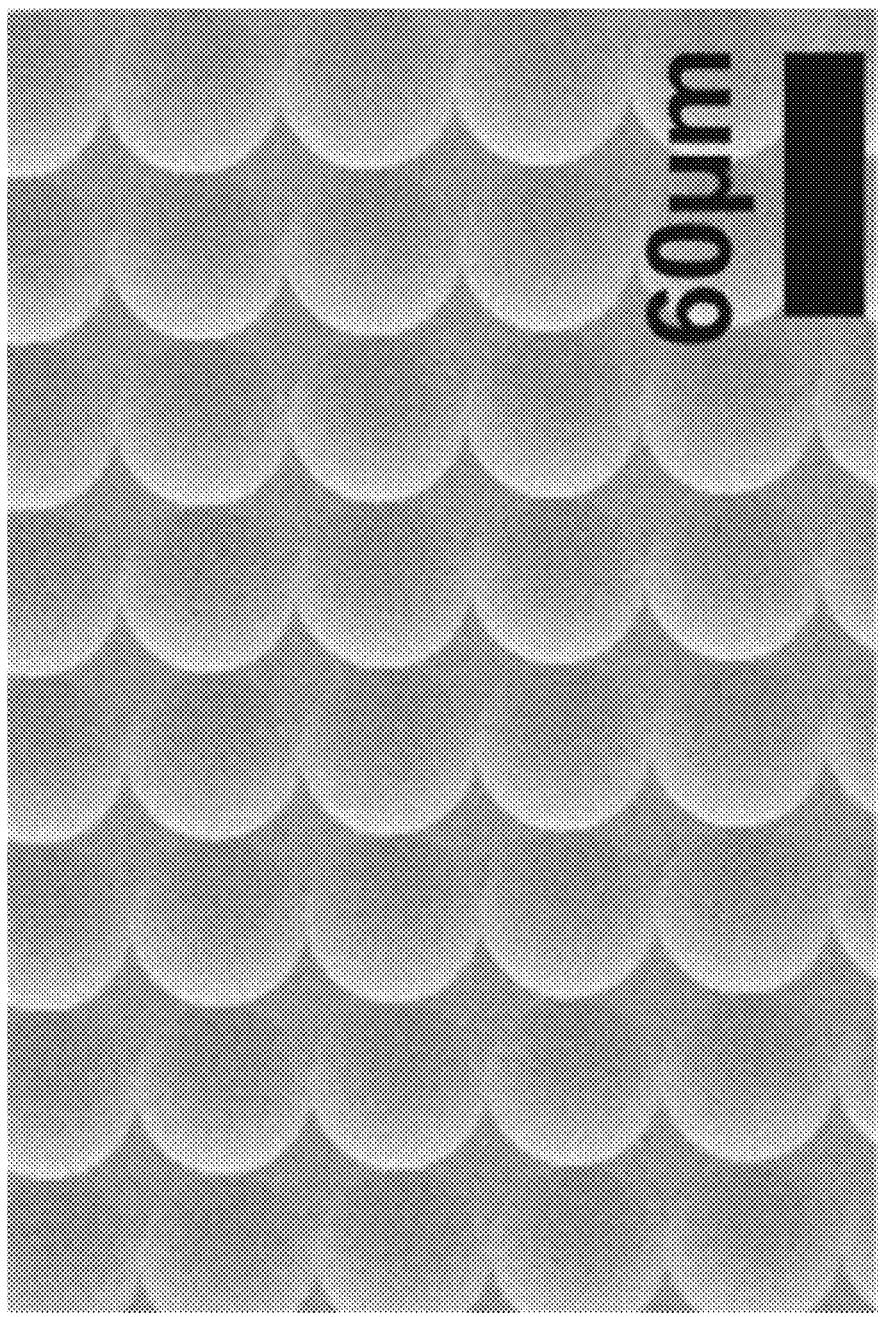
FIG. 23 illustrates an exemplary microencapsulation structure that may be employed for an array of LED subpixels of the present disclosure.

Referring to FIG. 23, an exemplary microencapsulation structure is illustrated, which may be employed for an array of LED subpixels of the present disclosure. The microencapsulation method may be employed in addition to, or in lieu of, tapered sidewalls of a mesa base semiconductor portion 25 to enhance etendue of the LED subpixel. Light emitting surfaces of the mesa base semiconductor portion 25 can be encapsulated with an imprint lithography type resist. Optically clear epoxy or other transparent material may be employed as the transparent resist material. The microencapsulation structures can be formed by molding the resist material with a nanoimprint lithography mold or stamp in shapes that provide enhanced light extraction and/or beam shape.

According to an aspect of the present disclosure, a semiconductor structure is provided, which comprises: a mesa base semiconductor portion 25; a growth mask layer 42 located on a planar surface of the mesa base semiconductor portion 25 and including at least one opening therethrough; at least one semiconductor layer stack 34 including a respective bottommost layer that is electrically shorted to the mesa base semiconductor portion 25 by a respective electrically conductive path through a respective opening; at least one second conductivity type semiconductor material layer 36 having a doping of a second conductivity type located on the at least one semiconductor layer stack 34; and an optically clear encapsulation matrix located on a light emitting side (e.g., bottom side) of the mesa base semiconductor portion 25 and having a non-planar surface profile to focus light emitted from the at least one selectively grown epitaxial semiconductor structure 34 along a vertical downward direction.

According to another aspect of the present disclosure, a method of forming a light emitting device is provided, which comprises the steps of: forming a growth mask layer 42 including openings therethrough on a planar surface of a doped compound semiconductor layer 26 located over a substrate 22; forming first light emitting diode (LED) subpixels by forming a plurality of active regions 34 including bottom nodes that are electrically shorted to the doped compound semiconductor material layer 26 by electrically conductive paths through the openings, wherein each of the plurality of active regions 34 includes a respective optically active compound semiconductor layer stack 34 configured to emit light, forming second conductivity type semiconductor material layers 36 on a respective one of the plurality of active regions 34, and patterning the doped compound semiconductor layer 36 into mesa base semiconductor portions 25; transferring each first LED subpixel to a backplane 401 to form a portion of a respective pixel of the light emitting device; and forming optically clear encapsulation matrices on a light emitting side (e.g., bottom side) of the mesa base semiconductor portions 25, wherein each of the optically clear encapsulation matrices has a non-planar surface profile to focus light emitted from the first LED subpixels along a vertical direction.

Referring to FIG. 24A, a first configuration for providing electrical connection between a backplane 401 and nodes of an LED subpixel is illustrated. The LED subpixel may optionally include a p-side transparent conductive layer 49 between the anode contact electrode 50 (which can include a metal layer) and a self-aligned growth structure (32, 34, 36). A mesa structure is formed by etching through the doped compound semiconductor layer 26 and the buffer layer 24 to physically expose a substrate 22. A dielectric liner layer 60 and a reflector layer 70 configured to reflect light downward, i.e., toward the side of the mesa base semiconductor portion 25, can be formed as described above. Optionally, the dielectric liner layer 60 and the reflector layer 70 may be patterned such that the reflector layer 70 does not contact the mesa base semiconductor portion 25. The reflector layer 70 can function as a sidewall mirror. The tapered sidewalls of the mesa base semiconductor portion 25 can determine the taper angle of the reflector layer 70, thereby enhancing the etendue of the LED pixel.

A conductive bonding structure 431 can be employed to bond the LED subpixel to a backplane 401. For example, the processing steps of FIGS. 16A-16P or other transfer methods may be employed to bond the LED subpixel to the backplane. A front side transparent conductive oxide layer 450 and an optional transparent passivation dielectric layer (not shown) can be formed on the front side (i.e., the light emitting side) of the LED subpixel, i.e., on the bottom surface of the mesa base semiconductor portion 25. The LED subpixel has a vertical microLED configuration with a sidewall mirror. Optionally, at least one lens and/or optically clear encapsulation matrix (not shown) may be formed on the front side of the LED subpixel.

Figure 24B:
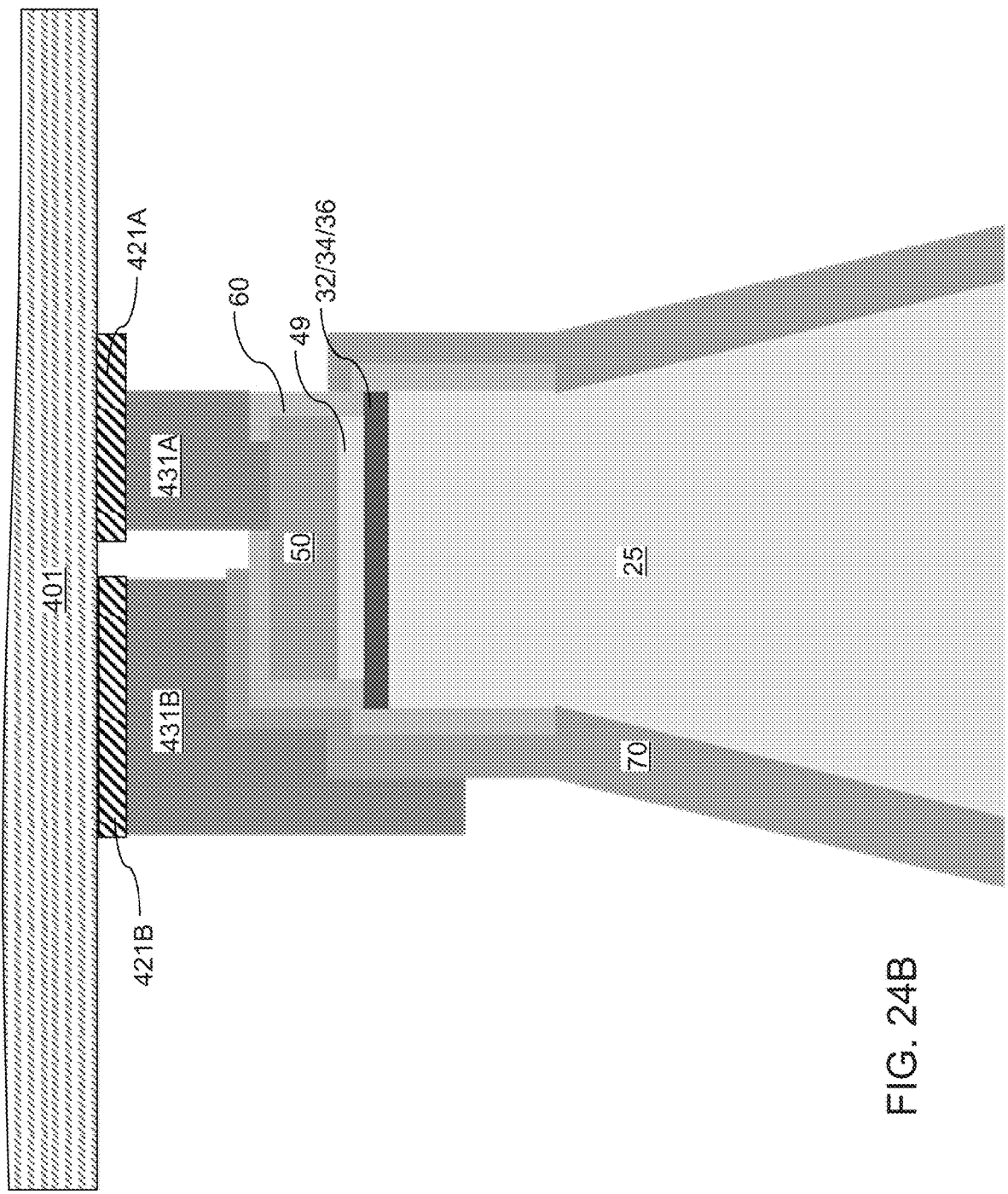
FIG. 24B illustrates a second configuration for providing electrical connection to nodes of an LED subpixel according to an embodiment of the present disclosure.

FIG. 24B illustrates a second configuration for providing electrical connection to nodes of an LED subpixel according to an embodiment of the present disclosure. In this case, the reflector layer 70 can extend toward the front side of the LED subpixel (i.e., toward the bottom surface of the mesa base semiconductor portion 25 farther than the dielectric liner layer 60, thereby physically contacting the tapered (or vertical) sidewalls of the mesa base semiconductor portion 25 and providing electrical contact to the bottom node of the active region 34, i.e., the node of the active region 34 that is electrically shorted to the mesa base semiconductor portion 25. Two conductive bonding structures (431A, 431B) can be employed to provide electrical contact between the backplane 401 and the two nodes of the LED subpixel. Specifically, a first conductive bonding structure 431A can provide electrical contact between the anode contact electrode 50 and a first bonding structure 421A on the backplane 401, and a second conductive bonding structure 431B can provide electrical contact between the reflector layer 70 (which functions as a cathode contact electrode) and a second bonding structure 421B on the backplane 401. Optionally, at least one lens and/or optically clear encapsulation matrix (not shown) may be formed on the front side of the LED subpixel.

The configuration of FIG. 24B provides a flip-chip microLED configuration. To complete electrical wiring of an LED subpixel, electrical contacts need to be provided to an anode contact electrode and a cathode contact electrode. By removing the front side transparent conductive oxide layer 450, optical loss of emitted light can be reduced in the configuration of FIG. 24B. The reflector layer 70 functions as a cathode contact electrode, and provides a vertically conductive path between the second conductive bonding structure 431B (such as a solder ball) and the bottom node of the active region 34. In one embodiment, the second bonding structure on the backplane 401 may be a portion of a common cathode contact line that is shared among multiple LED subpixels attached to the backplane 401.

Figure 25:
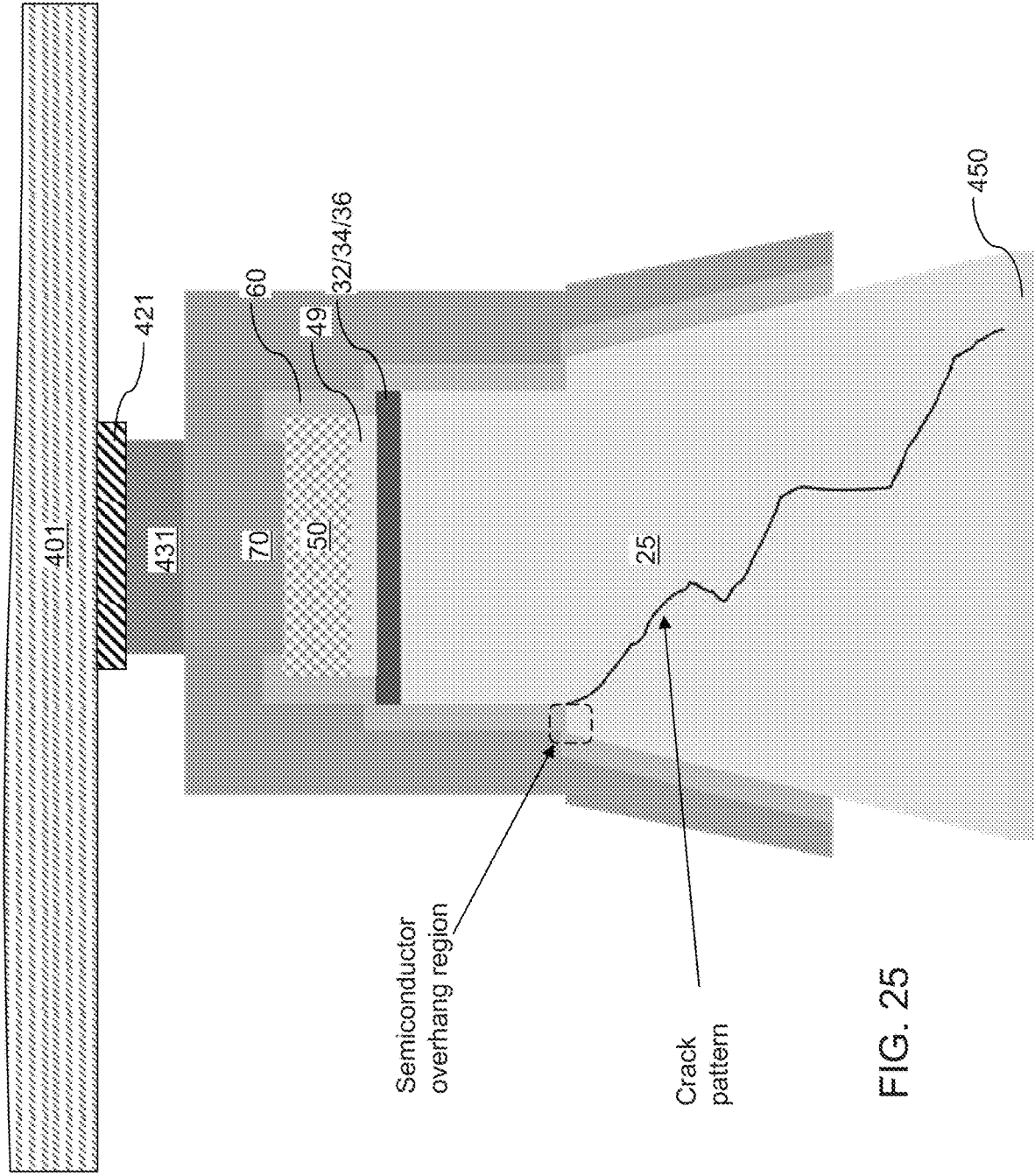
FIG. 25 illustrates a third configuration for providing electrical connection to nodes of an LED subpixel.

Referring to FIG. 25, another configuration for providing electrical connection to nodes of an LED subpixel is illustrated. Device cracking during LED subpixel transfer can cause a significant yield problem. The structure of FIG. 25 provides features that mitigate device cracking. The reflector layer 70 can be formed as a thick metal layer, which is located between a conductive bonding structure 431 (such as a solder ball) and an anode contact electrode 50 (which can be the p side contact). The thickness of the reflector layer 70 is selected to be thick enough, for example, at a thickness of at least 500 nm such as 1-10 microns, for example 2-6 microns, to inhibit cracking. It is believed that the thick reflector layer 70 absorbs mechanical shocks when it is thick enough. It is noted that 0.5 microns is more than thick enough to provide good reflectance properties.

It is belied that critical dimension (cd) control during processing steps to minimize the semiconductor overhang between the first mesa etch and the second mesa etch is important for crack minimization. In one embodiment, the lateral dimension of the semiconductor overhang region, measured between a tapered sidewall of the mesa base semiconductor portion 25 and a most proximate tapered sidewall of a self-aligned growth structure (32, 34, 36), can be about 2 microns or less, such as 0.1 to 1 microns.

According to an aspect of the present disclosure, a light emitting diode (LED) subpixel is provided, which comprises: a mesa base semiconductor portion 25 having tapered sidewalls and having a doping of a first conductivity type; a growth mask layer 42 located on a planar surface of the mesa base semiconductor portion 25 and including at least one opening therethrough; at least one semiconductor layer stack 34 including a respective bottommost layer that is electrically shorted to the mesa base semiconductor portion 25 by a respective electrically conductive path through a respective opening; at least one second conductivity type semiconductor material layer 36 having a doping of a second conductivity type located on the at least one semiconductor layer stack; an anode contact electrode 50 electrically shorted to the at least one second conductivity type semiconductor material layer 36; a reflector layer 70 comprising a metal and having a thickness of at least 500 nm and electrically shorted to the anode contact electrode 50; and a dielectric liner layer 60 providing electrical isolation between the reflector layer and the mesa base semiconductor portion. In one embodiment, the reflector layer 70 has a thickness in a range from 1 micron to 10 microns, such as from 2 microns to 6 microns.

Figure 26:
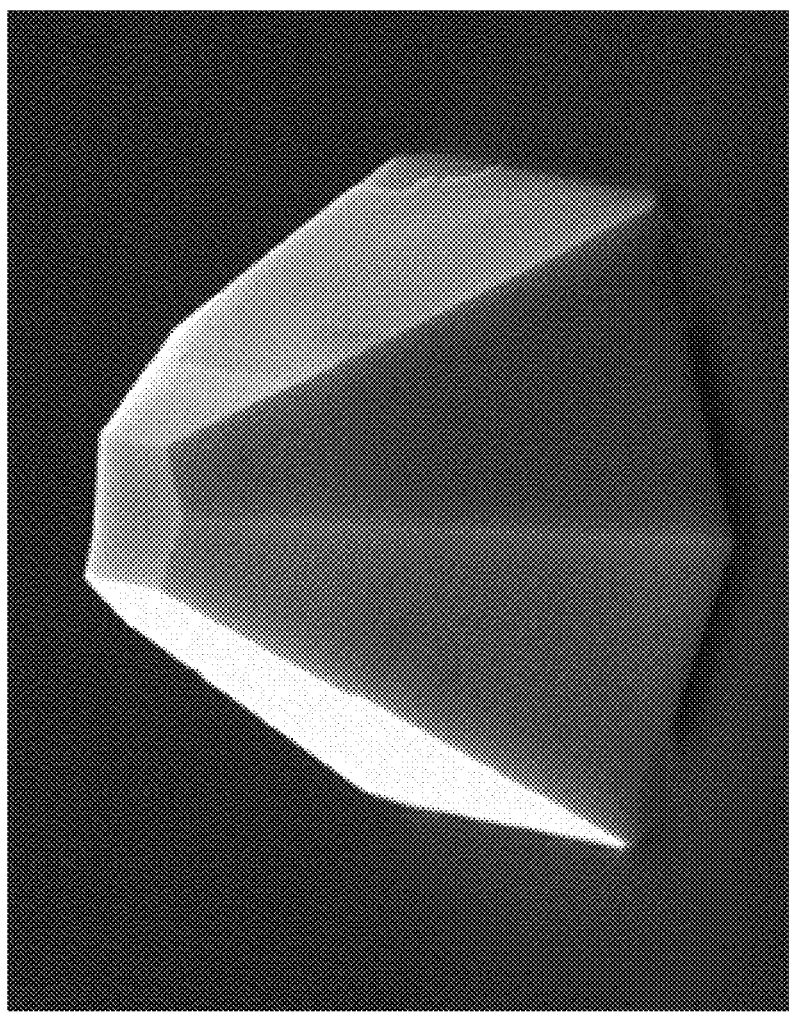
FIG. 26 shows a scanning electron micrograph (SEM) of a self-aligned growth structure of an example of the present disclosure.
Figure 27:
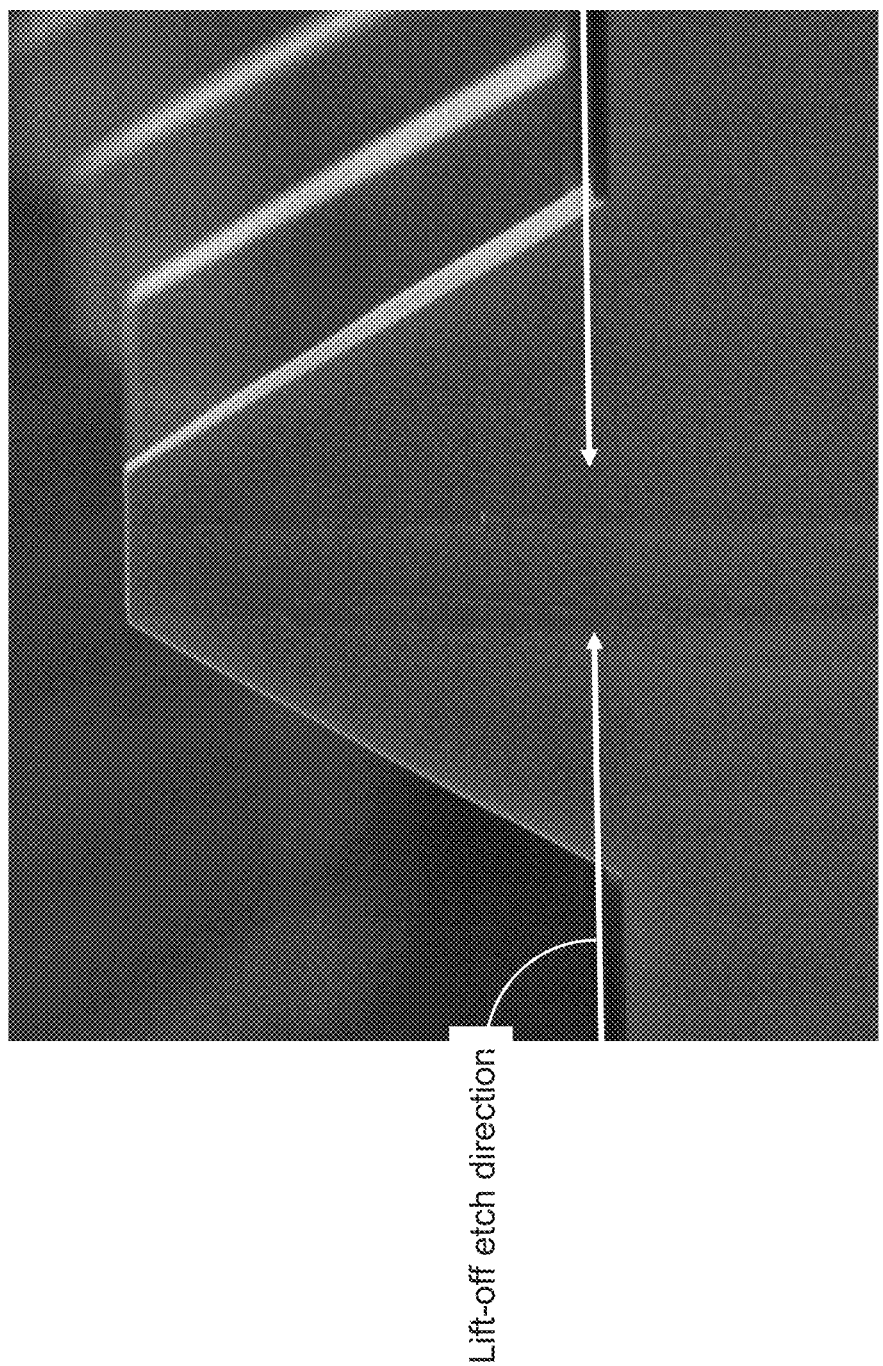
FIG. 27 is a vertical cross-sectional SEM of a self-aligned growth structure of an example of the present disclosure.

FIG. 26 shows a scanning electron micrograph (SEM) of a self-aligned growth structure (32, 34, 36) of an exemplary structure of the present disclosure. FIG. 27 is a vertical cross-sectional SEM of a self-aligned growth structure (32, 34, 36) of an exemplary structure of the present disclosure. Three dimensional devices of the present disclosure can be formed by selectively growing the self-aligned growth structures (32, 34, 36) in aperture areas including openings in the growth mask layer 42 while minimizing deposition on adjacent mask surfaces. Growth of the self-aligned growth structures (32, 34, 36) can be enabled by forming indium containing layer(s) and/or alternating layers of InGaN/GaN (superlattice) as the first deposited layers on the surfaces of the doped compound semiconductor layer 26. Growth of the indium containing layer(s) and/or alternating layers of InGaN/GaN can provide adequate selectivity to limit semiconductor material growth only to semiconductor surfaces. In an illustrative example, a 15 layer InGaN/GaN superlattice with In content of 3-5% can be employed.

Just as self-aligned growth (SAG) mesa structures preferentially grow to preferred planes, these same planes act as etch stop planes, which etch more slowly or not at all. Furthermore, all of the exposed planes can be p-type layers, which have extremely high resistance to GaN electrochemical etch. Particularly, the p-type layers are effective etch stop layers to typical electrochemical etchants (e.g., KOH)

Employing InGaN layers at the initial growth surface has an added benefit that these layers can function as a photoelectrochemical lift-off (i.e., release) layer. These etches proceed very rapidly from the N face (that is normal to the top surface of the doped compound semiconductor layer 26) for an n type material. Employing illumination tuned to the band gap of the superlattice or InGaN layer(s) can enable selectivity of the etch to proceed only through these layers. This type of layer stack is conducive to transfer of SAG mesa structures. For example, a KOH PEC photochemical etch can proceed along InGaN superlattice release layers or other release layers that can be removed selective to other layers of the self-aligned growth structure (32, 34, 36).

According to an aspect of the present disclosure, a method of forming a light emitting device is provided, which comprises: forming a growth mask layer 42 including openings therethrough on a planar surface of a doped compound semiconductor layer 26 having a doping of a first conductivity type and overlying a substrate 22; forming a release layer including a sacrificial compound semiconductor material on the planar surface of a doped compound semiconductor layer 26; forming at least one active region 34 including a respective optically active compound semiconductor layer stack configured to emit light over the release layer; forming at least one second conductivity type semiconductor material layer 36 on a respective active region 34; forming an anode contact electrode 50 contacting the at least one second conductivity type semiconductor material layer 36; releasing an assembly including the anode contact electrode 50, the at least one second conductivity type semiconductor material layer 36, and the at least one active region 34 by removing the release layer; and transferring the assembly to a backplane to form a portion of a respective pixel of the light emitting device. In one embodiment, the release layer comprises an InGaN layer which is released by photochemical etching.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:
1. A semiconductor structure, comprising:
    a mesa base semiconductor portion comprising a doped compound semiconductor layer having a top surface on a first side and having a bottom semiconductor surface on a second side that is an opposite side of the first side;

a growth mask layer located on the top surface of the doped compound semiconductor layer and including at least one opening therethrough;

at least one selectively grown epitaxial semiconductor structure extending through the at least one respective opening through the growth mask layer and having a doping of a first conductivity type;

at least one semiconductor layer stack located on a respective selectively grown epitaxial semiconductor structure;

at least one second conductivity type semiconductor material layer having a doping of a second conductivity type located on the at least one semiconductor layer stack;

a dielectric liner layer including a portion that overlies the second conductivity type semiconductor material layer, contacting sidewalls of, and laterally surrounding, the growth mask layer, and contacting sidewalls of, and laterally surrounding, the mesa base semiconductor portion, wherein the dielectric liner extends to a periphery of the bottom semiconductor surface of the mesa base semiconductor portion; and a reflector layer located over the dielectric liner layer and including sidewall portions that laterally surround the second conductivity type semiconductor material layer, the growth mask layer, and the doped compound semiconductor layer.

2. The semiconductor structure of claim 1, wherein:
the at least one opening comprises a plurality of openings;
the at least one selectively grown epitaxial semiconductor structure comprises a plurality of selectively grown epitaxial semiconductor structures separated by isolation regions;
each of the selectively grown epitaxial semiconductor structures includes an epitaxial mesa portion and an epitaxial connection portion located in a respective opening in the growth mask layer and connecting a top portion of the doped compound semiconductor layer to a bottom of the epitaxial mesa portion; and
each of the at least one semiconductor layer stack comprises a plurality of semiconductor layer stacks located on a respective epitaxial mesa portion.

3. The semiconductor structure of claim 2, wherein:
at least one selectively grown epitaxial semiconductor structure comprises a III-nitride compound semiconductor structure;
the growth mask layer comprises aluminum oxide;
a top surface of each epitaxial mesa portion includes a crystallographic c-plane that is parallel to the top surface of the doped compound semiconductor layer; and
a periphery of a bottom surface of each epitaxial mesa portion contacts a top surface of the growth mask layer around the respective opening.

4. The semiconductor structure of claim 2, wherein:
each epitaxial mesa portion has tapered sidewalls;
bottom edges of the tapered sidewalls are laterally offset outward from a periphery of a respective opening through the growth mask layer by an average lateral offset distance;
a ratio of a maximum lateral dimension of the respective opening through the growth mask layer to the average lateral offset distance is greater than 2; and
each epitaxial mesa portion has a width ranging from 1 to 100 microns and a length ranging from 1 to 100 microns.

5. The semiconductor structure of claim 2, wherein:
the semiconductor structure includes at least one light emitting diode (LED);
each of the at least one semiconductor layer stack comprises an active region that includes an optically active compound semiconductor layer stack configured to emit light.

6. A light emitting device comprising the semiconductor structure of claim 5, wherein:
sidewalls of the doped compound semiconductor layer are vertical or tapered, and contacts the dielectric liner layer; and
the light emitting device further comprises at least one top contact electrode that overlies, and is electrically shorted to, each of the at least one second conductivity type semiconductor material layer.

7. The light emitting device of claim 6, wherein:
the dielectric liner layer laterally surrounds the top contact electrode and overlies a peripheral portion of the top contact electrode; and
the reflector layer laterally surrounds the top contact electrode and the dielectric liner layer and overlies the peripheral portion of the top contact electrode.

8. The light emitting device of claim 7, wherein:
the dielectric liner layer includes an opening over the top contact electrode;
the reflector layer includes an opening over the top contact electrode; and
the opening through the dielectric liner layer and the opening through the reflector layer are vertically coincident.

9. The light emitting device of claim 6, further comprising a conductive bonding structure located within an opening through the reflector layer and bonded to the top contact electrode.

10. A direct view display device, comprising:
a plurality LEDs of claim 6 arranged as a two-dimensional array; and
a backplane comprising metal interconnect structures therein or thereupon;
wherein each of the plurality of LEDs is electrically connected to a respective one of the metal interconnect structures and constitutes a first subpixel which emits light at a first peak wavelength of a respective pixel of the direct view display device.

11. The direct view display device of claim 10, wherein:
the respective pixel further comprises a second subpixel comprising a second LED which emits light at a second peak wavelength different from the first peak wavelength, and a third subpixel comprising a third LED which emits light at a third peak wavelength different from the first and the second peak wavelengths; and
the direct view display is used in a smart phone, television, augmented reality display, virtual reality display, computer screen, large area display or a watch.

12. The semiconductor structure of claim 1, wherein the semiconductor structure comprises power semiconductor devices selected from diodes, thyristors, triacs, bipolar junction transistors, power metal oxide semiconductor field effect transistors (MOSFETs), and insulated-gate bipolar transistors.

13. The semiconductor structure of claim 1, wherein the sidewalls of the mesa base semiconductor portion have a respective taper angle such that a horizontal cross-sectional area along a horizontal plane that is parallel to an interface between the mesa base semiconductor portion and the growth mask layer increases with a vertical distance from the interface between the mesa base semiconductor portion and the growth mask layer.

14. A method of forming a semiconductor structure, comprising:
   forming a growth mask layer including openings therethrough on a top surface of a doped compound semiconductor layer located over a substrate;
   forming a plurality of selectively grown epitaxial semiconductor structures extending through a respective opening through the growth mask layer and having a doping of a first conductivity type;
   forming a plurality of semiconductor layer stacks on a respective selectively grown epitaxial semiconductor structure;
   forming at least one second conductivity type semiconductor material layer having a doping of a second conductivity type and on the plurality of semiconductor layer stacks;
   patterning the growth mask layer and the doped compound semiconductor layer, wherein discrete mesa base semiconductor portions including a respective patterned portion of the doped compound semiconductor are formed;
   forming a dielectric liner layer over remaining portions of the at least one second conductivity type semiconductor material layer after patterning the doped compound semiconductor layer, wherein the dielectric liner contacts sidewalls of, and laterally surrounds, the growth mask layer, and contacts sidewalls of, and laterally surrounds, the mesa base semiconductor portion, and contacts the physically exposed portion of the top surface of the substrate;
   forming a reflector layer over the dielectric liner layer, wherein the reflector layer includes sidewall portions that laterally surround a respective remaining portion of the second conductivity type semiconductor material layer and laterally surrounds the discrete mesa base semiconductor portions; and
   detaching a combination of one of the discrete mesa base semiconductor portions and material portions that overlie the one of the discrete mesa base semiconductor portions from the substrate as a light emitting device, wherein the one of the discrete mesa base semiconductor portions comprises a top semiconductor surface that contacts a portion of the dielectric liner and a bottom semiconductor surface on an opposite side of the top semiconductor surface.

15. The method of claim 14, further comprising patterning the doped compound semiconductor layer into patterned discrete portions by forming a patterned etch mask layer covering each of the plurality of semiconductor layer stacks, and by anisotropically etching portions of the doped compound semiconductor material layer that are not covered by the patterned etch mask layer.

16. The method of claim 15, wherein:
   each sidewall of the patterned etch mask layer is located entirely outside areas of the plurality of semiconductor layer stacks;
   each of the epitaxial semiconductor structures includes a respective epitaxial mesa portion and a respective epitaxial connection portion located in a respective opening in the growth mask layer and connecting a top portion of the doped compound semiconductor layer to a bottom of the respective epitaxial mesa portion; and
   a top surface of each of the epitaxial mesa portions includes a crystallographic c-plane that is parallel to the top surface of the doped compound semiconductor layer.

17. The method of claim 16, wherein:
   at least one second conductivity type semiconductor material layer is a plurality of second conductivity type semiconductor material layers;
   the second conductivity type semiconductor material layers are formed by a selective semiconductor deposition process and are not in direct contact among one another;
   the patterned etch mask layer includes a plurality of discrete etch mask portions; and
   each of the plurality of discrete etch mask portions covers no more than only one of the plurality of semiconductor layer stacks.

18. The method of claim 16, wherein:
   the patterned etch mask layer includes a plurality of discrete etch mask portions; and
   each of the plurality of discrete etch mask portions covers a plurality of active regions.

19. The method of claim 14, wherein the sidewalls of the mesa base semiconductor portion have a respective taper angle such that a horizontal cross-sectional area along a horizontal plane that is parallel to an interface between the mesa base semiconductor portion and the growth mask layer increases with a vertical distance from the interface between the mesa base semiconductor portion and the growth mask layer after patterning the growth mask layer and the doped compound semiconductor layer.

* * * * *